(12) United States Patent
Jinta

(10) Patent No.: US 9,396,703 B2
(45) Date of Patent: Jul. 19, 2016

(54) SEMICONDUCTOR DEVICE, DISPLAY PANEL AND ELECTRONIC APPARATUS

(71) Applicant: Sony Corporation, Tokyo (JP)

(72) Inventor: Seiichiro Jinta, Aichi (JP)

(73) Assignee: Sony Corporation, Tokyo (JP)

( * ) Notice: Subject to any disclaimer, the term of this patent is extended or adjusted under 35 U.S.C. 154(b) by 119 days.

(21) Appl. No.: 14/505,984

(22) Filed: Oct. 3, 2014

(65) Prior Publication Data

US 2015/0097824 A1    Apr. 9, 2015

Related U.S. Application Data

(63) Continuation of application No. 13/755,824, filed on Jan. 13, 2013, now Pat. No. 8,890,780, which is a continuation of application No. 12/385,732, filed on Apr. 17, 2009, now Pat. No. 8,384,702.

(30) Foreign Application Priority Data

May 3, 2008   (JP) ................................. 2008-120792

(51) Int. Cl.
*G09G 5/18*   (2006.01)
*G09G 3/32*   (2016.01)
*H03K 3/012*  (2006.01)
*G09G 3/20*   (2006.01)
*G09G 3/34*   (2006.01)

(52) U.S. Cl.
CPC ................ *G09G 5/18* (2013.01); *G09G 3/3208* (2013.01); *G09G 3/3258* (2013.01); *G09G 3/3266* (2013.01); *H03K 3/012* (2013.01); *G09G 3/2011* (2013.01); *G09G 3/3426* (2013.01); *G09G 2300/0417* (2013.01); *G09G 2300/0861* (2013.01); *G09G 2310/0251* (2013.01); *G09G 2310/0286* (2013.01)

(58) Field of Classification Search
CPC ............. G09G 5/18; G09G 5/00; G09G 3/30; G09G 3/36; G09G 3/32; G09G 3/3208; G09G 3/3266; G09G 3/038
See application file for complete search history.

(56) References Cited

U.S. PATENT DOCUMENTS

| | | | |
|---|---|---|---|
| 5,870,071 A | 2/1999 | Kawahata | |
| 6,232,945 B1 | 5/2001 | Moriyama et al. | |
| 6,580,405 B1 | 6/2003 | Yamazaki et al. | |
| 6,856,308 B2 | 2/2005 | Akimoto et al. | |
| 6,873,312 B2 | 3/2005 | Matsueda | |
| 7,113,155 B2 | 9/2006 | Kimura | |
| 7,167,154 B2 | 1/2007 | Sato et al. | |
| 7,541,617 B2 | 6/2009 | Mochizuki et al. | |
| 7,545,355 B2 | 6/2009 | Akimoto et al. | |
| 7,557,780 B2 | 7/2009 | Kimura | |
| 7,800,576 B2 | 9/2010 | Jinta | |
| 7,843,221 B2 | 11/2010 | Jinta | |
| 8,138,032 B2 | 3/2012 | Miyairi et al. | |
| 8,310,473 B2 | 11/2012 | Jinta | |

(Continued)

FOREIGN PATENT DOCUMENTS

JP    2005-149624    6/2005

*Primary Examiner* — Fred Tzeng
(74) *Attorney, Agent, or Firm* — Michael Best and Friedrich LLP

(57) ABSTRACT

A semiconductor device includes a plurality of thin film transistors of a single channel formed on an insulating substrate, and a buffer circuit including an outputting stage; a first inputting stage; a second inputting stage; a seventh thin film transistor; and an eighth thin film transistor.

20 Claims, 66 Drawing Sheets

(56) References Cited

U.S. PATENT DOCUMENTS

| | | |
|---|---|---|
| 8,384,702 B2 | 2/2013 | Jinta |
| 8,514,151 B2 | 8/2013 | Kimura |
| 2002/0149556 A1 | 10/2002 | Matsueda |
| 2003/0020520 A1 | 1/2003 | Miyake et al. |
| 2003/0137613 A1 | 7/2003 | Katayama |
| 2006/0187153 A1* | 8/2006 | Nathan ............... G09G 3/3233 345/76 |
| 2007/0273620 A1* | 11/2007 | Yumoto .............. G09G 3/3233 345/76 |
| 2008/0170029 A1 | 7/2008 | Kim |
| 2010/0328301 A1* | 12/2010 | Kim ..................... G09G 5/005 345/214 |
| 2011/0141098 A1 | 6/2011 | Yaguma et al. |
| 2011/0248968 A1* | 10/2011 | Suh .................... G02F 1/13454 345/204 |
| 2011/0273419 A1* | 11/2011 | Park .................... G09G 3/30 345/211 |
| 2012/0176422 A1* | 7/2012 | Ono ..................... G09G 3/325 345/690 |
| 2012/0176426 A1* | 7/2012 | Ono ..................... G09G 3/325 345/691 |
| 2013/0002145 A1* | 1/2013 | Hwang ................ G09G 3/36 315/158 |
| 2014/0043317 A1* | 2/2014 | Kim ..................... G09G 5/00 345/213 |
| 2014/0139502 A1* | 5/2014 | Han .................... G09G 3/3233 345/212 |
| 2014/0347338 A1* | 11/2014 | Yamashita ........... G09G 3/3233 345/211 |

* cited by examiner k: EVEN NUMBER
N: INTEGER

FIG.14A ck
FIG.14B in1(k)=out(k-1)
FIG.14C in2(k)=out(k+1)
FIG.14D B
FIG.14E A
FIG.14F out(k)

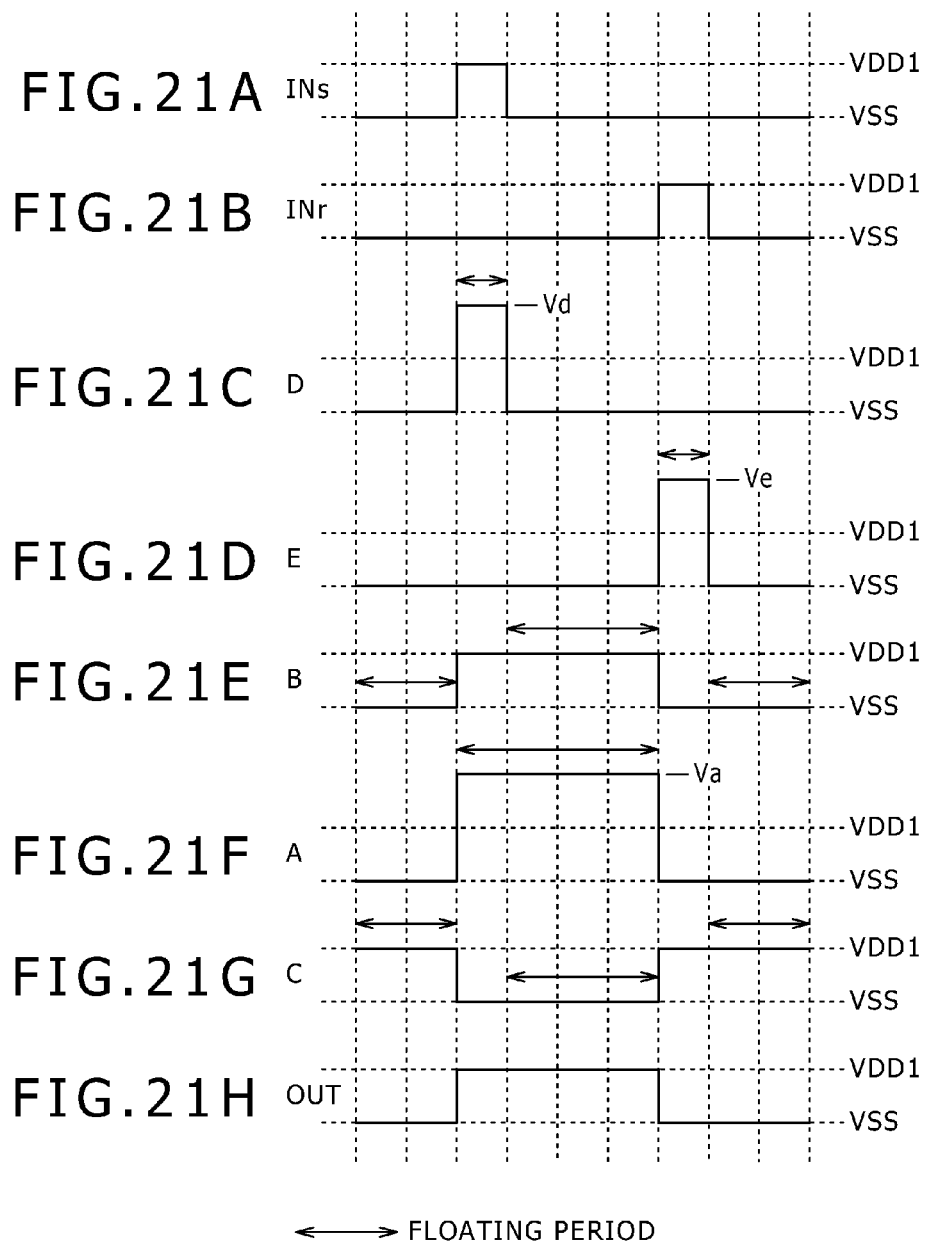

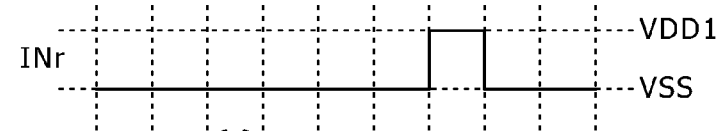
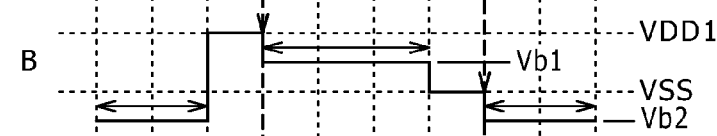
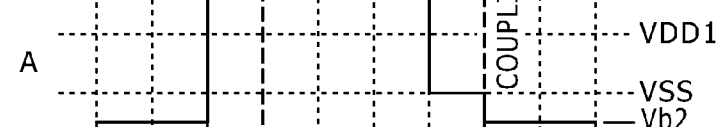
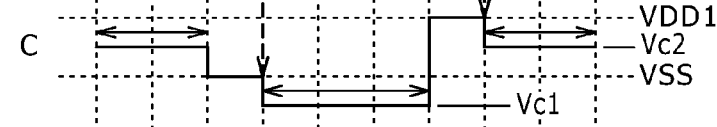
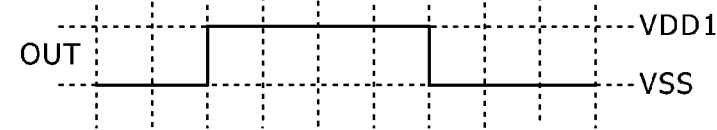
↔ FLOATING PERIOD Ids-Vgs CHARACTERISTIC OF N37

FIG. 26A INs 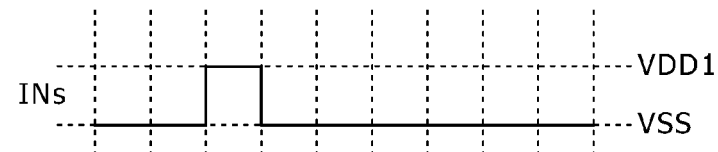
FIG. 26B INr 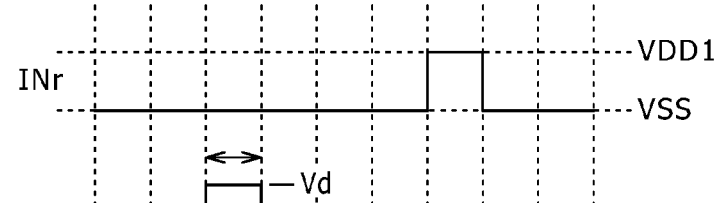
FIG. 26C D 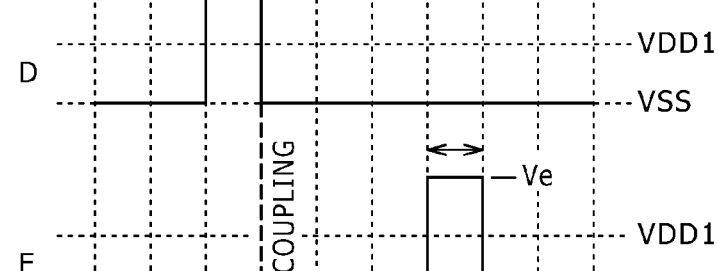
FIG. 26D E 
FIG. 26E B 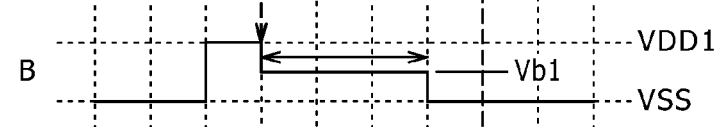
FIG. 26F A 
FIG. 26G C 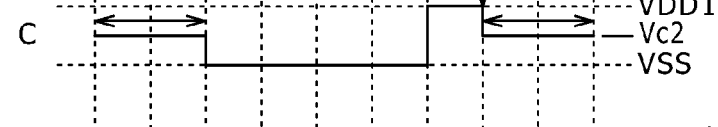
FIG. 26H OUT 
↔ FLOATING PERIOD

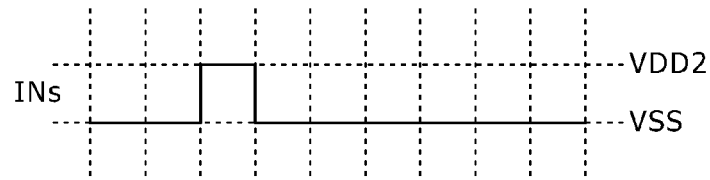
FIG.30A INs
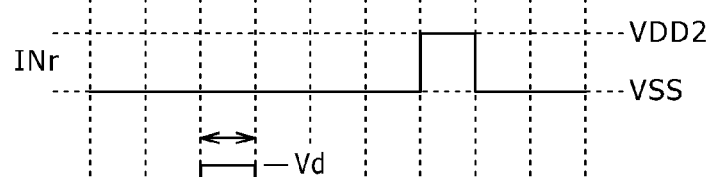
FIG.30B INr
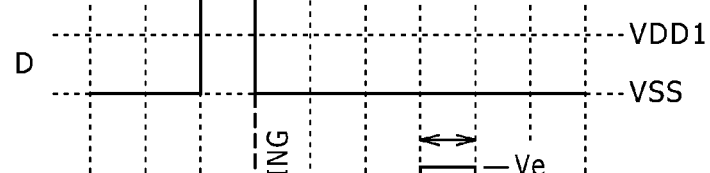
FIG.30C D
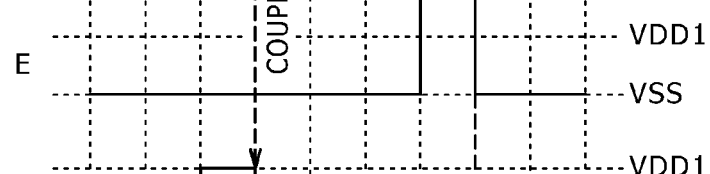
FIG.30D E
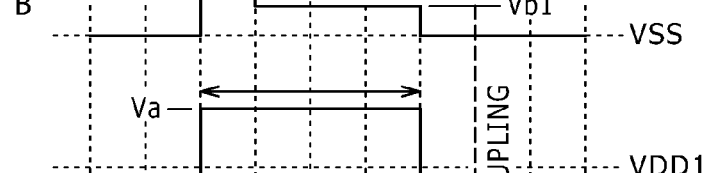
FIG.30E B
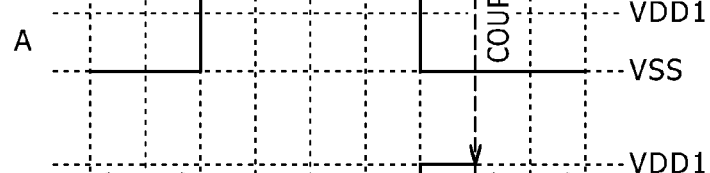
FIG.30F A
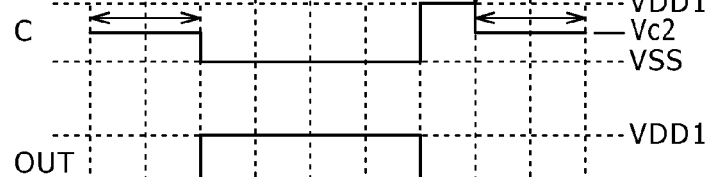
FIG.30G C
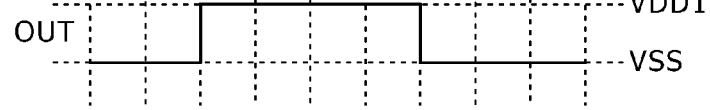
FIG.30H OUT
←——→ FLOATING PERIOD

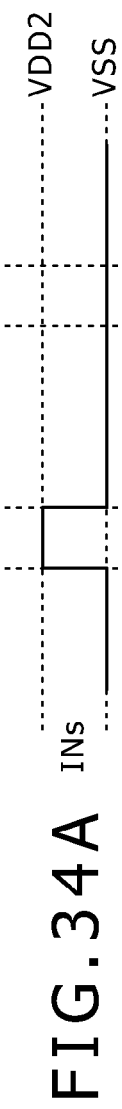
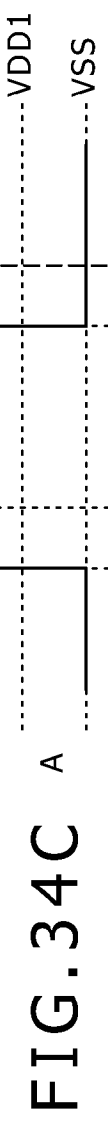
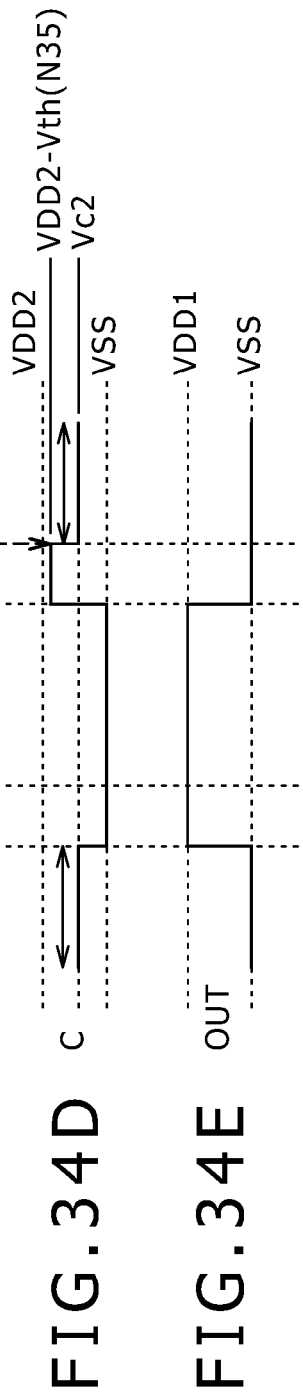

FIG. 44A scan1(k-1)
FIG. 44B scan1(k)
FIG. 44C scan1(k+1)
FIG. 44D scan2(k-1)
FIG. 44E scan2(k)
FIG. 44F scan2(k+1)
FIG. 44G out(k-1)
FIG. 44H out(k)
FIG. 44I out(k+1)

FIG.46A INs 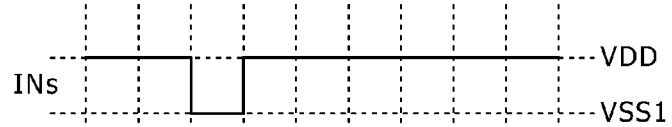
FIG.46B INr 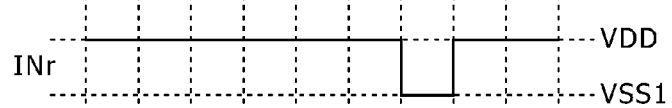
FIG.46C D 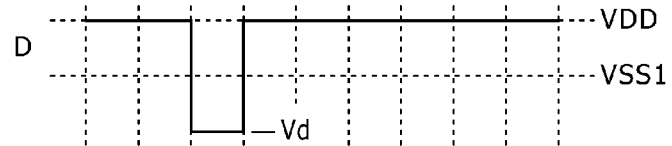
FIG.46D E 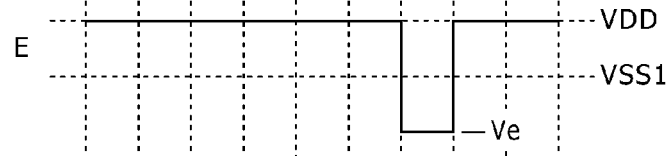
FIG.46E B 
FIG.46F A 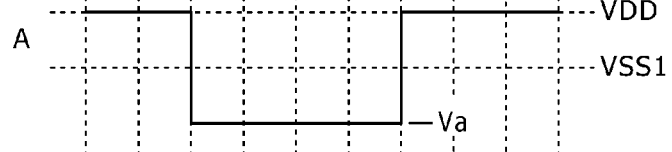
FIG.46G C 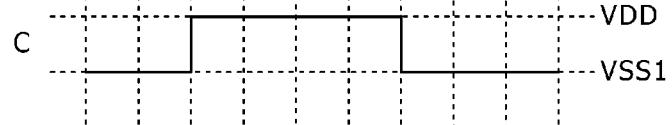
FIG.46H OUT 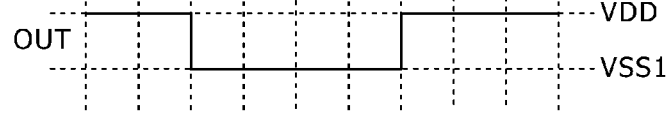

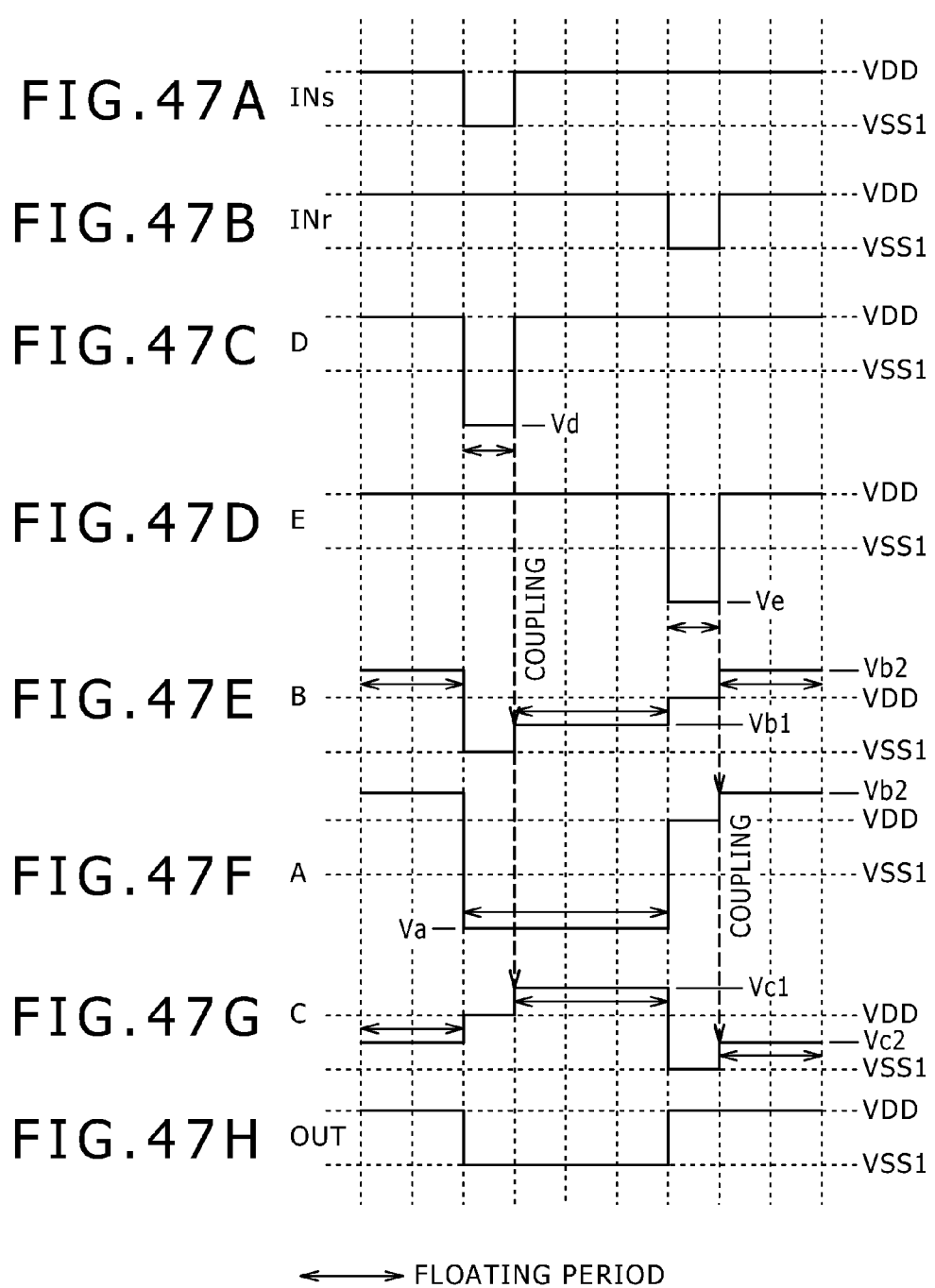

Ids-Vgs CHARACTERISTIC OF P37

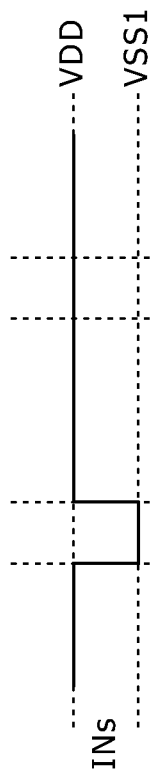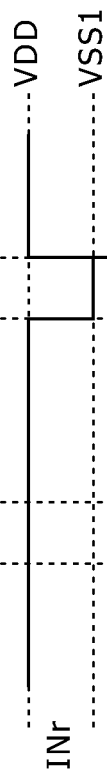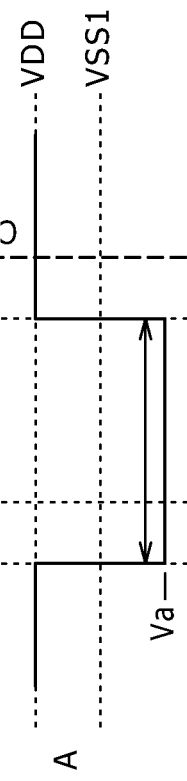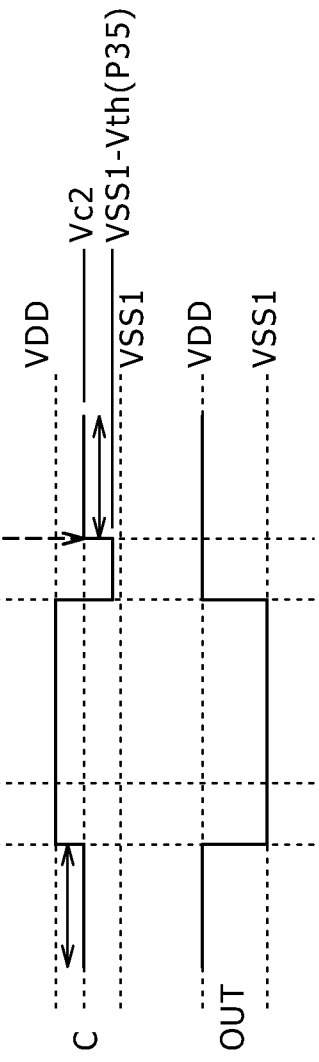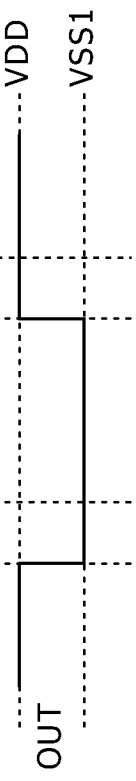

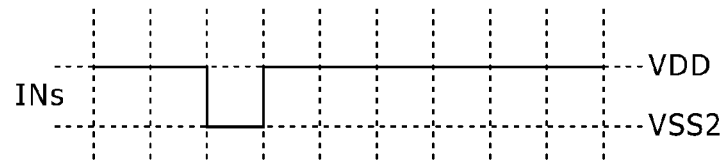
FIG.55A INs
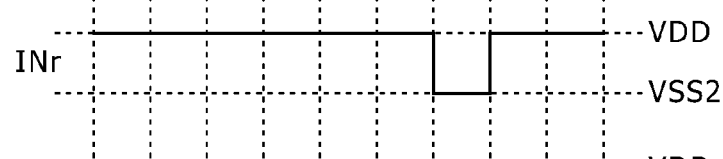
FIG.55B INr
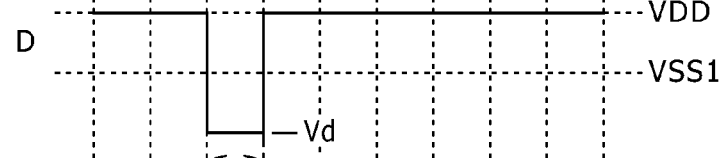
FIG.55C D
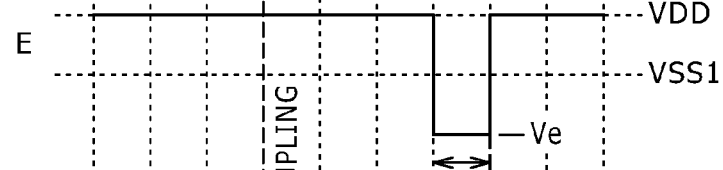
FIG.55D E
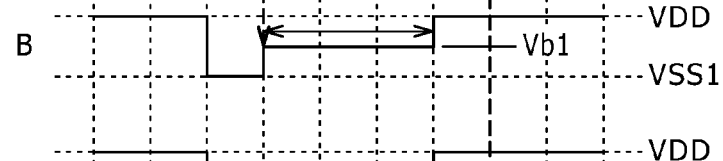
FIG.55E B
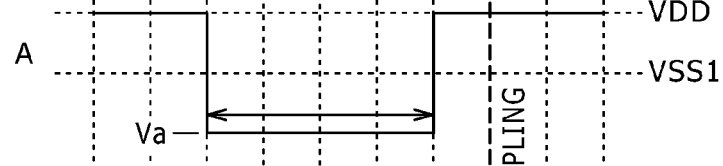
FIG.55F A
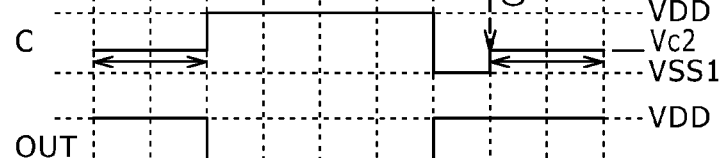
FIG.55G C
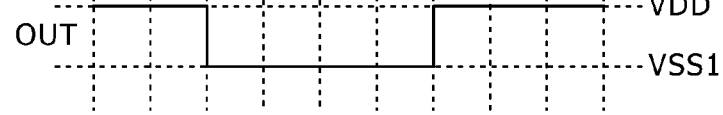
FIG.55H OUT
⟵⟶ FLOATING PERIOD

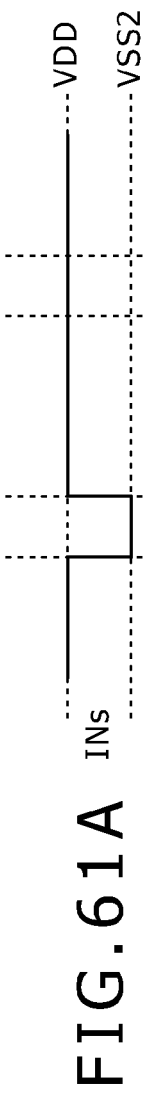
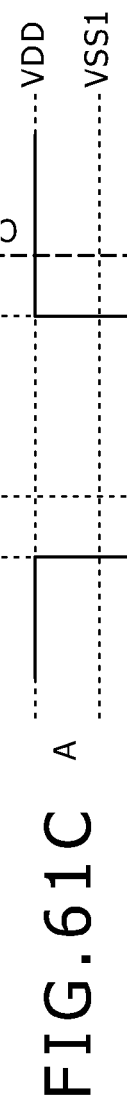
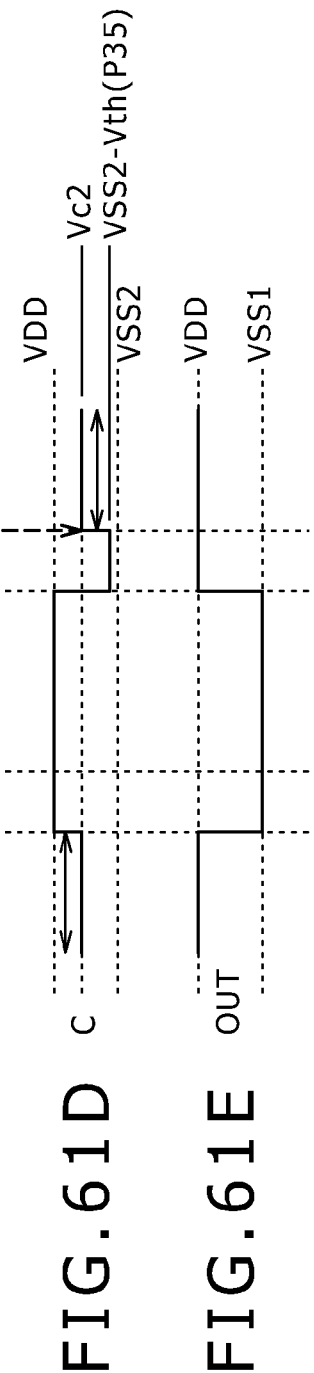
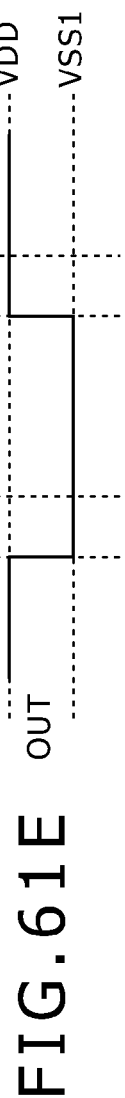
FIG.61A INs
FIG.61B INr
FIG.61C A
FIG.61D C
FIG.61E OUT

SEMICONDUCTOR DEVICE, DISPLAY PANEL AND ELECTRONIC APPARATUS

CROSS REFERENCES TO RELATED APPLICATIONS

This is a Continuation application of U.S. patent application Ser. No. 13/755,824, filed on Jan. 31, 2013, which is a Continuation application of U.S. patent application Ser. No. 12/385,732, filed on Apr. 17, 2009, now U.S. Pat. No. 8,384,702, issued on Feb. 26, 2013, which claims priority from Japanese Patent Application No.: 2008-120792 filed with the Japanese Patent Office on May 3, 2008 the entire contents of which being incorporated herein by reference.

BACKGROUND OF THE INVENTION

1. Field of the Invention

This invention relates to a buffer circuit for wide use which is formed on an insulating substrate using a thin film transistor of a single channel and can be used in various applications, devices and products. More specifically, the present invention relates to a semiconductor device, a display panel and an electronic apparatus.

2. Description of the Related Art

In a low temperature poly-silicon (LIPS) process, a circuit can be formed using both of an N-channel metal oxide semiconductor (NMOS) type thin film transistor (TFT) and a P-channel metal oxide semiconductor (PMOS) type thin film transistor. Accordingly, in the low temperature poly-silicon process, the two types of thin film transistors are usually used to fabricate a circuit called complementary metal oxide semiconductor (CMOS) circuit.

On the other hand, in the case of CMOS circuit since the two types of thin film transistors are used, an increased number of fabrication steps are demanded in the end. The increase of the number of steps makes a cause of lowering the fabrication efficiency and raising the fabrication cost.

Accordingly, even where a poly-silicon process is used, if possible, it is desirable to implement a circuit having a same function as that of a CMOS circuit by using only a thin film transistor of a single channel, that is, only a thin film transistor of the NMOS type or of the PMOS type.

Besides, a single channel circuit of the type described can be applied also where a circuit is formed from amorphous silicon or organic semiconductor.

For example, in the case of amorphous silicon, a circuit can be fabricated only with a thin film transistor of the NMOS type, but in the case of an organic TFT, a circuit can be fabricated only with a thin film transistor of the PMOS type.

From such background, it is demanded to implement a circuit wherein operation of a function same as that of a CMOS circuit can be executed by using only a thin film transistor of a single channel, that is, only a thin film transistor of the NMOS type or of the PMOS type.

In the present specification, attention is paid particularly to a buffer circuit. The buffer circuit is a general purpose circuit which is incorporated in various circuits. Accordingly, basically the application of the buffer circuit is not limited to a specific application. However, in the following description, the buffer circuit is applied to a driving circuit for driving a display panel for the convenience of description.

In the following, an example of an existing buffer circuit applied to a driving circuit for an organic EL panel of the active matrix driving type is disclosed.

FIG. 1 shows an example of a system configuration of an organic EL panel. Referring to FIG. 1, the organic Electro Luminescence (EL) panel 1 shown includes a pixel array section 3, a signal line driving section 5, a first control line driving section 7 and a second control line driving section 9 disposed on a panel board.

A plurality of sub pixels 11 are disposed in a matrix in accordance with a display resolution in the pixel array section 3. Examples of an equivalent circuit of a sub pixel 11 are shown in FIGS. 2 and 3. It is to be noted that all of the sub pixels 11 shown in FIGS. 2 and 3 are formed only from NMOS thin film transistors.

Referring to FIGS. 2 and 3, a sampling transistor is denoted by N1, a driving transistor by N2, a lighting control transistor by N3, and a storage capacitor by Cs. Referring also to FIG. 1, a writing control line is denoted by WSL, a lighting control line by LSL, and a current supply line by PSL.

Incidentally, FIG. 2 shows an equivalent circuit having a circuit configuration where a driving method wherein a turning on operation and a turning off operation of an organic EL element organic light emitting diode (OLED) are implemented by on/off control of the lighting control transistor N3 is adopted.

Meanwhile, FIG. 3 shows an equivalent circuit having a circuit configuration where another driving method wherein a turning on operation and a turning off operation of an organic EL element OLED are implemented by a potential variation of the lighting control line LSL. It is to be noted that, in the circuit of FIG. 3, the lighting control line LSL functions also as a current supply source.

FIGS. 4A to 4C are timing charts when a signal potential Vsig (data) is written into a sub pixel 11 shown in FIGS. 2 and 3. In particular, FIG. 4A illustrates a driving waveform of a signal line DTL. A signal potential Vsig corresponding to a pixel gradation data is supplied to the signal line DTL. The magnitude of driving current to be supplied from the driving transistor N2 depends upon the magnitude of the signal potential Vsig. The organic EL element OLED is a current-driven element and exhibits a luminance which increases as the driving current increases.

FIG. 4B illustrates a driving waveform of the writing control lines WSL. Within a period within which the writing control lines WSL exhibits the H level, the sampling transistor N1 is controlled to an on state, and thereupon, the potential of the signal line DTL is written into the gate electrode of the driving transistor N2.

FIG. 4C illustrates a driving waveform of the lighting control line LSL. The lighting control line LSL is driven with two values of the H level and the L level. By changeover of the potential of the lighting control line LSL, the organic EL element OLED is controlled for changeover between on and off states, that is, between a light emitting state and a no-light emitting state.

It is to be noted that the control amplitude of the lighting control line LSL is different between the sub pixel 11 shown in FIG. 2 and the sub pixel 11 shown in FIG. 3. This is because, while, in the sub pixel 11 shown in FIG. 2, it is only necessary for the lighting control line LSL to be able to drive the lighting control transistor N3, in the sub pixel 11 shown in FIG. 3, it is necessary for the lighting control line LSL to supply an operating voltage to both of the driving transistor N2 and the organic EL element OLED.

As seen from FIGS. 4A to 4C, after writing of the signal potential Vsig ends, when the lighting control line LSL has the H level, the organic EL element OLED exhibits an on state to emit light, but when the lighting control line LSL exhibits the L level, the organic EL element OLED exhibits an off state and emits no light.

It is to be noted that the peak luminance level can be controlled by variably controlling the ratio or duty of the light emitting period occupying in a one-field period.

In addition, the lighting control line LSL (FIG. 4C) is used also for adjustment of a moving picture characteristic. For the adjustment of the moving picture characteristic, it is demanded to adjust the number of times of turning on within a one-field period or the timing of a light emitting period.

Accordingly, it is demanded for the second control line driving section 9 to be able to output a plurality of kinds of pulses.

Besides, where the active matrix driving method is applied to a popular line-sequential writing method, such pulse waves as described above must be able to be transferred line-sequentially.

In particular, it is demanded for a driving section for a control line of the type described to have incorporated therein two functions including a function of freely setting the pulse length of the control pulses and another function of transferring the pulses line-sequentially to the succeeding stage.

Incidentally, in the sub pixels 11 shown in FIGS. 2 and 3, the writing operation of the signal potential Vsig described above sometimes involves a threshold value correction operation and a mobility correction operation of the driving transistor N2. FIGS. 5A to 5F show timing charts of the sub pixel 11 shown in FIG. 2. It is to be noted that, where the sub pixel 11 of FIG. 2 has a correction function, the current supply line PSL is driven in such a manner as seen in FIG. 5C. Meanwhile, FIGS. 6A to 6E show timing charts of the sub pixel 11 of FIG. 3. It is to be noted that the sub pixel 11 shown in FIG. 2 and the sub pixel 11 shown in FIG. 3 are different from each other in whether or not an initialization operation and light emitting period control are separated from each other.

In the light emitting period control, an operation for varying the ratio between a light emitting period and a no-light emitting period, that is, the duty, is demanded in order to adjust the peak luminance. Further, in the light emitting period control, an operation of changing the number of times of changeover between a light emitting period and a no-light emitting period within a one-field period is demanded in order to adjust the moving picture display characteristic. For such applications, the circuit configuration of the second control line driving section 9 is generally complicated.

Accordingly, the circuit configuration of FIG. 2 wherein the supply line (PSL) for an initialization pulse for providing a preparation timing for a threshold value correction period and the supply line (LSL) for a lighting period control pulse are prepared separately is advantageous in simplification of the control interface. However, the circuit configuration of FIG. 2 demands three control lines including the writing control lines WSL, lighting control line LSL and current supply line PSL.

In the following description, a threshold value correction operation, a mobility correction operation and a control operation of a sub pixel 11 including a light emitting period control are described in regard to the pixel circuit shown in FIG. 3. Accordingly, the following description is given with reference to FIG. 6.

It is to be noted that the control operation used for the pixel circuit shown in FIG. 2 is common to that used for the pixel circuit shown in FIG. 3 except that the initialization operation and the light emitting period control are separated from each other as described above. Therefore, description of the control operation for the pixel circuit shown in FIG. 2 is omitted herein to avoid redundancy.

FIG. 6A shows a driving waveform of the writing control line WSL. For example, within a period within which the writing control line WSL has the H level, the sampling transistor N1 is controlled to an on state. Consequently, the potential of the signal line DTL is written into the gate electrode of the driving transistor N2.

It is to be noted that the first H level period in FIG. 6A is used for dispersion correction of the threshold potential Vth of the driving transistor N2.

On the other hand, the second H level period in FIG. 6A is used for writing of a signal potential Vsig corresponding to a pixel gradation and also for dispersion correction of the mobility p of the driving transistor N2.

Incidentally, the reason why the waveform of the falling edge of the second H level period is inclined is that it is intended to set an optimum mobility correction period with regard to all gradations from a high luminance, that is, a high signal potential, to a low luminance, that is, a low signal potential.

The mobility correction is an operation for correcting a mobility difference between a driving transistor N2 whose mobility p is high and another driving transistor N2 whose mobility p is low, and the correction time for the mobility correction is defined by the length of the H level of the writing control lines WSL. In principle, as the luminance decreases, that is, as the signal potential decreases, the demanded correction time increases.

FIG. 6B shows a driving waveform of the signal line DTL. Two different potentials are applied to the signal line DTL. An offset potential Vofs is for the threshold value correction of the driving transistor N2. A signal potential Vsig provides a pixel gradation. The magnitude of the driving current to be supplied by the driving transistor N2 depends upon the magnitude of the signal potential Vsig. The organic EL element OLED is a current driven element and exhibits a higher luminance as the driving current increases.

FIG. 6C shows a driving waveform of the lighting control line LSL. The lighting control line LSL is driven with two values of the H level and the L level. The first L level period in FIG. 6C is used to define an initialization period. The second L level period in FIG. 6C is used to define a no-light emitting period (turning off period) after light emission is started.

The initialization operation here is an operation for expanding the gate-source voltage Vgs of the driving transistor N2 from the threshold voltage Vth. This operation is essentially demanded before execution of threshold value correction. The operation is hereinafter referred to as correction preparation operation.

After this correction preparation operation, the offset potential Vofs is applied to the gate electrode of the driving transistor N2 and the potential of the lighting control line LSL is changed over to the H level. Operation in this potential relationship is the threshold value correction operation. After the threshold value correction operation is started, the source potential Vs of the driving transistor N2 gradually rises, and the rise of the source potential Vs stops at a point of time at which the gate-source voltage Vgs of the driving transistor N2 reaches the threshold voltage Vth.

It is to be noted that, after the writing of the signal potential Vsig ends, a light emitting period is started and continues till a next writing period. Within the light emitting period, when the lighting control line LSL has the H level, the organic EL element OLED is controlled to an on state to emit light, but when the lighting control line LSL has the L level, the organic EL element OLED is controlled to an off state to emit no light. The peak luminance level can be controlled by variably controlling the ratio of the light emitting period length within a one-field period.

FIG. 6D illustrates the potential Vg appearing at the gate electrode of the driving transistor N2. FIG. 6E illustrates the potential Vs appearing at the source electrode of the driving transistor N2, that is, at the anode of the organic EL element OLED.

As described hereinabove, it is necessary for the pulse length of the write control signal of FIG. 6A or the lighting control signal of FIG. 6C to be different in response to an object of the driving operation.

For example, in the former case, it is necessary for the pulse length to be different between that in the threshold value correction operation and that in the signal writing and mobility correction operation. On the other hand, for example, in the latter case, it is necessary for the pulse length to be different between that within a period of the correction preparation operation and that during the turning on/off control within the light emitting period.

Accordingly, it is demanded for the first control line driving section 7 and the second control line driving section 9 to be capable of outputting a plurality of different pulse lengths. Besides, in the case of the line-sequential writing method which is popular in the active matrix driving method, such pulse waveforms must be transferred line-sequentially. In other words, a control line driving section of the type described is demanded to have two different functions incorporated therein including a function of freely setting the pulse length of control pulses and another function of capable of transferring the control pulse line-sequentially to the succeeding stage.

FIGS. 7 to 14 illustrate an example of a control line driving circuit which satisfies the driving conditions described hereinabove and examples of driving operation of the control line driving circuit. It is to be noted that the control line driving circuit is formed from a shift register.

The shift register shown in FIG. 7 is formed from a series circuit of 2N shift stages SR(1) to SR(2N). Each shift stage uses output pulses of other shift stages positioned at the directly preceding and succeeding stage positions as driving pulses such that a clock signal inputted to the self stage is extracted as an output pulse.

FIGS. 8A to 8I show driving pulse waveforms of the shift resister. It is to be noted that FIGS. 8A to 8I show pulse waveforms where the shift register is formed from only NMOS type thin film transistors.

FIG. 8A shows a start pulse st for driving the first shift stage, and FIG. 8B shows an end pulse end for driving the 2Nth shift stage. FIG. 8C shows a clock signal ck1 for shift stages at even-numbered stage positions.

FIG. 8D shows a clock signal ck2 for shift stages at odd-numbered stage positions, and FIG. 8E shows an output pulse o1 of the first shift stage SR(1). FIG. 8F shows an output pulse o(k−1) of the k−1th shift stage SR(k−1). FIGS. 8G to 8I show output pulses o at the stages represented by respective reference characters denoted therein.

FIG. 9 shows an example of an internal circuit of a shift stage SR positioned at the kth stage position. Referring to FIG. 9, all thin film transistors which form the shift stage SR are of the NMOS type. The output stage of the shift stage SR is formed from thin film transistors N11 and N12 of the NMOS type connected in series between a power supply potential VSS and the clock input terminal. It is to be noted that a node between the thin film transistors N11 and N12 is connected to the output terminal. Further, an interpolation capacitor Cb1 is connected between the gate electrode of the thin film transistor N11 and the power supply potential VSS. Meanwhile, another interpolation capacitor Cb2 is connected between the gate electrode of the thin film transistor N12 and the clock input terminal. This interpolation capacitor Cb2 interpolates a bootstrap operation.

FIGS. 10A to 10F illustrate input and output pulses of the shift stage SR and a potential relationship between the nodes A and B. In particular, FIG. 10A shows a waveform of a clock signal ck. FIG. 10B shows a waveform of a first driving pulse in1(k) which is an output pulse out(k−1) of the shift stage positioned at the preceding stage position. FIG. 10C shows a waveform of a second driving pulse in2(k) which is an output pulse out(k+1) of the shift stage positioned at the succeeding stage position. FIG. 10D shows a waveform of the potential at the node B which is a control wiring line potential of the thin film transistor N11. FIG. 10E shows a waveform of the potential at the node A which is a control wiring line potential of the thin film transistor N12. FIG. 10F shows a waveform of the output pulse out appearing at the output terminal.

As seen from FIGS. 10A to 10F, the potentials at the node A and the node B are changed over complementarily to each other at a timing at which the first driving pulse in1(k) rises to the H level and at another timing at which the second driving pulse in2(k) rises to the H level. It is thin film transistors N13 to N16 to implement the complementary operation each other.

For example, when the first driving pulse in1(k) has the H level and the second driving pulse in2(k) has the L level, the thin film transistors N13 and N14 exhibit an on state while thin film transistors N15 and N16 exhibit an off state. Further, for example, when the first driving pulse in1(k) has the L level and the second driving pulse in2(k) has the H level, the thin film transistors N15 and N16 exhibit an on state and the thin film transistors N13 and N14 exhibit an off state.

Incidentally, while the node A has the H level, the interpolation capacitor Cb2 is charged. Therefore, if, while the node A has the H level, the clock signal ck is changed over to the H level and the H level appears at the output pulse out(k), then the potential at the node A changes so as to rise by an amount corresponding to the charged voltage of the interpolation capacitor Cb2. At this time, since the gate-source voltage Vgs of the thin film transistor N12 is secured higher than the threshold voltage Vth by a bootstrap operation, the potential waveform of the output pulse out(k) is quite same as that of the clock signal ck.

In other words, the shift register shown in FIG. 7 operates so as to extract the clock signal ck from the shift stages beginning with the first shift stage and output the clock signal ck to the output terminal. Accordingly, in this shift register, the range of variation of the pulse width of the output pulse out is restricted within a 1H period, that is, within one horizontal scanning period, within which the pulse width of the clock signal ck can be varied.

It is to be noted that the shift register can transfer a plurality of pulse signals within a 1H period.

FIGS. 11A to 11I illustrate an example of a transfer operation where the clock signal ck is formed from two pulse signals. The waveforms shown in FIGS. 11A to 11I correspond to those of FIGS. 8A to 8I, respectively.

FIGS. 12A to 12F illustrate operation waveforms of the corresponding shift stage SR. The waveforms of FIGS. 12A to 12F correspond to those of FIGS. 10A to 10F, respectively. As seen in FIG. 12E, also a bootstrap operation is executed for two pulse signals.

Further, the shift register shown in FIG. 7 can reproduce the same waveform variation on the output pulse out by adjustment of the rising speed and the falling speed of the clock signal ck.

FIGS. 13A to 13I illustrate an example of a transfer operation where a clock signal ck of a trapezoidal waveform is inputted. It is to be noted that the waveforms shown in FIGS. 13A to 13I correspond to those of FIGS. 8A to 8I, respectively.

Further, FIGS. 14A to 14F show operation waveforms of the shift stage SR in this instance. The waveforms of FIGS. 14A to 14F correspond to those of FIGS. 10A to 10F, respectively. As seen from FIG. 14E, also a bootstrap operation produces a trapezoidal waveform quite same as that of the clock signal ck, and the resulting waveform is extracted as the output pulse out.

A similar shift register circuit disclosed in Japanese Patent Laid-Open No. 2005-149624.

SUMMARY OF THE INVENTION

Incidentally, the thin film transistors N11 and N12 which form the output stage of the shift register described hereinabove with reference to FIG. 7 or FIG. 9 operate complementarily to each other. Accordingly, no through-current flows to the output stage, and the power consumption is reduced as much.

However, in the shift register described above with reference to FIG. 7 or 9, the clock signal ck inputted from the outside is outputted as it is as an output clock or transfer clock. Accordingly, for buffer circuits 21 which supply a clock signal to the first control line driving section 7 in the form of a shift register as seen in FIG. 15, a driving capacity sufficient to drive all pixels which are a supplying destination of the output pulse is demanded.

On the other hand, for buffer circuits 23 which supply the start pulse st and the end pulse end to the first control line driving section 7, only a driving capacity for driving the shift stage SR in the shift register is demanded.

Therefore, it cannot be avoided that the circuit size of the buffer circuits 21 is greater than that of the buffer circuits 23.

As a result, although the power consumed in the inside of the shift register shown in FIG. 7 or 9, that is, the first control line driving section 7, can be reduced, the shift register provides a drawback that the power consumed by the buffer circuit 21 positioned at the stage preceding to the register increases.

Besides, it is necessary for the clock signal ck to drive all pixels positioned on the horizontal line as described hereinabove. Accordingly, the shift register has a problem that, as the number of pixels juxtaposed on the horizontal line or as the load to the pixels increases, the pixel size of the buffer circuits 21 increases and the power consumption increases.

As described above, the currently proposed control line driving sections or semiconductor devices have various technical problems which are not solved as yet. Therefore, it is desirable to provide a buffer circuit which can adopt a circuit configuration wherein, even where the load to be driven is high, the driving capacity demanded for a circuit at a preceding stage may be low.

Therefore, the inventor proposes a semiconductor device which includes a plurality of thin film transistors of a single channel formed on an insulating substrate and a buffer circuit including the following components a to e although, as regards the components d and e, only one of them may be included to achieve a good driving characteristic:

a. an outputting stage formed from a series connection of first and second thin film transistors and having an output terminal at a node between the first and second thin film transistors, b. a first inputting stage formed from a series connection of a third thin film transistor for being controlled with a set pulse and a fourth thin film transistor for being controlled with a reset pulse and configured to switchably control a potential state of a first controlling wiring line connected to a control electrode of the first thin film transistor between a potential state within a period from an application starting timing of the set pulse to an application starting timing of the reset pulse and another potential state within any other period through a potential appearing at a node between the third and fourth thin film transistors, c. a second inputting stage formed from a series connection of a fifth thin film transistor for being controlled with the reset pulse and a sixth thin film transistor for being controlled with the set pulse and configured to switchably control a potential state of a second controlling wiring line connected to a control electrode of the second thin film transistor in a phase relationship reverse to that of a potential variation of the first controlling wiring line through a potential appearing at a node between the fifth and sixth thin film transistors, d. a seventh thin film transistor connected at one of main electrodes thereof to the first controlling wiring line and at the other main electrode thereof to a power supply common to the second, fourth and sixth thin film transistors and further connected at a control electrode thereof to the second controlling wiring line, and e. an eighth thin film transistor connected at one of main electrodes thereof to the second controlling wiring line and at the other main electrode thereof to the power supply common to the second, fourth and sixth thin film transistors and further connected at a control electrode thereof to the first controlling wiring line.

Preferably, in the buffer circuit, the set pulse and the reset pulse have an amplitude smaller than that of an output pulse appearing at the output terminal. Where the amplitude of the input pulses is small, the power consumption of a circuit at a preceding stage can be reduced as much.

Preferably, each of the set pulse and the reset pulse is supplied from a corresponding shift register circuit. Where the shift register circuit for the set pulse and the shift register circuit for the reset pulse are used, the buffer circuit can be used for an application wherein it is demanded to drive a large number of loads in order at a high speed.

Preferably, the output pulse of the buffer circuit is used, for example, for control of a current supplying line of a display panel.

Further preferably, the output pulse of the buffer circuit is used for lighting control of the display panel of a self luminous type, and the period from the application starting timing of the set pulse to the application starting timing of the reset pulse provides any light emitting period length disposed within a one-field period.

Preferably, in the buffer circuit, the third and fifth thin film transistors are connected in diode connection. In this instance, the necessity for a power supply line for connecting one of the main electrodes of the third and fifth thin film transistors is eliminated, and the layout area of the buffer circuit can be reduced as much.

Preferably, in the buffer circuit, the first thin film transistor receives, at one of main electrodes thereof, a pulse signal for causing a plurality of output pulses to be generated within the period from the application starting timing of the set pulse to the application starting timing of the reset pulse. Where this structure is adopted, complicated pulse control can be anticipated.

Preferably, the output pulse of the buffer circuit is used, for example, for control of a sampling timing of the display panel.

Preferably, the semiconductor device which incorporates the buffer circuit is incorporated at least in part of a driving circuit for driving and controlling a pixel array section of a display panel.

Preferably, the display panel is incorporated in an electronic apparatus. The electronic apparatus may include, in addition to the pixel array section, a system control section for controlling operation of the entire system and an operation inputting section for inputting to the system control section.

In the buffer circuit having the structure described above, the output potentials of the first and second inputting sections are applied to the controlling wiring lines of the first and second thin film transistor which form the outputting stage. Here, the driving object of the set pulse and the reset pulse is the thin film transistors which form the first and second inputting stages. Accordingly, the driving capacity demanded for the supplying lines of the set pulse and the reset pulse may be reduced.

Further, where the first and second inputting stages are disposed, even within a period within which a significant level of the set pulse and the reset pulse is not applied, the potential state of the controlling wiring lines of the first and second thin film transistors which form the outputting stage can be maintained. Consequently, even where a current load is connected to the outputting stage, the potential of the output pulse can be maintained.

Further, since both or one of the seventh and eighth thin film transistors is prepared, the potential of one of the two controlling wiring lines can be fixed to an ideal off potential by the potential of the other controlling wiring line. As a result, through-current at the outputting stage can be suppressed with certainty. Further, since the potential of the controlling wiring line is fixed, the resisting property against a jumping in signal from the outside can be enhanced. In other words, the reliability in operation can be enhanced.

The above and other features and advantages of the present invention will become apparent from the following description and the appended claims, taken in conjunction with the accompanying drawings in which like parts or elements are denoted by like reference symbols.

BRIEF DESCRIPTION OF THE DRAWINGS

FIGS. 21A to 21H are waveform diagrams illustrating driving waveforms of the buffer circuit shown in FIG. 20;

FIGS. 22A to 22H are waveform diagrams illustrating driving waveforms of the buffer circuit shown in FIG. 20 where an influence of coupling is taken into consideration;

FIGS. 26A to 26H are waveform diagrams illustrating driving waveforms of the buffer circuit shown in FIG. 25;

FIGS. 30A to 30H are waveform diagrams illustrating driving waveforms of the buffer circuit shown in FIG. 29;

FIGS. 34A to 34E are waveform diagrams illustrating driving waveforms of the buffer circuit shown in FIG. 33;

FIGS. 46A to 46H are waveform diagrams illustrating driving waveforms of the buffer circuit shown in FIG. 45;

FIGS. 47A to 47H are waveform diagrams illustrating driving waveforms of the buffer circuit shown in FIG. 45 where an influence of coupling is taken into consideration;

FIGS. 53A to 53E are waveform diagrams illustrating driving waveforms of the buffer circuit shown in FIG. 52;

FIGS. 55A to 55H are waveform diagrams illustrating driving waveforms of the buffer circuit shown in FIG. 54;

FIGS. 61A to 61E are waveform diagrams illustrating driving waveforms of the buffer circuit shown in FIG. 60;

DETAILED DESCRIPTION OF THE PREFERRED EMBODIMENT

In the following, the present invention is described in connection with a preferred embodiment thereof wherein the present invention is applied to a driving circuit for a display panel, particularly an organic EL panel, of the active matrix driving type.

It is to be noted that, to technical matters which are not particularly described in the present specification or illustrated in the accompanying drawings, those technical matters which are well known in the applicable technical field or publicly known technical patters are applied.

A. System Configuration of the Display Panel

Figure 16:
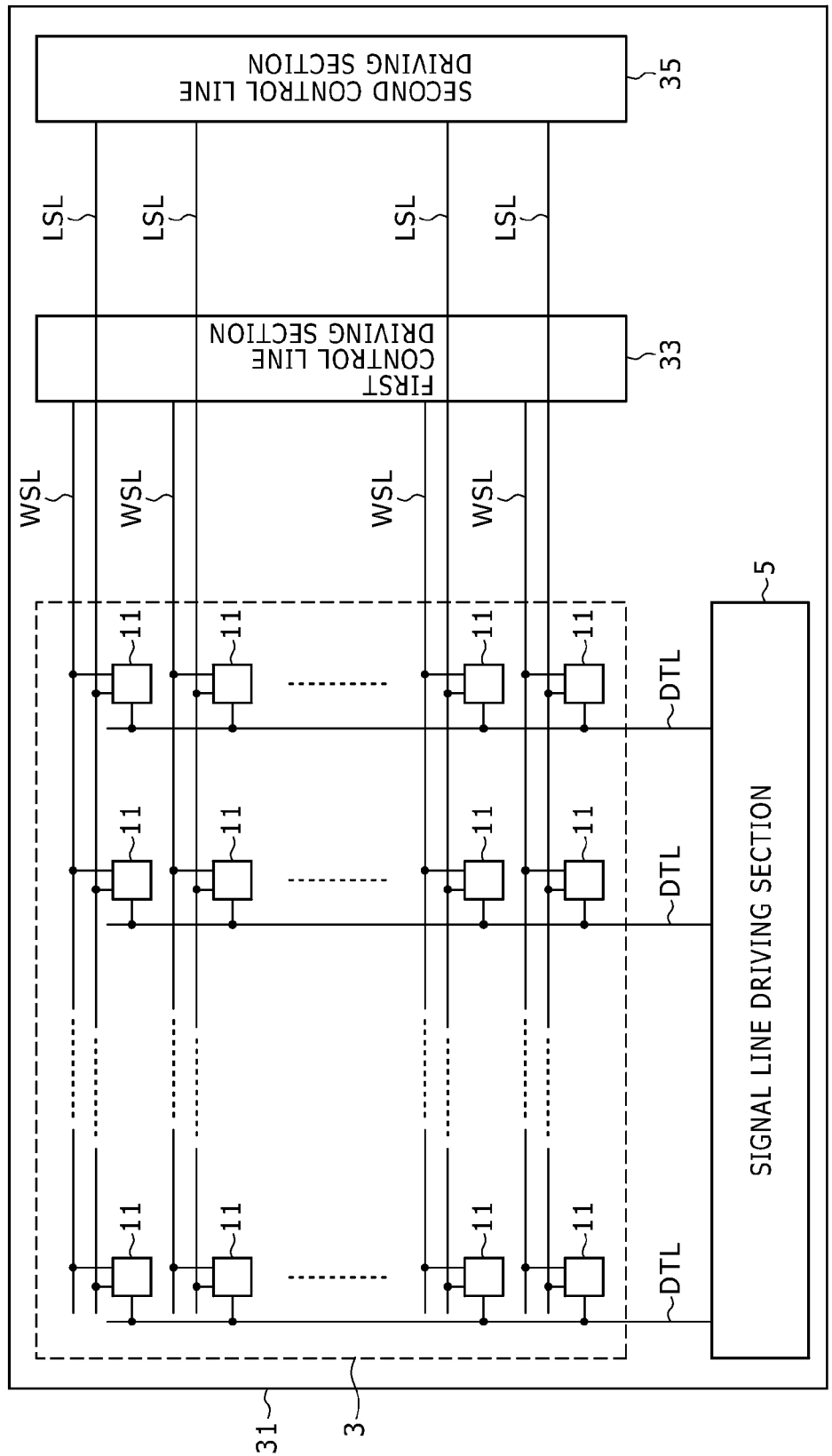
FIG. 16 is a block circuit diagram showing an example of a system configuration of an organic EL panel to which the present embodiment is applied.

FIG. 16 shows an organic EL panel to which the present embodiment is applied.

Referring to FIG. 16, the organic EL panel 31 shown includes a pixel array section 3, a signal line driving section 5, a first control line driving section 33 and a second control line driving section 35 provided on a panel board.

In particular, a buffer circuit according to the present embodiment is incorporated in the first and second control line driving sections 33 and 35 which transfer a driving pulse in a vertical direction.

Figure 17:
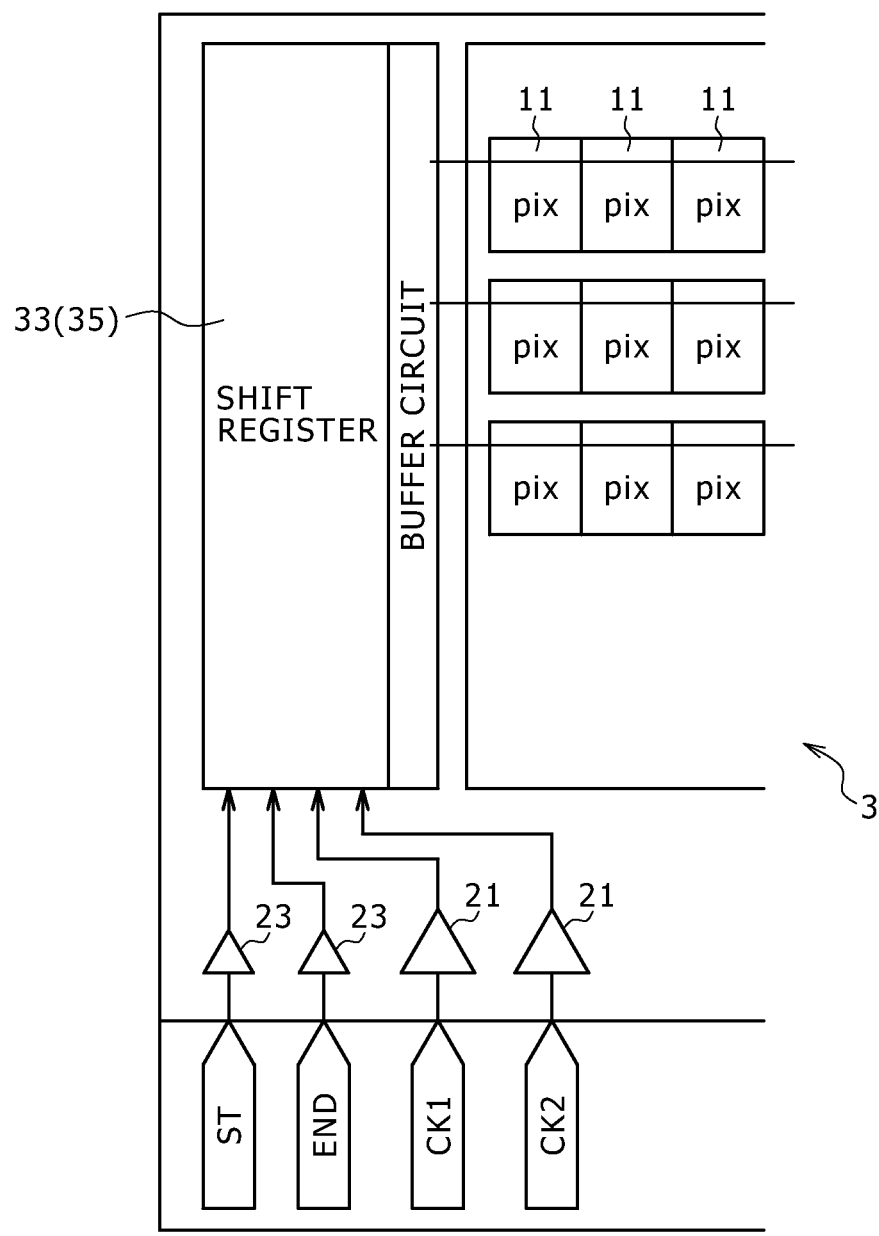
FIG. 17 is a block diagram showing a panel structure wherein a buffer circuit according to the present embodiment is used for a driving circuit.

It is assumed that the control line driving circuits incorporated in the organic EL panel 31 have a two-stage structure of a shift register for transferring a pulse signal in response to a clock signal and a buffer circuit for driving control lines in response to the pulse signal as seen in FIG. 17.

As hereinafter described, the buffer circuit incorporated in the organic EL panel 31 uses an output of the shift register as a set pulse and a reset pulse. In particular, the output pulse of the shift register may have a driving capacity for driving not all of sub pixels 11 connected to a control line but only the buffer circuit.

Therefore, a buffer circuit 21 for a clock signal disposed at the stage preceding to the shift register may have a driving capacity similar to that of buffer circuits 23 for a start pulse st and an end pulse end.

It is to be noted that the set pulse is a signal which provides a timing at which the potential of the output pulse of the buffer circuit is changed over to the set potential.

Meanwhile, the reset pulse is a signal which provides a timing at which the potential of the output pulse of the buffer circuit is changed over to the reset potential.

B. Configuration of the Control Line Driving Circuit (NMOS Type)

Figure 18:
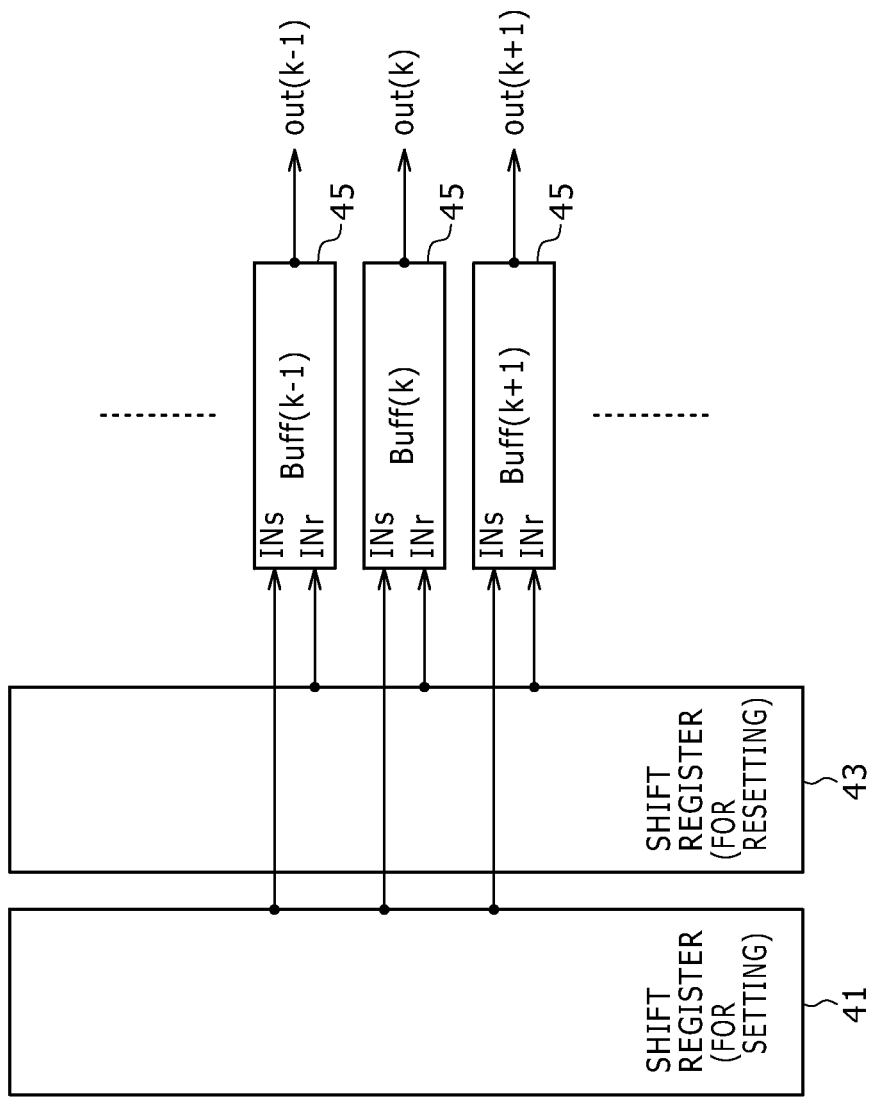
FIG. 18 is a block diagram showing a circuit configuration of a control line driving section shown in FIG. 17 where the control line driving section is formed from thin film transistors of the NMOS type.

FIG. 18 shows an example of a configuration of a control line driving section formed only from thin film transistors of the NMOS type.

The control line driving section shown in FIG. 18 includes a shift register 41 for transferring a set pulse, a shift register 43 for transferring a reset pulse, and a buffer circuit 45 which operates complementarily in response to the set pulse and the reset pulse outputted from each shift stage.

It is to be noted that the buffer circuit 45 outputs the H level, which is a set potential, in response to the set pulse inputted thereto, but outputs the L level, which is a reset potential, in response to the reset pulse inputted thereto.

Figure 19:
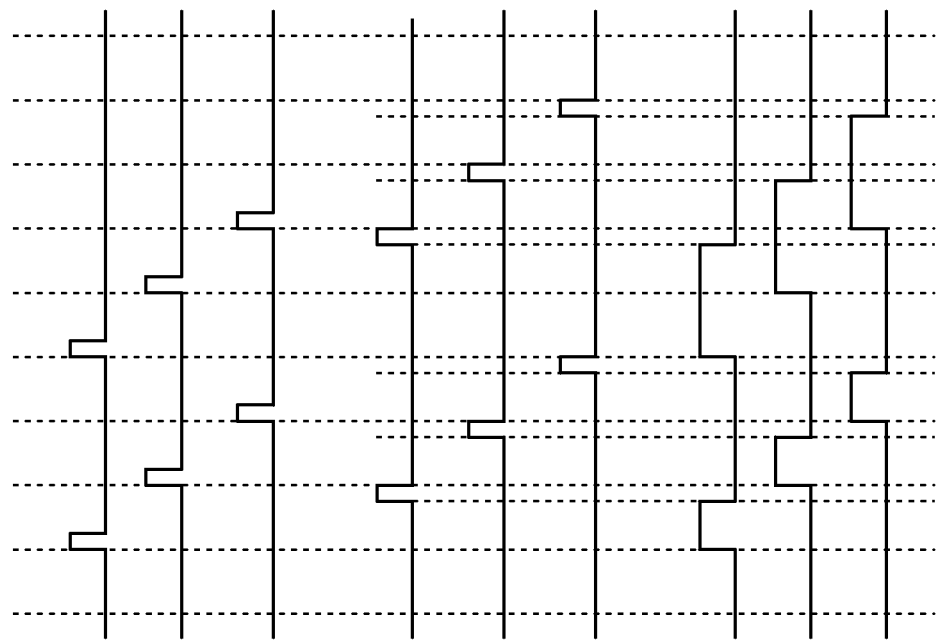
FIGS. 19A to 19I are waveform diagrams illustrating driving waveforms of the control line driving section of FIG. 18.

FIGS. 19A to 19I indicate driving pulse waveforms of the control line driving section. It is to be noted that FIGS. 19A to 19C illustrate output pulses scan1 (scan1(k−1) to scan1(k+1)) of the shift register 41 for set signal transfer. FIGS. 19D to 19F indicate output pulses scan2 (scan2(k−1) to scan2(k+1)) of the shift register 43 for reset signal transfer. FIGS. 19G to 19I indicate output pulses out (out(k−1) to out(k+1)) of the buffer circuit 45.

As seen from FIGS. 19G to 19I, the pulse width of the output pulses out of the buffer circuit 45 coincides with the time difference between inputting timings of the set pulse and the reset pulse inputted to the buffer circuit 45. Therefore, by controlling a transfer interval of the set pulse and the reset pulse, the pulse width of the output pulses can be set freely.

In the following, several examples of a mode of the buffer circuit 45 are described.

B-1. Example 1 of the Mode a. Circuit Configuration

Figure 20:
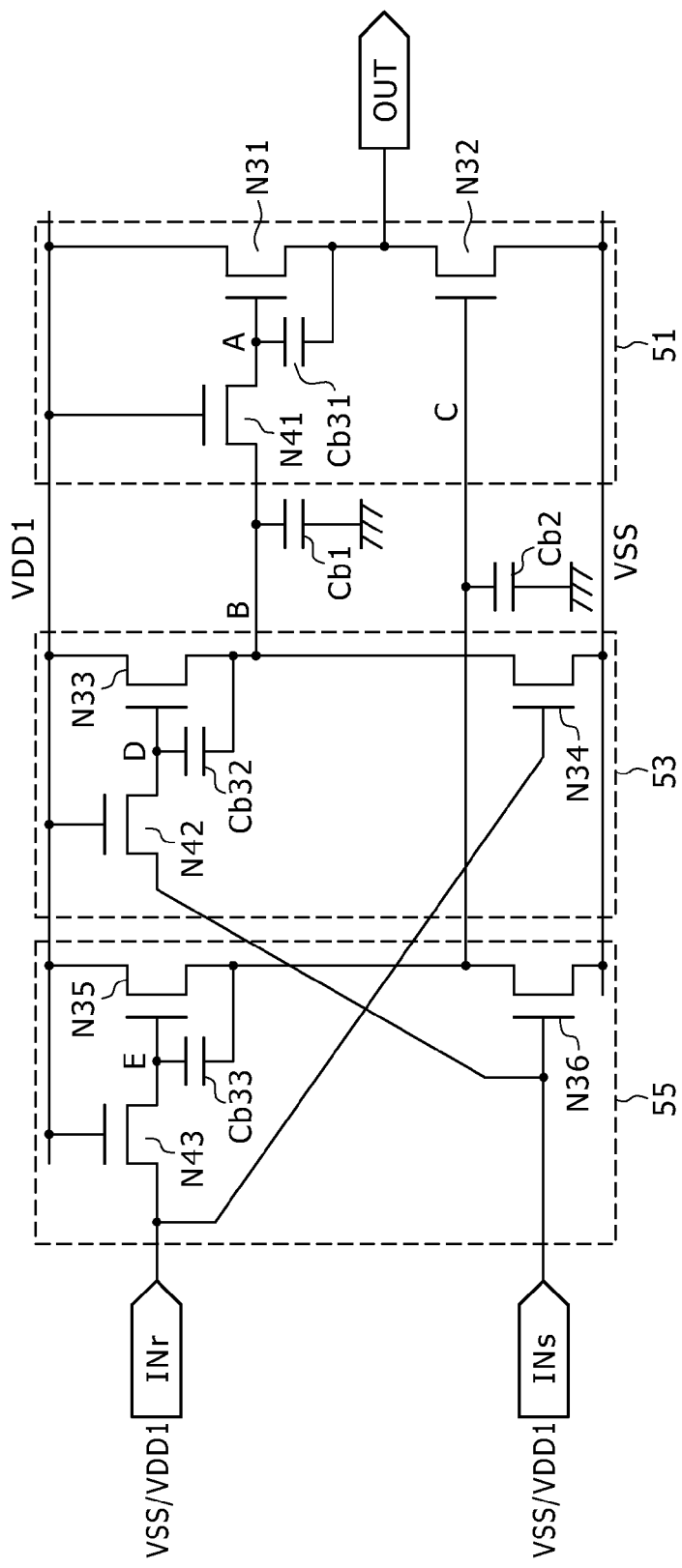
FIG. 20 is a circuit diagram showing an example of a mode of the buffer circuit shown in FIG. 18.

FIG. 20 shows a first mode example of the buffer circuit 45, and FIGS. 21A to 21H illustrate driving waveforms of the example of FIG. 20.

Referring first to FIG. 20, the buffer circuit 45 shown includes an outputting stage 51, a first inputting stage 53, and a second inputting stage 55.

The outputting stage 51 has a circuit configuration wherein thin film transistors N31 and N32 of the NMOS type are connected in series between a high potential power supply VDD1 and a low potential power supply VSS. In particular, the thin film transistor N31 is connected to the high potential power supply VDD1 side while the thin film transistor N32 is connected to the low potential power supply VSS side. A node between the thin film transistors N31 and N32 serves as an output terminal OUT of the buffer circuit 45.

In the present mode, a bootstrap complementary capacitor Cb31 is connected between the gate electrode of the thin film transistor N31 and the output terminal. However, where the gate capacitance of the thin film transistor N31 is sufficiently high, the bootstrap complementary capacitor Cb31 need not be disposed.

Further, in the outputting stage 51, a thin film transistor N41 for absorbing a potential difference between the gate potential Vg of the thin film transistor N31 and the output potential of the first inputting stage 53 is disposed upon bootstrap operation. The thin film transistor N41 of the NMOS type is connected at one of main electrodes thereof to a gate electrode wiring line of the thin film transistor N31, that is, to the node A of the control line, and at the other main electrode thereof to the node B of the control line. Further, the thin film transistor N41 is connected at the gate electrode thereof to the high potential power supply VDD1.

It is to be noted that a capacitor (hereinafter referred to as storage capacitor) Cs1 for storing a potential is connected to the node B. Similarly, another storage capacitor Cs2 is connected to a gate electrode wiring line of the thin film transistor N32, that is, a node C of another control line. The storage capacitors Cs1 and Cs2 are connected in order to complement the nodes B and C where the wiring line capacitance of the nodes B and C is low. By the disposition of the complementary capacitors, the variation of the node potential which makes a cause of a malfunction such as off leak of the thin film transistors or jumping in through a capacitor between wiring lines can be reduced.

The first inputting stage 53 and the second inputting stage 55 have a circuit configuration basically same as that of the outputting stage 51.

First, a circuit configuration of the first inputting stage 53 is described. The first inputting stage 53 has a circuit configuration that thin film transistors N33 and N34 of the NMOS type are connected in series between the high potential power supply VDD1 and the low potential power supply VSS. In particular, the thin film transistor N33 is connected to the high potential power supply VDD1 side while the thin film transistor N34 is connected to the low potential power supply VSS side. A node between the thin film transistors N33 and N34 serves as an output terminal and is connected to the node B.

Meanwhile, a bootstrap complementary capacitor Cb32 is connected between the gate electrode of the thin film transistor N33 and the output terminal. Further, where the gate capacitance of the thin film transistor N33 is sufficiently high, the bootstrap complementary capacitor Cb32 need not be disposed.

Further, a thin film transistor N42 for absorbing a potential difference between the gate potential Vg of the thin film transistor N33 and the potential appearing at the input terminal for the set pulse upon bootstrap is disposed.

The thin film transistor N42 of the NMOS type is connected at one of main electrodes thereof to a gate electrode wiring line of the thin film transistor N33, that is, to a node D of the control line, and at the other main electrode thereof to an input terminal INs for the reset pulse. Further, the thin film transistor N42 is connected at the gate electrode thereof to the high potential power supply VDD1.

Meanwhile, the thin film transistor N34 is connected at the gate electrode thereof to an input terminal INr for the reset pulse. In this manner, operation of the first inputting stage 53 is controlled with the set pulse and the reset pulse.

Now, a circuit configuration of the second inputting stage 55 is described. The second inputting stage 55 has a circuit configuration that thin film transistors N35 and N36 of the NMOS type are connected in series between the high potential power supply VDD1 and the low potential power supply VSS. In particular, the thin film transistor N35 is connected to the high potential power supply VDD1 side while the thin film transistor N36 is connected to the low potential power supply VSS side. A node between the thin film transistors N35 and N36 serves as an output terminal and is connected to the node C.

Meanwhile, a bootstrap complementary capacitor Cb33 is connected between the gate electrode of the thin film transistor N35 and the output terminal. Further, where the gate capacitance of the thin film transistor N35 is sufficiently high, the bootstrap complementary capacitor Cb33 need not be disposed.

Further, a thin film transistor N43 for absorbing a potential difference between the gate potential Vg of the thin film transistor N35 and the potential appearing at the input terminal for the reset pulse upon bootstrap is disposed.

The thin film transistor N43 of the NMOS type is connected at one of main electrodes thereof to a gate electrode wiring line of the thin film transistor N35, that is, to a node E of the control line, and at the other main electrode thereof to the input terminal INr for the reset pulse. Further, the thin film transistor N43 is connected at the gate electrode thereof to the high potential power supply VDD1.

Meanwhile, the thin film transistor N36 is connected at the gate electrode thereof to the input terminal INs for the set pulse. In this manner, the connection relationship of the set pulse and the reset pulse to the thin film transistors in the second inputting stage 55 is set to the opposite relationship to that in the first inputting stage 53.

It is to be noted that the boot gain gb of the thin film transistor N31 (N33 and N35) is given by the following expression:

$$gb=(Cg+Cb)/(Cg+Cb+Cp)$$

where Cg is the gate capacitance, Cb the bootstrap complementary capacitor connected to the gate electrode of the thin film transistor, and Cp the parasitic capacitance of the node A (node D and node E) (wiring line capacitance except the parasitic capacitance Cg and Cb).

The presence of the parasitic capacitance Cp makes a cause of drop of the bootstrap gain. Accordingly, it is preferable to dispose the bootstrap complementary capacitor to raise the bootstrap gain as described hereinabove in order to ensure the turning on operation of the thin film transistors.

b. Driving Operation

Now, a relationship between the potential state of the set pulse and the reset pulse and the potential state of the nodes is described with reference to FIGS. 21A to 21H.

FIG. 21A illustrates a potential state of the set pulse at the input terminal INs. FIG. 21B illustrates a potential state of the reset pulse at the input terminal INr.

FIG. 21C illustrates a potential state of the gate electrode wiring line of the thin film transistor N33 at the node D.

FIG. 21D illustrates a potential state of the gate electrode wiring line of the thin film transistor N35 at the node E. FIG. 21E illustrates a potential state of the control wiring line at the node B to which the output terminal of the first inputting stage 53 is connected. FIG. 21F illustrates a potential state of the gate electrode wiring line of the thin film transistor N31 at the node A. FIG. 21G illustrates a potential state of the control wiring line at the node C to which the output terminal of the second inputting stage 55 is connected. FIG. 21H illustrates a state of the potential appearing at the output terminal OUT of the outputting stage 51.

As seen from FIGS. 21A to 21H, the signal amplitude of the set pulse at the input terminal INs is given with two values according to the low potential power supply VSS and the high potential power supply VDD1. On the other hand, the signal amplitude of the reset pulse at the input terminal INr is given with two values according to the low potential power supply VSS and the high potential power supply VDD1. In this manner, the pulse signals provided from the shift registers 41 and 43 are same as the two power supply potentials supplied to the buffer circuit 45.

In the present mode example, the timing at which the set pulse rises to the H level is defined as a timing which provides a rising timing of the output pulse appearing at the output terminal of the outputting stage 51. On the other hand, the timing at which the reset pulse rises to the H level is defined as a timing which provides a falling timing of the output pulse appearing at the output terminal of the outputting stage 51. As seen in FIGS. 21A and 21B, the set pulse rise to the H level first, and then the reset pulse rises to the H level.

First, at the timing at which the set pulse rises to the H level, the potential at the node D of the first inputting stage 53 rises to the H level. Consequently, the thin film transistor N33 is placed into an on state and the potential at the node B rises as seen from FIG. 21E.

It is to be noted that, together with the rise of the potential at the node B, the gate potential of the thin film transistor N33, that is, the potential at the node D, rises by an amount corresponding to a charge amount accumulated in the bootstrap complementary capacitor Cb32 as seen from FIG. 21C. The potential after the rise is Vd. When this potential Vd satisfies Vd−VDD1>Vth(N33), upon turning on operation of the thin film transistor N33, the potential at the node B becomes the high potential power supply VDD1 as seen from FIG. 21E.

After the potential at the node B rises to the high potential power supply VDD1 as described above, also the potential at the node A rises to the H level and the thin film transistor N31 is placed into an on state. Consequently, the potential at the output terminal OUT rises as seen in FIG. 21H.

It is to be noted that, together with the rise of the potential at the output terminal OUT, the gate potential of the thin film transistor N31, that is, the potential at the node A, rises by an amount corresponding to a charge amount accumulated in the bootstrap complementary capacitor Cb31 as seen from FIG. 21F. The potential after the rise is Va. When this potential Va satisfies Va−VDD1>Vth(N31), upon turning on operation of the thin film transistor N31, the potential at the output terminal OUT becomes the high potential power supply VDD1 as seen from FIG. 21H.

Incidentally, within the period within which the set pulse has the H level, also the thin film transistor N36 is in an on state. Therefore, the gate potential of the thin film transistor N32 which composes the outputting stage 51, that is, the potential at the node C, is controlled to the low potential power supply VSS as seen in FIG. 21G.

Soon, the set pulse falls from the H level to the L level. However, the storage capacitors Cs1 and Cs2 are connected to the nodes B and C, respectively, and the potential states established when the set pulse has the H level are maintained. Accordingly, the potential states are maintained until the reset pulse changes over from the L level to the H level.

After the reset pulse changes over to the H level as seen in FIG. 21B, now the thin film transistor N35 is placed into an on state and the potential at the node C rises as seen in FIG. 21G. It is to be noted that, together with the rise of the potential at the node C, the gate potential of the thin film transistor N35, that is, the potential at the node E, rises by an amount corresponding to a charge amount accumulated in the bootstrap complementary capacitor Cb33 as seen in FIG. 21D. The potential after the rise is Ve. When the potential Ve satisfies Ve−VDD1>Vth(N35), the potential at the node C upon turning on operation of the thin film transistor N35 becomes the high potential power supply VDD1 as seen in FIG. 21G.

After the potential at the node C rises to the high potential power supply VDD1 as described above, the thin film transistor N32 is placed into an on state and the potential at the output terminal OUT falls to the low potential power supply VSS as seen in FIG. 21H.

Incidentally, within the period within which the reset pulse has the H level, also the thin film transistor N34 is in an on state. Therefore, the potential at the node B is controlled to the low potential power supply VSS as seen in FIG. 21E. Together with this, also the gate potential of the thin film transistor N31 which composes the outputting stage 51, that is, the potential at the node A, falls to the low potential power supply VSS.

Soon, the reset pulse falls from the H level to the L level. However, the storage capacitors Cs1 and Cs2 are connected to the nodes B and C, respectively, and the potential states established when the reset pulse has the H level are maintained. Accordingly, the potential states are maintained until the set pulse changes over from the L level to the H level.

By the operations described above, the buffer circuit 45 is implemented wherein the output pulse rises to the H level at the timing at which the set pulse rises to the H level and the output pulse falls to the L level at the timing at which the reset pulse rises to the H level.

c. Effect

As described above, since the buffer circuit 45 having the circuit configuration of the mode example described above is adopted, the load to be driven by the set pulse and the reset pulse can be restricted to the gate capacitance of the thin film transistors N33 and N36 and the thin film transistors N34 and N35, respectively. Accordingly, the driving capacity demanded for the supply sources of the set pulse and the reset pulse can be reduced. Consequently, the power consumption in the supply sources of the driving pulses can be reduced.

Further, since the first and second input stages are provided, also within a period within which the set pulse and the reset pulse have the L level, supply of a potential to the control wiring lines of the thin film transistors N31 and N32 which compose the outputting stage 51, that is, to the nodes A and C, can be continued. Therefore, also where a current load is connected to the outputting stage 51, the potential of the output pulse can be maintained.

Figure 3:
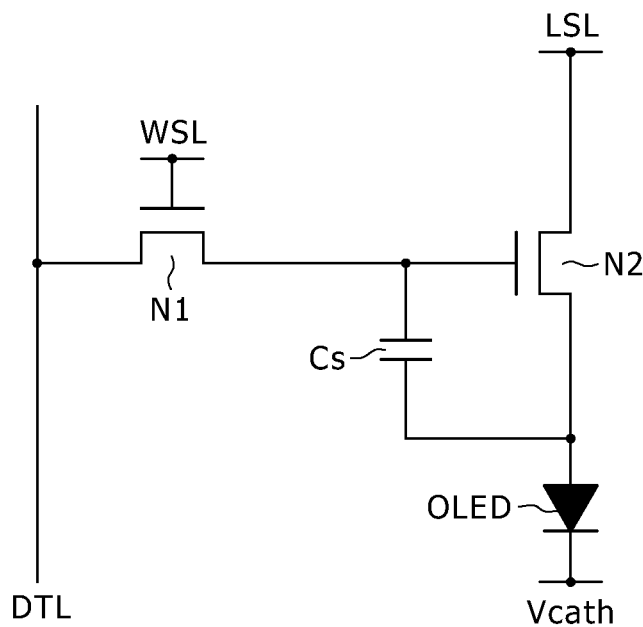

In particular, the buffer circuit according to the mode example can be incorporated into the second control line driving section 35 which drives the lighting control line LSL of the sub pixel 11 shown in FIG. 3. Naturally, the buffer circuit can be applied also to a control line driving section for driving the other control lines. For example, the buffer circuit according to the mode example can be applied also to the first control line driving section 33 for controlling the gate electrode voltage of the thin film transistor in the sub pixel 11.

Further, as seen from FIGS. 21F and 21G, the two thin film transistors N31 and N32 are not controlled to an on state at the same time. In other words, the thin film transistors N31 and N32 operate complementarily. Accordingly, no through-current flows to the outputting stage 51, and a buffer circuit of the one-sided channel type which can carry out operation of the low power consumption type same as that of an output buffer of the CMOS type can be implemented.

B-2. Example 2 of the Mode a. Noticeable Point of the Example 1 of the Mode

As described hereinabove, the buffer circuit 45 of the circuit configuration according to the mode example 1 is a circuit device of the low power consumption type through which no through-current basically flows. Incidentally, in the case of the buffer circuit 45 according to the mode example 1, in order to raise the bootstrap gain, the gate capacitance of the thin film transistors N33 and N35 and the capacitance value of the bootstrap complementary capacitors Cb32 and Cb33 are set to high values.

However, that the capacitance is high signifies that a potential variation of the set pulse or the reset pulse is likely to jump into the output terminals of the input stages, that is, to the nodes B and C. In particular, a phenomenon occurs that the potential at the output terminals, that is, at the nodes B and C, falls from a supposed potential by a potential variation when the set pulse or the reset pulse varies from the H level to the L level. Thereupon, the gate diffusion capacitance and the bootstrap complementary capacitors Cb32 and Cb33 function as a coupling capacitor. The gate diffusion capacitance is parasitic capacitance between the gate and the source or the gate and the drain of a thin film transistor. The gate capacitance is capacitance between the channel, which is produced when the thin film is operative, and the gate.

FIGS. 22A to 22H illustrate timing charts wherein the gate diffusion capacitance and jumping in of a pulse which occurs through the bootstrap complementary capacitors Cb32 and Cb33 are taken into consideration.

From FIG. 22E, it can be seen that, at the node B, the potential which should be high potential power supply VDD1 falls to Vb1 and the potential which should be the low potential power supply VSS falls to Vb2. Further, from FIG. 22G, it can be seen that, at the node C, the potential which should be the high potential power supply VDD1 falls to Vc2 and the potential which should be the low potential power supply VSS falls to Vc1.

As seen also FIGS. 22A to 22H, within a period within which both of the set pulse and the reset pulse have the L level, the node B and the node C operate in a floating state. Therefore, as far as the circuit configuration shown in FIG. 20 is adopted, the potential fall by jumping in of a pulse cannot be avoided. However, if the jumping in amount of a pulse is small, then this does not matter with operation of the buffer circuit 45. No problem occurs with the driving operation where both of VDD1−Vb1<Vth(N41) and Vc2−VSS>Vth (N32) are satisfied.

If VDD1−Vb1<Vth(N41) is satisfied, then also within a period within which the node A is in a floating state, the thin film transistor N41 is not placed into an on state and the node A can keep the potential Va. Accordingly, the high potential power supply VDD1 is outputted as the H level of the output pulse.

On the other hand, if Vc2−VSS>Vth(N32) is satisfied, then the thin film transistor N32 can be placed into an on state, and the output pulse can be lowered to the low potential power supply VSS with certainty.

However, if reduction of the power consumption is taken into consideration, then it becomes a problem that the potential at the nodes B and C falls to a potential lower than the low potential power supply VSS due to jumping in of a pulse.

Figure 23:
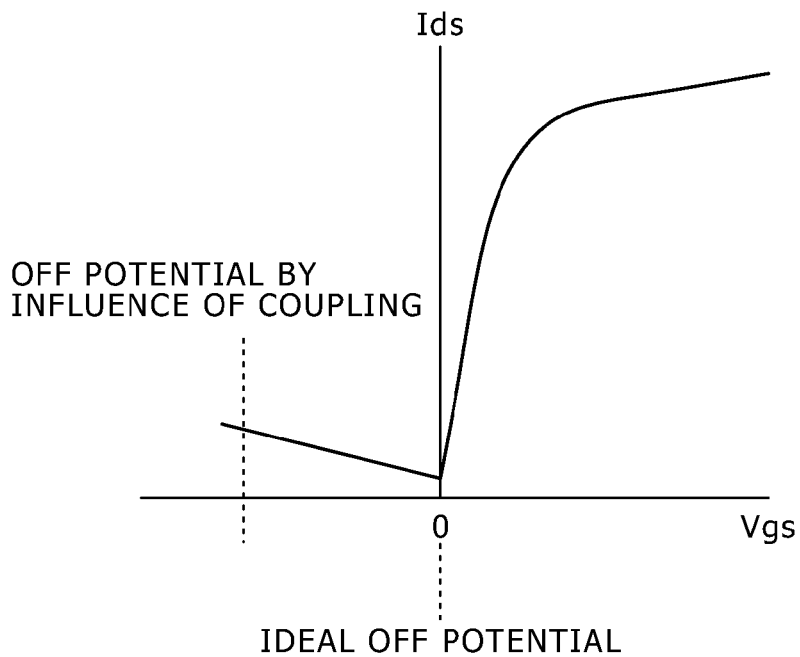
FIG. 23 is a diagram illustrating an Ids-Vgs characteristic of an NMOS transistor.
Figure 24:
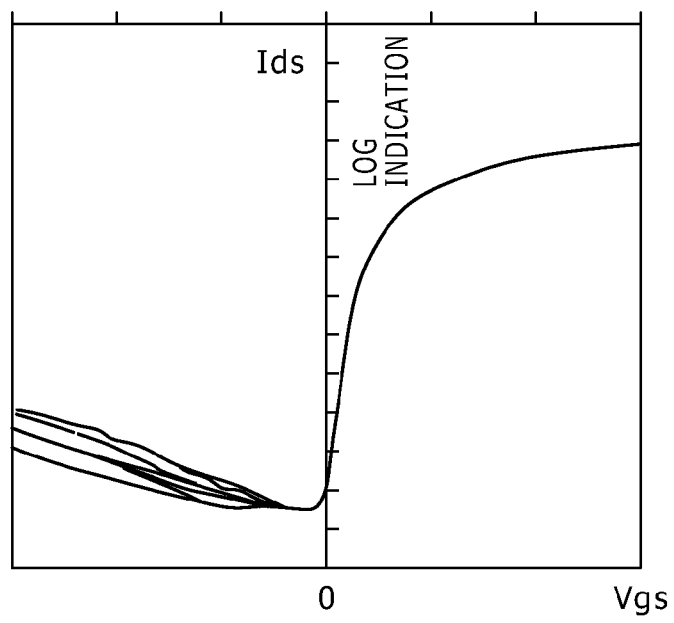
FIG. 24 is a diagram illustrating results of measurement of the Ids-Vgs characteristic of an NMOS transistor.

FIG. 23 illustrates an Ids-Vgs characteristic of an NMOS transistor. As seen in FIG. 23, an NMOS transistor of a popular structure has a tendency that, in a region in which the gate-source voltage Vgs is in the negative (<0), the current Ids increases. This phenomenon is represented that Iback jerks. FIG. 24 illustrates a result of measurement of the Ids-Vgs characteristic of the thin film transistor N41.

From FIG. 24, it can be recognized that the Iback jerks and that there is a dispersion in a jerking manner of the Iback.

From the point of view of the power consumption, that is, from the point of view of minimization of the through-current, it is desired that the gate-source voltage Vgs of the thin film transistors N31 and N32 upon turning off operation is in the proximity of Vgs=0 at which the current Ids is lowest.

However, as described hereinabove, if the potential at the nodes B (or A) and C becomes lower than the low potential power supply VSS(=0 V) as a result of jumping in of a pulse, then the operating point of the thin film transistors N31 and N32 changes to a region in which the Iback jerks. Besides, as seen in FIG. 24, the current Ids in this region is influenced by a characteristic dispersion of the thin film transistor.

Usually, in a complementary circuit, if off current is sufficiently lower than on current, then there is no problem in driving. However, if rising and falling (transient) characteristics of an output pulse are taken into consideration, then the difference in current Ids has an influence on the waveform of the output pulse.

b. Circuit Configuration

Therefore, in the present mode example, a circuit configuration is proposed with which the thin film transistors N31 and N32 can operate at an off operating point at which leak current is little and also the dispersion in leak current is little. In particular, a countermeasure for preventing the node B and the node C from entering a floating state within a L-level period, that is, a circuit configuration which can fix the L level of the node B and the node C to the low potential power supply VSS, is proposed.

Figure 25:
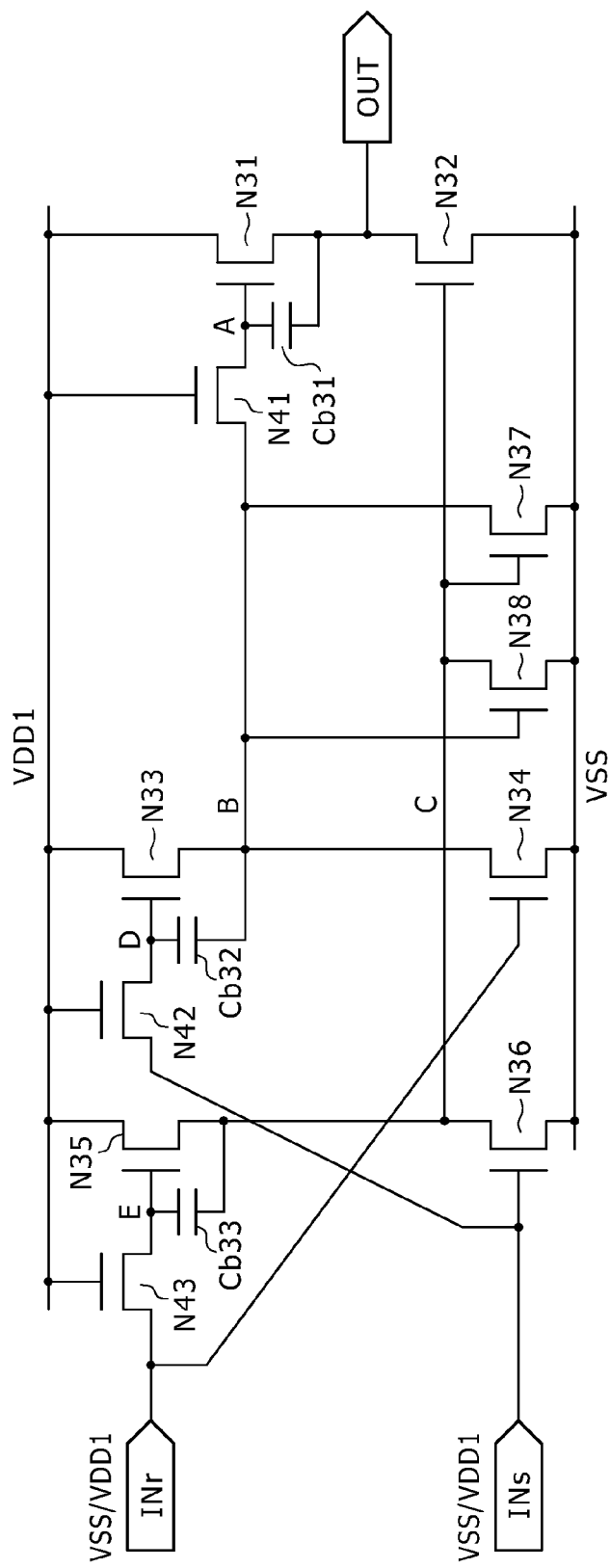
FIG. 25 is a circuit diagram showing another example of a mode of the buffer circuit shown in FIG. 18.

FIG. 25 shows a second mode example of the buffer circuit 45.

The buffer circuit 45 according to the present mode example has a basic circuit configuration same as that of the buffer circuit 45 according to the mode example 1 except that the storage capacitors Cs1 and Cs2 are omitted.

The buffer circuit 45 according to the present mode example is different in two points that it includes a thin film transistor N37 for continuing supply of the low potential power supply VSS to the node B within a period within which the node C has the H level and that another thin film transistor N38 for continuing supply of the low potential power supply VSS to the node C within a period within which the node B has the H level.

In particular, the thin film transistor N37 is connected at one of main electrodes thereof to the node B, at the other main electrode thereof to the low potential power supply VSS, and at the gate electrode thereof to the node C.

Meanwhile, the thin film transistor N38 is connected at one of main electrodes thereof to the node C, at the other main electrode thereof to the low potential power supply VSS, and at the gate electrode thereof to the node B.

c. Driving Operation

Now, a relationship of the potential state of the set pulse and the reset pulse and the potential state of the nodes is described with reference to FIGS. 26A to 26H.

It is to be noted that the waveforms shown in FIGS. 26A to 26H correspond to the waveforms of FIGS. 21A to 21H, respectively.

Also in the case of the present mode example, the signal amplitude of the set pulse at the input terminal INs and the signal amplitude of the reset pulse at the input terminal INr are given with two values of the low potential power supply VSS and the high potential power supply VDD1.

First, at the timing at which the set pulse rises to the H level, the potential at the node D of the first inputting stage rises to the H level. Consequently, the thin film transistor N33 is placed into an on state and the potential at the node B rises as seen from FIG. 26E.

It is to be noted that, together with the rise of the potential at the node B, the gate potential of the thin film transistor N33, that is, the potential at the node D, rises by an amount corresponding to a charge amount accumulated in the bootstrap complementary capacitor Cb32 as seen from FIG. 26C. When the potential Vd after the rise satisfies Vd−VDD1>Vth(N33), upon turning on operation of the thin film transistor N33, the potential at the node B becomes the high potential power supply VDD1 as seen from FIG. 26E.

After the potential at the node B rises to the high potential power supply VDD1 as described above, also the potential at the node A rises to the H level and the thin film transistor N31 is placed into an on state. Consequently, the potential at the output terminal OUT rises as seen in FIG. 26H.

It is to be noted that, together with the rise of the potential at the output terminal OUT, the gate potential of the thin film transistor N31, that is, the potential at the node A, rises by an amount corresponding to a charge amount accumulated in the bootstrap complementary capacitor Cb31 as seen from FIG. 26F. When the potential Va after the rise satisfies Va−VDD1>Vth(N31), upon turning on operation of the thin film transistor N31, the potential at the output terminal OUT becomes the high potential power supply VDD1 as seen from FIG. 26H.

Incidentally, within a period within which the set pulse has the H level, also the thin film transistor N36 is in an on state. Consequently, the gate potential of the thin film transistor N32 which composes the output stage, that is, the potential at the node C, is controlled to the low potential power supply VSS as seen in FIG. 26G.

Soon, the set pulse falls from the H level to the L level. Upon this variation of the potential, the potential variation of the set pulse jumps into the node B through the capacitive coupling. As seen from FIG. 26E, the potential at the node B falls from the high potential power supply VDD1 to Vb1 while keeping the H level.

At this time, when the potential Vb1 at the node B satisfies Vb1−VSS>Vth(N38), the thin film transistor N38 exhibits an on state and the low potential power supply VSS can be applied to the node C. This signifies that the node C is not influenced by jumping in of the set pulse, that is, the off operating point of the thin film transistor N32 is not displaced.

This potential state is kept while the potential at the node B remains the potential Vb1. In other words, the node C is kept at the low potential power supply VSS until the reset pulse changes over to the H level. As a result, leak current of the thin film transistor N32 can be minimized.

It is to be noted that the potential Vb1 of the node B satisfies VDD1−Vb1<Vth(N41). This is a condition necessary to cause the thin film transistor N41 to operate into an off state to place the node A into a floating state to keep the potential at the node A to the potential Va.

After the reset pulse changes over from the L level to the H level soon as seen in FIG. 26B, now the thin film transistor N35 is placed into an on state and the potential at the node C rises as seen in FIG. 26G. It is to be noted that, together with the rise of the potential at the node C, the gate potential of the thin film transistor N35, that is, the potential at the node E, rises by an amount corresponding to a charge amount accumulated in the bootstrap complementary capacitor Cb33 as seen in FIG. 26D. The potential after the rise is Ve. When the potential Ve satisfies Ve−VDD1>Vth(N35), the potential at the node C upon turning on operation of the thin film transistor N35 becomes the high potential power supply VDD1 as seen in FIG. 26D.

After the potential at the node C rises to the high potential power supply VDD1 as described above, the thin film transistor N32 is placed into an on state and the potential at the output terminal OUT falls to the low potential power supply VSS as seen in FIG. 26H.

Incidentally, within the period within which the reset pulse has the H level, also the thin film transistor N34 is in an on state. Therefore, the potential at the node B is controlled to the low potential power supply VSS as seen in FIG. 26E. Together with this, also the gate potential of the thin film transistor N31 which composes the outputting stage 51, that is, the potential at the node A, falls to the low potential power supply VSS.

Soon, the reset pulse falls from the H level to the L level. Upon this variation of the potential, the potential variation of the reset pulse jumps into the node C through the capacitive coupling. As seen from FIG. 26G, the potential at the node C falls from the high potential power supply VDD1 to Vc2 while keeping the H level.

At this time, when the potential Vc2 at the node C satisfies Vc2−VSS>Vth(N32), the on state of the thin film transistor N32 continues and the potential at the output terminal OUT is kept at the low potential power supply VSS as seen in FIG. 26H.

Further, when the potential Vc2 at the node C satisfies Vc2−VSS>Vth(N37), the thin film transistor N37 is placed into an on state and the application of the low potential power supply VSS to the node B is continued.

This signifies that the node C is not influenced by jumping in of the set pulse, that is, the off operating point of the thin film transistor N31 is not displaced.

This potential state is kept while the potential at the node C remains the potential Vc2. In other words, the potential at the node B is kept at the low potential power supply VSS until the set pulse changes over to the H level subsequently. As a result, the source current of the thin film transistor N31 can be minimized.

d. Effect

As described above, the buffer circuit 45 having the circuit configuration according to the present mode example can achieve an effect that it is tough against jumping in of a pulse from neighboring wiring lines and also the amount of leak current is little in addition to effects similar to those of the mode example 1.

B-3. Example 3 of the Mode

Here, the buffer circuit 45 according to a modification to the example 2 of the mode is described.

a. Circuit Configuration

Figure 27:
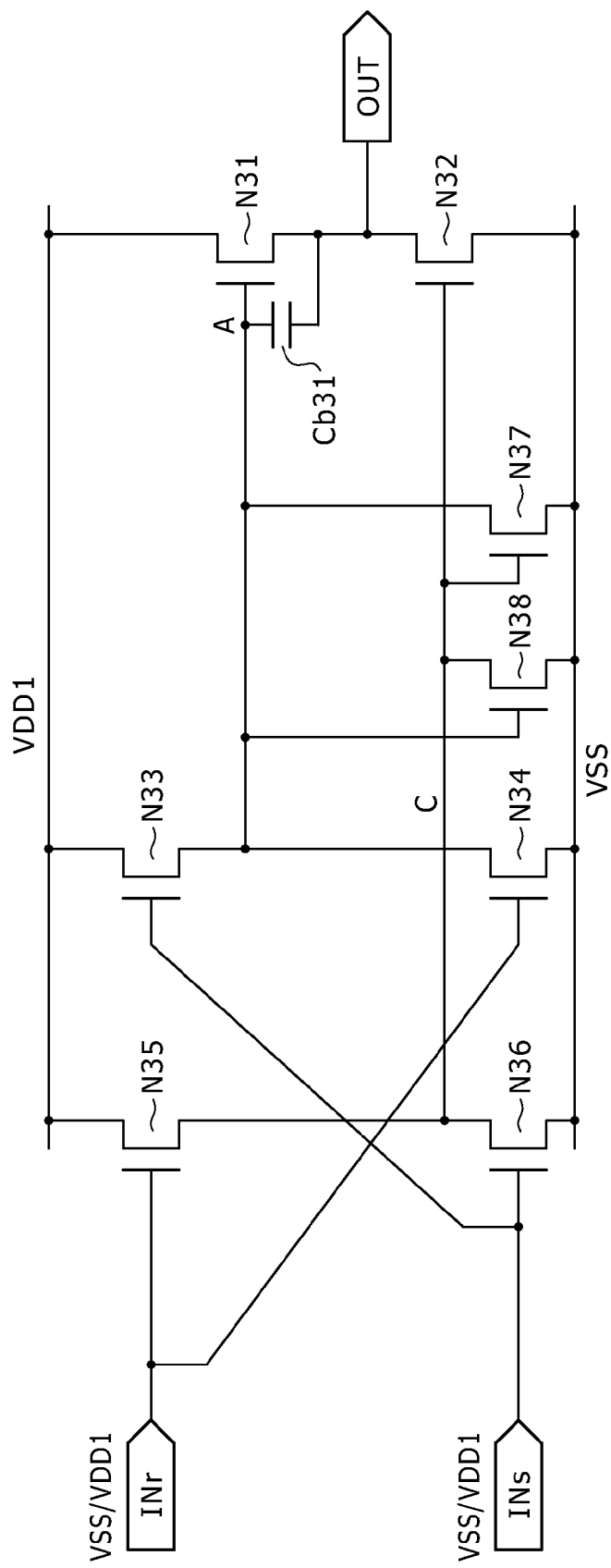
FIG. 27 is a circuit diagram showing a further example of a mode of the buffer circuit shown in FIG. 18.

FIG. 27 shows a third mode example of the buffer circuit 45.

The buffer circuit 45 according to the present mode example has a circuit configuration same as the circuit configuration of the mode example 2 except that it omits the thin film transistors N41, N42 and N43. This signifies that the buffer circuit 45 does not adopt the bootstrap operation of the first and second input stages.

b. Driving Operation

Now, a relationship between the potential state of the set pulse and the reset pulse and the potential state of the nodes is described with reference to FIGS. 28A to 28E.

Figure 28:
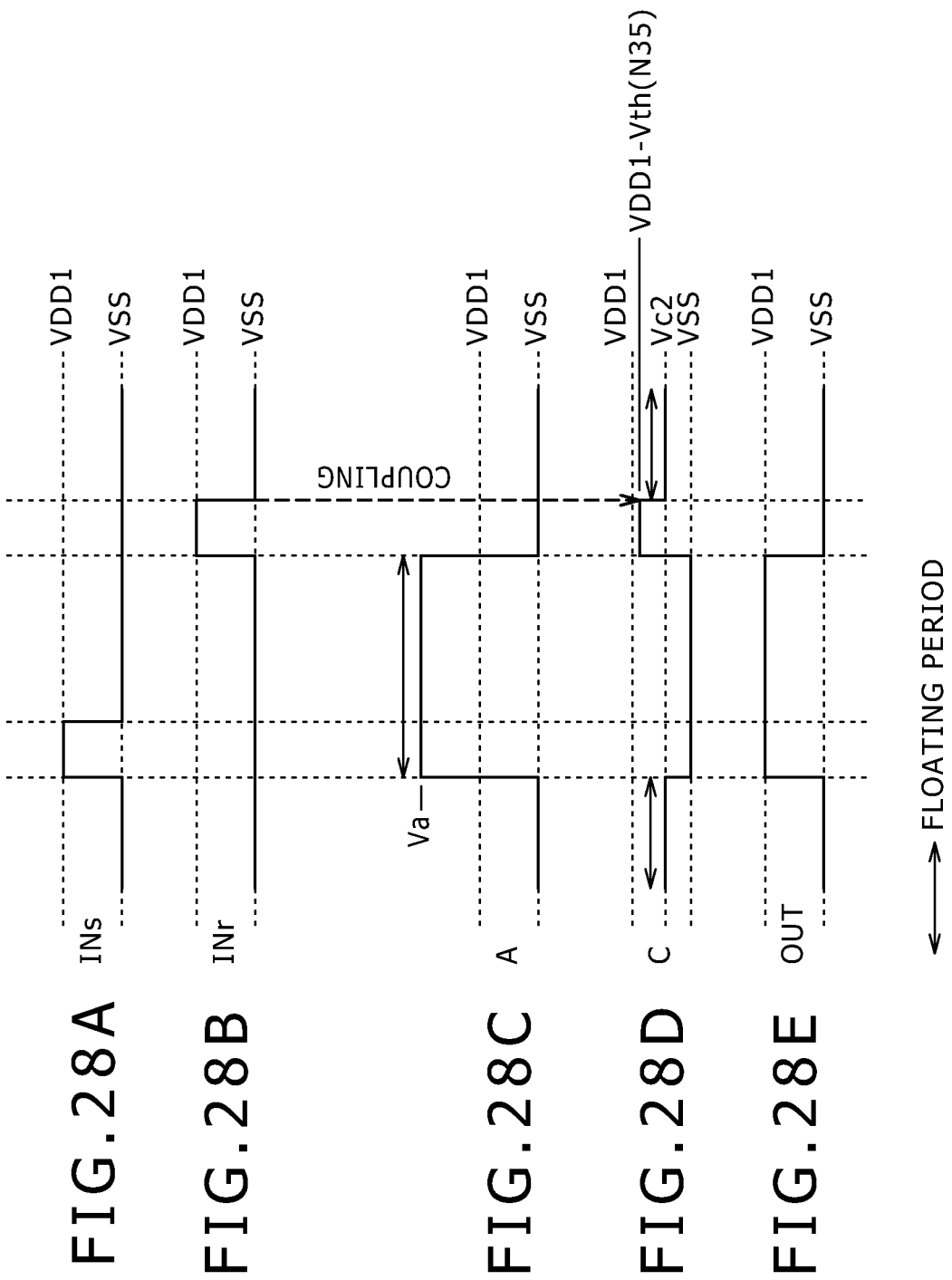
FIGS. 28A to 28E are waveform diagrams illustrating driving waveforms of the buffer circuit shown in FIG. 27.

FIG. 28A illustrates a potential state of the set pulse at the input terminal INs. FIG. 28B illustrates a potential state of the reset pulse at the input terminal INr.

FIG. 28C illustrates a potential state of the gate electrode wiring line of the thin film transistor N31 at the node A.

FIG. 28D illustrates a potential state of the gate electrode wiring line of the thin film transistor N32 at the node C. FIG. 28E illustrates a state of the potential appearing at the output terminal OUT of the outputting stage.

Also in the case of the present mode example, the signal amplitudes of the set pulse at the input terminal INs and the reset pulse at the input terminal INr are given with two values of the low potential power supply VSS and the high potential power supply VDD1.

In the case of the buffer circuit 45 according to the present mode example, the thin film transistors N33 and N36 are placed into an on state at a timing at which the set pulse rises to the H level. As a result, the potential at the node A rises as seen in FIG. 28C and the potential at the node C falls to the low potential power supply VSS as seen in FIG. 28D.

As the potential at the node A rises, the bootstrap complementary capacitor Cb31 is charged, and at a point of time at which the charged voltage of the bootstrap complementary capacitor Cb31 exceeds its threshold voltage Vth(N31), the thin film transistor N31 is placed into an on state.

As a result, the potential at the output terminal OUT begins to rise. Further, by a bootstrap operation by the potential rise at the output terminal OUT, the potential at the node A rises to the potential Va as seen in FIG. 28C. When the potential Va after the rise satisfies Va−VDD1>Vth(N31), the potential at the output terminal OUT becomes the high potential power supply VDD1 as seen in FIG. 28E.

Soon, the set pulse falls from the H level to the L level. Upon this potential variation, the potential variation of the set pulse tends to jump into the node A by the capacitive coupling. However, the potential at the node A is kept at the potential Va which is equal to a result of addition of the voltage across the bootstrap complementary capacitor Cb31 to the potential at the output terminal OUT, that is, to the high potential power supply VDD1 and is little influenced by such jumping in. Accordingly, the potential at the node A remains the potential at the immediately preceding point of time as seen in FIG. 28C.

On the other hand, the node C is controlled to the low potential power supply VSS through a turning on operation of the thin film transistor N38. As a result, the node C is not influenced by jumping in of the set pulse.

This potential state is kept until the reset pulse changes over from the L level to the H level. As a result, the off operating point of the thin film transistor N32 does not fluctuate, and the leak current is minimized.

When the reset pulse changes over to the H level soon as seen in FIG. 28B, now the thin film transistors N34 and N35 are placed into an on state. Together with this, the potential at the node A falls to the low potential power supply VSS as seen in FIG. 28C and the potential at the node C rises as seen in FIG. 28D. However, the potential at the node C is given by a potential lower by the threshold voltage Vth(N35) of the thin film transistor N35 than the high potential power supply VDD1. In other words, the potential at the node C rises to VDD1−Vth(N35). Naturally, VDD1−Vth(N35)−VSS>Vth(N32) is satisfied.

When the node C rises to the H level, the thin film transistor N32 is placed into an on state and the potential at the output terminal OUT falls to the low potential power supply VSS as seen in FIG. 28E.

Incidentally, when the reset pulse has the H level, since also the thin film transistor N34 exhibits an on state, the potential at the node A is controlled to the low potential power supply VSS as seen from FIG. 28C.

Soon, the reset pulse falls from the H level to the L level. Upon this potential variation, the potential variation of the reset pulse jumps into the node C by the capacitive coupling of the thin film transistor N35. The potential at the node C falls to the potential Vc2 while keeping the H level as seen in FIG. 28D.

However, the potential Vc2 at the node C satisfies Vc2−VSS>Vth(N32). As far as this condition is satisfied, the on state of the thin film transistor N32 continues and the application of the low potential power supply VSS to the output terminal OUT continues.

Further, the potential Vc2 at the node C simultaneously satisfies Vc2−VSS>Vth(N37). As far as this condition is satisfied, the thin film transistor N37 exhibits an on state and fixes the potential at the node A to the low potential power supply VSS.

Accordingly, a potential variation of the reset pulse does not jump into the node A through the thin film transistor N34, and the off operating point of the thin film transistor N31 is not displaced.

This potential state is maintained while the potential at the node C remains the potential Vc2. In other words, the potential at the node A is kept at the low potential power supply VSS until the set pulse subsequently changes over to the H level. As a result, the leak current of the thin film transistor N31 can be minimized.

c. Effect

As described above, with the buffer circuit 45 having the circuit configuration according to the present mode example, similar effects to those of the mode example 2 described hereinabove can be achieved with a reduced number of elements.

B-4. Example 4 of the Mode

Here, the buffer circuit 45 according to another modification to the mode example 2 is described.

a. Circuit Configuration

Figure 29:
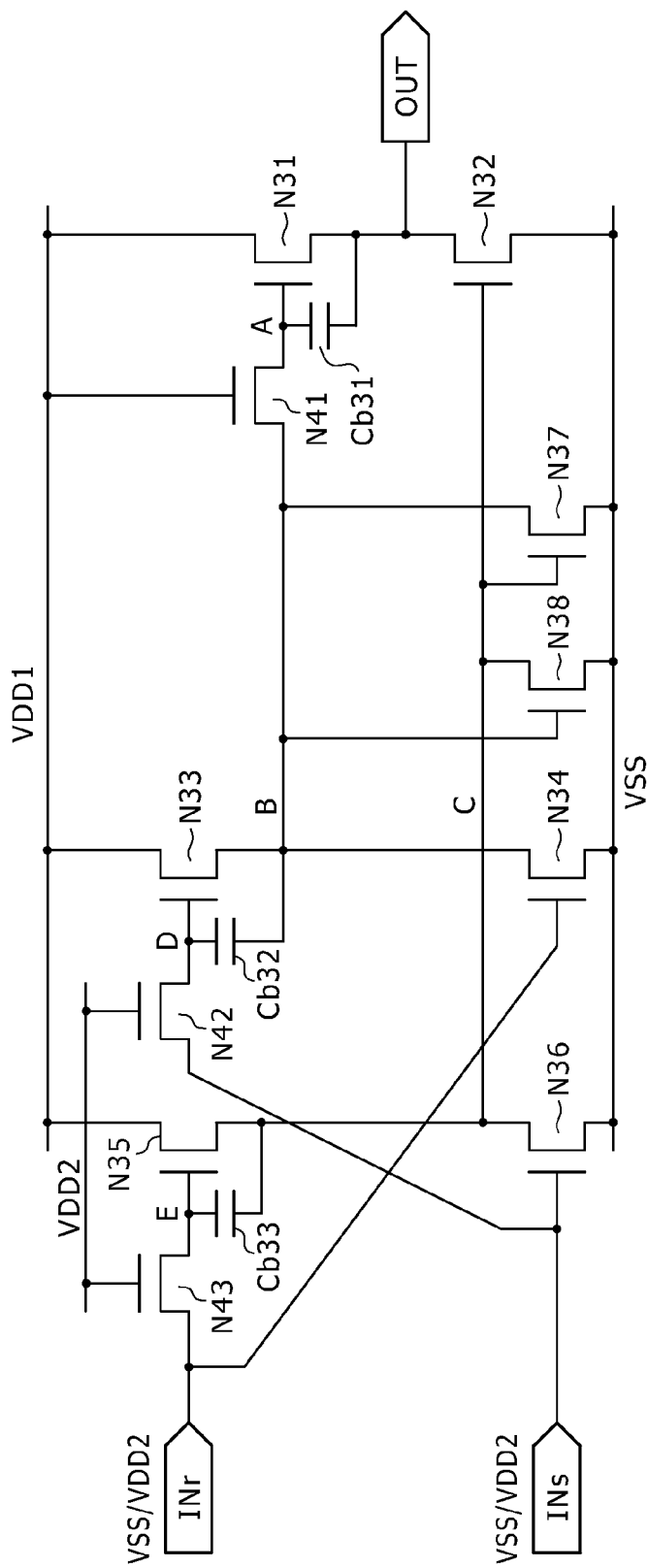
FIG. 29 is a circuit diagram showing a still further example of a mode of the buffer circuit shown in FIG. 18.

FIG. 29 shows a fourth mode example of the buffer circuit 45.

The buffer circuit 45 according to the present mode example corresponds to a circuit configuration which implements level shifting at the first and second input stages of the circuit configuration according to the mode example 2.

Therefore, the buffer circuit 45 adopts a structure that the thin film transistors N42 and N43 which compose the first and second input stages are connected at the gate electrode thereof to a second high potential power supply VDD2 (<VDD1). Consequently, the amplitude of the set pulse and the reset pulse can be reduced and further reduction of the power consumption of a preceding stage circuit can be implements.

b. Driving Operation

Now, a relationship of the potential state of the set pulse and the reset pulse and the potential state of the nodes is described with reference to FIGS. 30A to 30H. It is to be noted that the waveforms shown in FIGS. 30A to 30H correspond to the waveforms of FIGS. 26A to 26H, respectively.

Also in the case of the present mode example, the signal amplitudes of the set pulse at the input terminal INs and the reset pulse at the input terminal INr are given with two values of the low potential power supply VSS and the second high potential power supply VDD2 (<VDD1) as seen in FIGS. 30A and 30B.

First, the thin film transistors N33 and N36 are placed into an on state at a timing at which the set pulse rises to the H level. It is to be noted that the thin film transistor N42 is placed into a diode connection by an input of the set pulse of the H level and raises the potential at the node D. Consequently, the thin film transistor N33 is placed into an on state, and the potential at the node B rises as seen in FIG. 30E.

Together with the rise of the potential at the node B, the gate potential of the thin film transistor N33, that is, the potential at the node D, rises by an amount corresponding to a charge amount accumulated in the bootstrap complementary capacitor Cb32 as seen from FIG. 30C. When the potential Vd after the rise satisfies Vd−VDD1>Vth(N33), upon turning on operation of the thin film transistor N33, the potential at the node B becomes the high potential power supply VDD1 as seen from FIG. 30E. In other words, level shifting of the set pulse is carried out.

After the potential at the node B rises to the high potential power supply VDD1 as described above, the thin film transistor N31 is placed into an on state and the potential at the output terminal OUT rises as seen in FIG. 30H.

It is to be noted that, together with the rise of the potential at the output terminal OUT, the gate potential of the thin film transistor N31, that is, the potential at the node A, rises by an amount corresponding to a charge amount accumulated in the bootstrap complementary capacitor Cb31 as seen from FIG. 30F. When the potential Va after the rise satisfies Va−VDD1>Vth(N31), upon turning on operation of the thin film transistor N31, the potential at the output terminal OUT becomes the high potential power supply VDD1 as seen from FIG. 30H.

At this time, the node C is controlled to the low potential power supply VSS by the thin film transistor N36 which is placed into an on state as seen in FIG. 30G.

Soon, the set pulse falls from the H level to the L level. Upon this variation of the potential, the potential variation of the set pulse jumps into the node B through the capacitive coupling. As seen from FIG. 30E, the potential at the node B falls from the high potential power supply VDD1 to Vb1 while keeping the H level.

At this time, when the potential Vb1 at the node B satisfies Vb1−VSS>Vth(N38), the thin film transistor N38 exhibits an on state and the low potential power supply VSS is applied to the node C. This signifies that the node C is not influenced by jumping in of the set pulse, that is, the off operating point of the thin film transistor N32 is not displaced.

This potential state is kept while the potential at the node B remains the potential Vb1. In other words, the node C is kept at the low potential power supply VSS until the reset pulse changes over to the H level. As a result, leak current of the thin film transistor N32 can be minimized.

It is to be noted that the potential Vb1 of the node B satisfies VDD1−Vb1<Vth(N41). This is a condition necessary to cause the thin film transistor N41 to operate into an off state to keep the potential at the node A to the potential Va.

When the reset pulse changes over from the L level to the H level soon as seen in FIG. 30B, now the thin film transistors N34 and N35 are placed into an on state. It is to be noted that the thin film transistor N43 is placed into a diode connection by an input of the reset pulse of the H level, the potential at the node E rises. Consequently, the thin film transistor N35 are placed into an on state, and the potential at the node C rises as seen in FIG. 30G.

Together with the rise of the potential at the node C, the gate potential of the thin film transistor N35, that is, the potential at the node E, rises by an amount corresponding to a charge amount accumulated in the bootstrap complementary capacitor Cb33 as seen from FIG. 30D. When the potential Ve after the rise satisfies Ve−VDD1>Vth(N35), upon turning on operation of the thin film transistor N35, the potential at the node C becomes the high potential power supply VDD1 as seen from FIG. 30G. In other words, level shifting of the reset pulse is executed.

After the potential at the node C rises to the high potential power supply VDD1 as described above, the thin film transistor N32 is placed into an on state and the potential at the output terminal OUT falls to the low potential power supply VSS as seen in FIG. 30H.

Incidentally, within the period within which the reset pulse has the H level, also the thin film transistor N34 is in an on state. Therefore, the potential at the node B is controlled to the low potential power supply VSS as seen in FIG. 30E. Together with this, also the gate potential of the thin film transistor N31 which composes the outputting stage 51, that is, the potential at the node A, falls to the low potential power supply VSS as seen in FIG. 30F.

Soon, the reset pulse falls from the H level to the L level. Upon this variation of the potential, the potential variation of the reset pulse jumps into the node C through the capacitive coupling. As seen from FIG. 30G, the potential at the node C falls from the high potential power supply VDD1 to Vc2 while keeping the H level.

At this time, when the potential Vc2 at the node C satisfies Vc2−VSS>Vth(N32), the on state of the thin film transistor N32 continues and the potential at the output terminal OUT is kept at the low potential power supply VSS as seen in FIG. 30H.

Further, since the potential Vc2 at the node C satisfies Vc2−VSS>Vth(N37), the thin film transistor N37 is placed into an on state and the application of the low potential power supply VSS to the node B is continued.

This signifies that the node B is not influenced by jumping in of the set pulse, that is, the off operating point of the thin film transistor N31 is not displaced.

This potential state is kept while the potential at the node C remains the potential Vc2. In other words, the potential at the node B is kept at the low potential power supply VSS until the set pulse changes over to the H level. As a result, the source current of the thin film transistor N31 can be minimized.

c. Effect

As described above, also the buffer circuit 45 having the circuit configuration according to the present mode example is tough against jumping in of a pulse from neighboring wiring lines and exhibits low leak current (similarly to those of mode example 2).

Further, with the buffer circuit 45 of the circuit configuration according to the present mode example, the signal amplitude of the set pulse and the reset pulse can be reduced with respect to the signal amplitude of the output pulse. Consequently, the power consumption at a circuit such as, for example, a shift register at the preceding stage can be reduced from that of the other examples of the form.

B-5. Example 5 of the Mode

Here, the buffer circuit 45 according to a further modification to the mode example 2 is described.

a. Circuit Configuration

Figure 31:
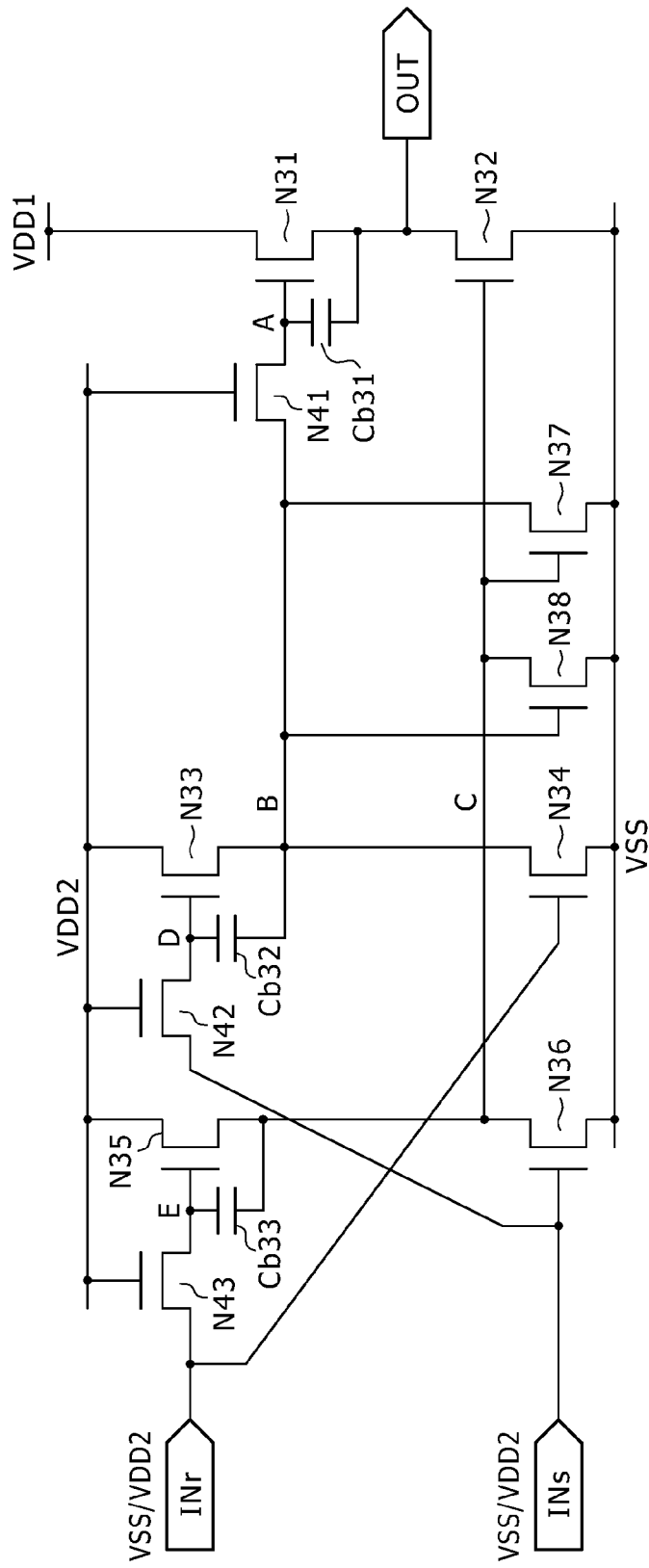
FIG. 31 is a circuit diagram showing a yet further example of a mode of the buffer circuit shown in FIG. 18.

FIG. 31 shows a fifth mode example of the buffer circuit 45.

The buffer circuit 45 according to the present mode example corresponds to a circuit configuration which implements level shifting at the outputting stage of the circuit configuration according to the mode example 2.

Therefore, the buffer circuit 45 adopts a structure wherein the first high potential power supply VDD1 is applied only to the thin film transistors N31 and N32 positioned at the last position of the outputting stage while the second high potential power supply VDD2 (<VDD1) is applied to the thin film transistors at the preceding positions to the thin film transistors N31 and N32. By the structure, further reduction in power consumption in the buffer circuit 45 can be implemented in addition to reduction in amplitude of the set pulse and the reset pulse.

b. Driving Operation

Now, a relationship of the potential state of the set pulse and the reset pulse and the potential state of the nodes is described with reference to FIGS. 32A to 32H. It is to be noted that the waveforms shown in FIGS. 32A to 32H correspond to the waveforms of FIGS. 26A to 26H, respectively.

Figure 32:
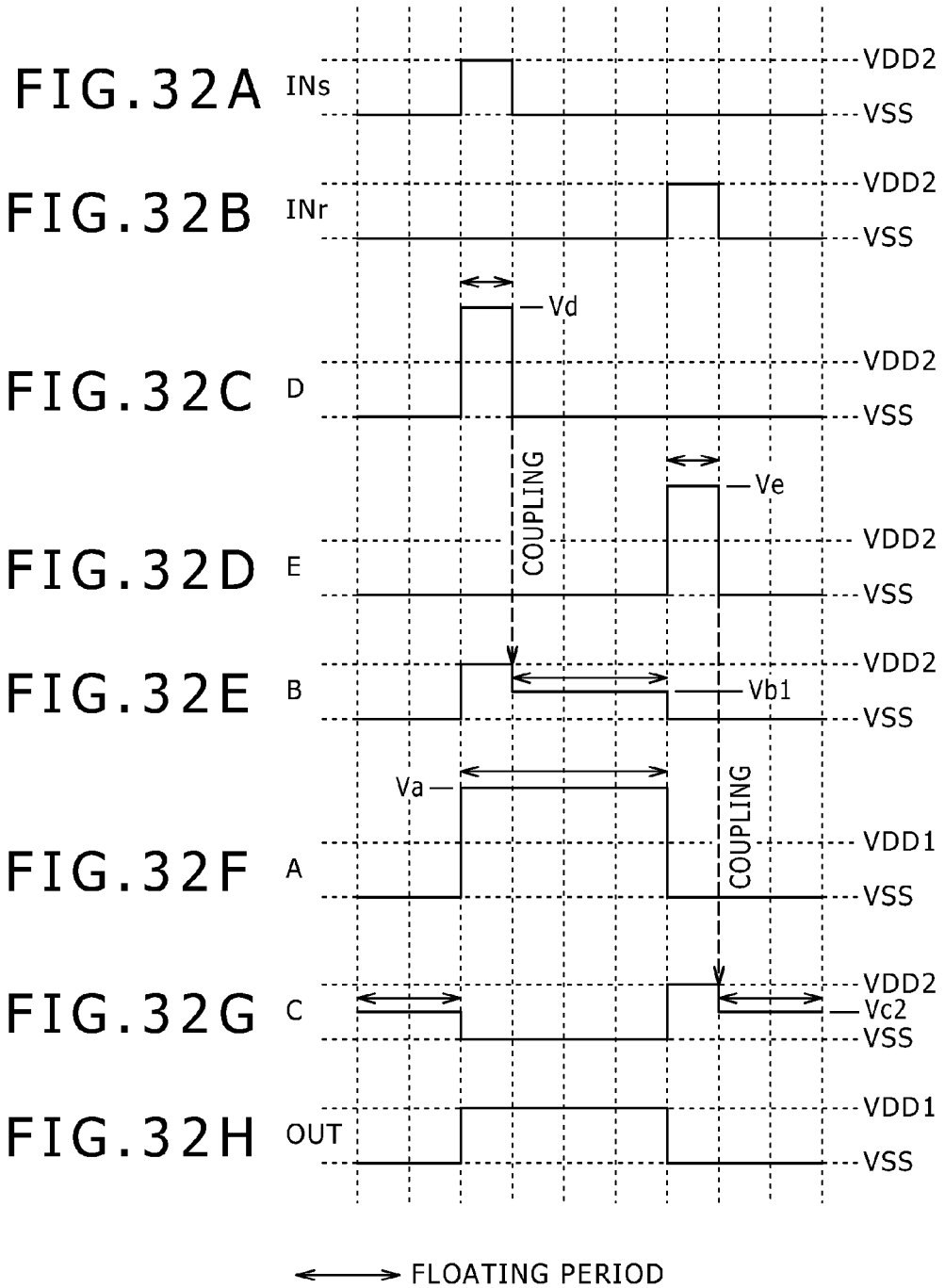
FIGS. 32A to 32H are waveform diagrams illustrating driving waveforms of the buffer circuit shown in FIG. 31.

It is to be noted that the signal amplitudes of the set pulse at the input terminal INs and the reset pulse at the input terminal INr are given with two values of the low potential power supply VSS and the second high potential power supply VDD2 as seen in FIGS. 32A and 32B.

First, the thin film transistors N33 and N36 are placed into an on state at a timing at which the set pulse rises to the H level. It is to be noted that the thin film transistor N42 is placed into a diode connection by an input of the set pulse of the H level and raises the potential at the node D. Consequently, the thin film transistor N33 is placed into an on state, and the potential at the node B rises as seen in FIG. 32E.

Together with the rise of the potential at the node B, the gate potential of the thin film transistor N33, that is, the potential at the node D, rises by an amount corresponding to a charge amount accumulated in the bootstrap complementary capacitor Cb32 as seen from FIG. 32C. When the potential Vd after the rise satisfies Vd−VDD2>Vth(N33), upon turning on operation of the thin film transistor N33, the potential at the node B becomes the second high potential power supply VDD2 as seen from FIG. 32E.

After the potential at the node B rises to the second high potential power supply VDD2 as described above, also the node A rises to the H level to place the thin film transistor N31 into an on state and the potential at the output terminal OUT rises as seen in FIG. 32H.

It is to be noted that, together with the rise of the potential at the output terminal OUT, the gate potential of the thin film transistor N31, that is, the potential at the node A, rises by an amount corresponding to a charge amount accumulated in the bootstrap complementary capacitor Cb31 as seen from FIG. 32F. When the potential Va after the rise satisfies Va−VDD1>Vth(N31), upon turning on operation of the thin film transistor N31, the potential at the output terminal OUT becomes the high potential power supply VDD1 as seen from FIG. 32H. In other words, the pulse level is shifted.

When the set pulse has the H level, the node C is controlled to the low potential power supply VSS by the thin film transistor N36 which is placed into an on state as seen in FIG. 32G.

Soon, the set pulse falls from the H level to the L level. Upon this variation of the potential, the potential variation of the set pulse jumps into the node B through the capacitive coupling. As seen from FIG. 32E, the potential at the node B falls from the second high potential power supply VDD2 to Vb1 while keeping the H level.

At this time, when the potential Vb1 at the node B satisfies Vb1−VSS>Vth(N38), the thin film transistor N38 exhibits an on state and the low potential power supply VSS continues to be applied to the node C. This signifies that the node C is not influenced by jumping in of the set pulse, that is, the off operating point of the thin film transistor N32 is not displaced.

This potential state is kept while the potential at the node B remains the potential Vb1. In other words, the node C is kept at the low potential power supply VSS until the reset pulse changes over to the H level. As a result, leak current of the thin film transistor N32 can be minimized.

It is to be noted that the potential Vb1 of the node B satisfies VDD2−Vb1<Vth(N41). This is a condition necessary to cause the thin film transistor N41 to operate into an off state to keep the potential at the node A to the potential Va.

When the reset pulse changes over from the L level to the H level soon as seen in FIG. 32B, now the thin film transistors N34 and N35 are placed into an on state. It is to be noted that the thin film transistor N43 is placed into a diode connection by an input of the reset pulse of the H level, the potential at the node E rises. Consequently, the thin film transistor N35 are placed into an on state, and the potential at the node C rises as seen in FIG. 32G.

Together with the rise of the potential at the node C, the gate potential of the thin film transistor N35, that is, the potential at the node E, rises by an amount corresponding to a charge amount accumulated in the bootstrap complementary capacitor Cb33 as seen from FIG. 32D. When the potential Ve after the rise satisfies Ve−VDD2>Vth(N35), upon turning on operation of the thin film transistor N35, the potential at the node C becomes the high potential power supply VDD2 as seen from FIG. 32G.

After the potential at the node C rises to the second high potential power supply VDD2 as described above, the thin film transistor N32 is placed into an on state and the potential at the output terminal OUT falls to the low potential power supply VSS as seen in FIG. 32H.

Incidentally, within the period within which the reset pulse has the H level, also the thin film transistor N34 is in an on state. Therefore, the potential at the node B is controlled to the low potential power supply VSS as seen in FIG. 32E. Together with this, also the gate potential of the thin film transistor N31 which composes the outputting stage 51, that is, the potential at the node A, falls to the low potential power supply VSS as seen in FIG. 32F.

Soon, the reset pulse falls from the H level to the L level. Upon this variation of the potential, the potential variation of the reset pulse jumps into the node C through the capacitive coupling. As seen from FIG. 32G, the potential at the node C falls from the high potential power supply VDD2 to Vc2 while keeping the H level.

At this time, when the potential Vc2 at the node C satisfies Vc2−VSS>Vth(N32), the on state of the thin film transistor N32 continues and the potential at the output terminal OUT is kept at the low potential power supply VSS as seen in FIG. 32H.

Further, since the potential Vc2 at the node C satisfies Vc2−VSS>Vth(N37), the thin film transistor N37 is placed into an on state and the application of the low potential power supply VSS to the node B is continued.

This signifies that the node B is not influenced by jumping in of the set pulse, that is, the off operating point of the thin film transistor N31 is not displaced.

This potential state is kept while the potential at the node C remains the potential Vc2. In other words, the potential at the node B is kept at the low potential power supply VSS until the set pulse changes over to the H level. As a result, the source current of the thin film transistor N31 can be minimized.

c. Effect

As described above, in the buffer circuit 45 of the circuit configuration according to the present mode example, not only the signal amplitude of the set pulse and the reset pulse can be reduced with respect to the signal amplitude of the output pulse, but also reduction in amplitude in the inside of the buffer circuit other than at the last outputting stage can be implemented. Therefore, the power to be consumed not only by the preceding stage circuit such as, for example, a shift register but also by the buffer circuit 45 can be reduced in comparison with the other mode examples described above.

B-6. Example 6 of the Mode

Here, the buffer circuit 45 according to a still further modification to the example 2 of the mode is described.

a. Circuit Configuration

Figure 33:
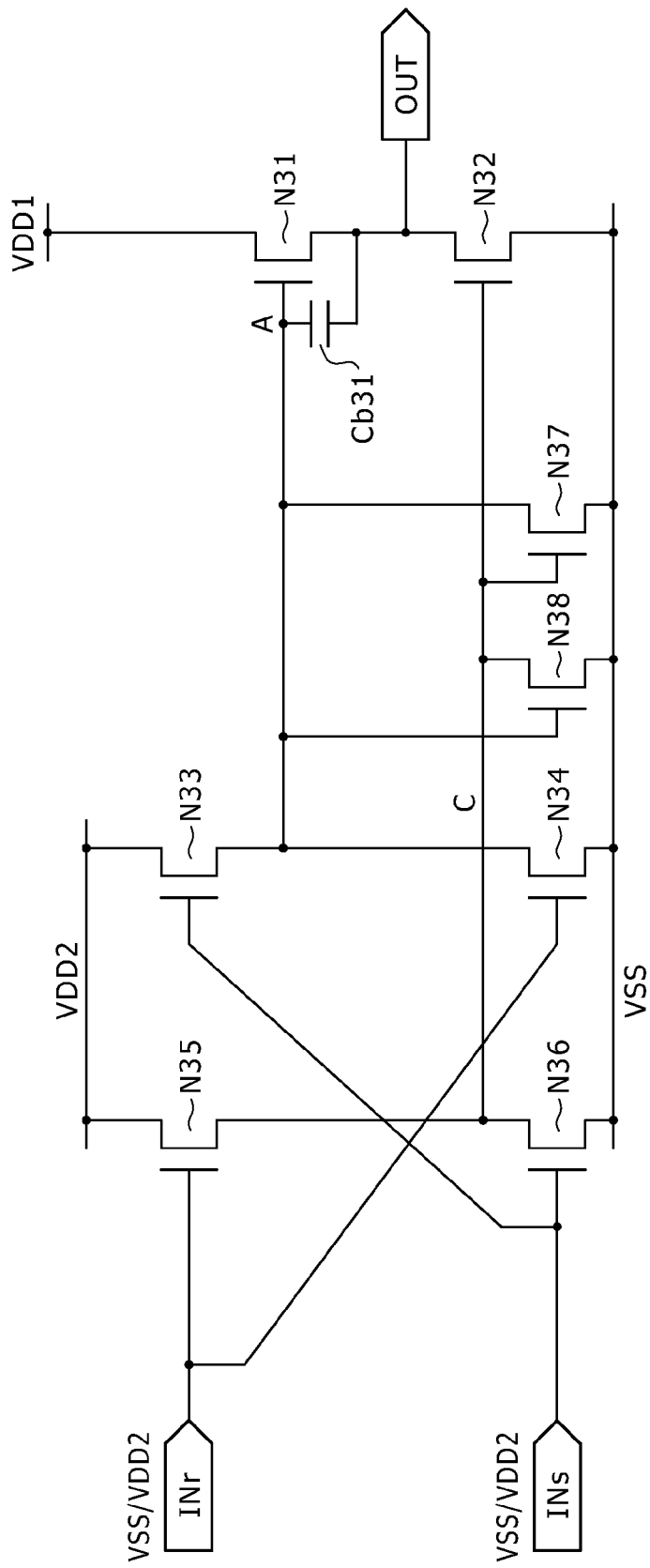
FIG. 33 is a circuit diagram showing a yet further example of a mode of the buffer circuit shown in FIG. 18.

FIG. 33 shows a sixth mode example of the buffer circuit 45.

The buffer circuit 45 according to the present mode example has a circuit configuration same as the circuit configuration of the mode example 5 except that it omits the thin film transistors N41, N42 and N43. This signifies that the buffer circuit 45 does not adopt the bootstrap operation of the first and second input stages.

b. Driving Operation

Now, a relationship between the potential state of the set pulse and the reset pulse and the potential state of the nodes is described with reference to FIGS. 34A to 34E.

FIG. 34A illustrates a potential state of the set pulse at the input terminal INs. FIG. 34B illustrates a potential state of the reset pulse at the input terminal INr.

FIG. 34C illustrates a potential state of the gate electrode wiring line of the thin film transistor N31 at the node A.

FIG. 34D illustrates a potential state of the gate electrode wiring line of the thin film transistor N32 at the node C. FIG. 34E illustrates a state of the potential appearing at the output terminal OUT of the outputting stage.

Also in the case of the present mode example, the signal amplitudes of the set pulse at the input terminal INs and the reset pulse at the input terminal INr are given with two values of the low potential power supply VSS and the high potential power supply VDD2 (<VDD1) as seen in FIGS. 34A and 34B.

In the case of the buffer circuit 45 according to the present mode example, the thin film transistors N33 and N36 are placed into an on state at a timing at which the set pulse rises to the H level. As a result, the potential at the node A rises as seen in FIG. 34C and the potential at the node C falls to the low potential power supply VSS as seen in FIG. 34D.

As the potential at the node A rises, the bootstrap complementary capacitor Cb31 is charged, and at a point of time at which the charged voltage of the bootstrap complementary capacitor Cb31 exceeds its threshold voltage Vth(N31), the thin film transistor N31 is placed into an on state.

As a result, the potential at the output terminal OUT begins to rise. Further, by a bootstrap operation by the potential rise at the output terminal OUT, the potential at the node A rises to the potential Va as seen in FIG. 34C. When the potential Va after the rise satisfies Va−VDD1>Vth(N31), the potential at the output terminal OUT becomes the high potential power supply VDD1 as seen in FIG. 34E. In other words, the set pulse is level shifted.

Soon, the set pulse falls from the H level to the L level. Upon this potential variation, the potential variation of the set pulse tends to jump into the node A by the capacitive coupling. However, the potential at the node A is kept at the potential Va which is equal to a result of addition of the voltage across the bootstrap complementary capacitor Cb31 to the potential at the output terminal OUT, that is, to the high potential power supply VDD1 and is little influenced by such jumping in. Accordingly, the potential at the node A remains the potential at the immediately preceding point of time as seen in FIG. 34C, that is, the potential Va.

Incidentally, the node C is controlled to the low potential power supply VSS through the thin film transistor N38 which is in an on state. As a result, the node C is not influenced by jumping in of the set pulse.

This potential state is kept until the reset pulse changes over from the L level to the H level. As a result, the off operating point of the thin film transistor N32 does not fluctuate, and the leak current is minimized.

When the reset pulse changes over to the H level soon as seen in FIG. 34B, now the thin film transistors N34 and N35 are placed into an on state. Together with this, the potential at the node A falls to the low potential power supply VSS as seen in FIG. 34C and the potential at the node C rises as seen in FIG. 34D. However, the potential at the node C is given by a potential lower by the threshold voltage Vth(N35) of the thin film transistor N35 than the second high potential power supply VDD2. In other words, the potential at the node C rises to VDD2−Vth(N35). Naturally, VDD2−Vth(N35)−VSS>Vth(N32) is satisfied.

When the node C rises to the H level, the thin film transistor N32 is placed into an on state and the potential at the output terminal OUT falls to the low potential power supply VSS as seen in FIG. 34E.

When the reset pulse has the H level, since also the thin film transistor N34 exhibits an on state, the potential at the node A is controlled to the low potential power supply VSS as seen from FIG. 34C.

Soon, the reset pulse falls from the H level to the L level. Upon this potential variation, the potential variation of the reset pulse jumps into the node C by the capacitive coupling of the thin film transistor N35. The potential at the node C falls to the potential Vc2 while keeping the H level as seen in FIG. 34D.

However, the potential Vc2 at the node C satisfies Vc2−VSS>Vth(N32). As far as this condition is satisfied, the on state of the thin film transistor N32 continues and the application of the low potential power supply VSS to the output terminal OUT continues.

Further, the potential Vc2 at the node C satisfies Vc2−VSS>Vth(N37). As far as this condition is satisfied, the thin film transistor N37 exhibits an on state and fixes the potential at the node A to the low potential power supply VSS.

Accordingly, a potential variation of the reset pulse does not jump into the node A through the thin film transistor N34, and the off operating point of the thin film transistor N31 is not displaced.

This potential state is maintained while the potential at the node C remains the potential Vc2. In other words, the potential at the node A is kept at the low potential power supply VSS until the set pulse subsequently changes over to the H level. As a result, the leak current of the thin film transistor N31 can be minimized.

c. Effect

As described above, with the buffer circuit 45 having the circuit configuration according to the present mode example, similar effects to those of the mode example 5 described hereinabove can be achieved with a reduced number of elements.

B-7. Example 7 of the Mode

Here, the buffer circuit 45 according to a yet further modification to the example 2 of the mode is described.

a. Circuit Configuration

Figure 35:
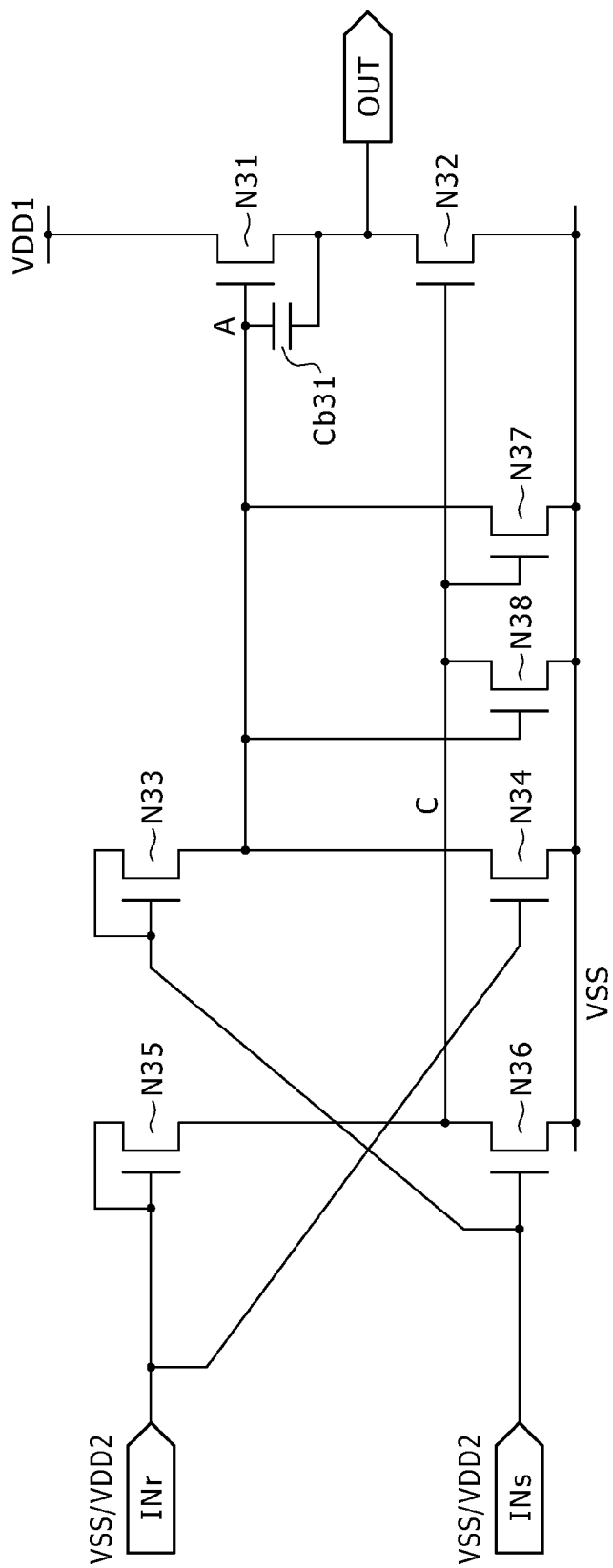
FIG. 35 is a circuit diagram showing a yet further example of a mode of the buffer circuit shown in FIG. 18.

FIG. 35 shows a seventh mode example of the buffer circuit 45.

The buffer circuit 45 according to the present mode example has a circuit configuration same as the circuit configuration described hereinabove in connection with the mode example 6 from which the wiring lines for supplying the second high potential power supply VDD2 are omitted. Therefore, the buffer circuit 45 has a circuit configuration wherein the thin film transistors N33 and N35 are connected in diode connection.

It is to be noted that, although, in the buffer circuit 45 shown in FIG. 35, the signal amplitude of the set pulse and the reset pulse is defined by the low potential power supply VSS and the second high potential power supply VDD2 since the buffer circuit 45 adopts the driving method wherein level shifting is executed at the outputting stage, where level shifting is not executed, the signal amplitude of the set pulse and the reset pulse may be defined by the low potential power supply VSS and the first high potential power supply VDD1.

b. Driving Operation

Now, a relationship of the potential state of the set pulse and the reset pulse and the potential state of the nodes is described with reference to FIGS. 36A to 36E. It is to be noted that the waveforms shown in FIGS. 36A to 36E correspond to the waveforms of FIGS. 34A to 34E, respectively.

Figure 36:
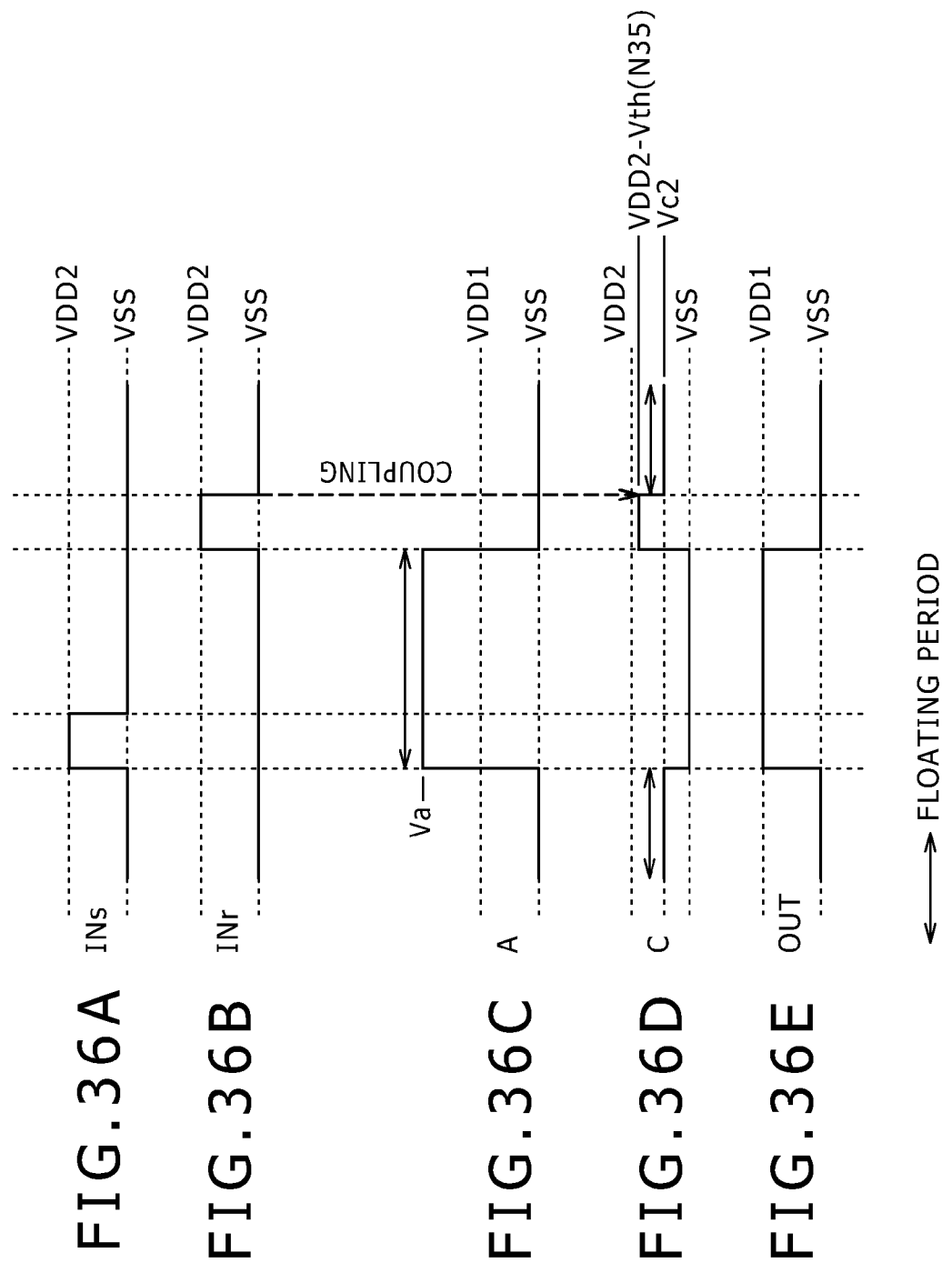
FIGS. 36A to 36E are waveform diagrams illustrating driving waveforms of the buffer circuit shown in FIG. 35.

Also in the case of the present mode example, the signal amplitudes of the set pulse at the input terminal INs and the reset pulse at the input terminal INr are given with two values of the low potential power supply VSS and the high potential power supply VDD2 (<VDD1) as seen in FIGS. 36A and 36B.

In the case of the buffer circuit 45 according to the present mode example, the thin film transistors N33 and N36 are placed into an on state at a timing at which the set pulse rises to the H level. Together with this, the potential at the node A rises as seen in FIG. 36C and the potential at the node C falls to the low potential power supply VSS as seen in FIG. 36D.

As the potential at the node A rises, the bootstrap complementary capacitor Cb31 is charged, and at a point of time at which the charged voltage of the bootstrap complementary capacitor Cb31 exceeds its threshold voltage Vth(N31), the thin film transistor N31 is placed into an on state.

As a result, the potential at the output terminal OUT begins to rise. Further, by a bootstrap operation by the potential rise at the output terminal OUT, the potential at the node A rises to the potential Va as seen in FIG. 36C. When the potential Va after the rise satisfies Va−VDD1>Vth(N31), the potential at the output terminal OUT becomes the high potential power supply VDD1 as seen in FIG. 36E. In other words, the set pulse is level shifted.

Soon, the set pulse falls from the H level to the L level. Upon this potential variation, the potential variation of the set pulse tends to jump into the node A by the capacitive coupling. However, the potential at the node A is kept at the potential Va which is equal to a result of addition of the voltage across the bootstrap complementary capacitor Cb31 to the potential at the output terminal OUT, that is, to the high potential power supply VDD1 and is little influenced by such jumping in. Accordingly, the potential at the node A remains the potential at the immediately preceding point of time as seen in FIG. 34C, that is, the potential Va.

Meanwhile, the node C is controlled to the low potential power supply VSS through the thin film transistor N38 which is in an on state. As a result, the node C is not influenced by jumping in of the set pulse.

This potential state is kept until the reset pulse changes over from the L level to the H level. As a result, the off operating point of the thin film transistor N32 does not fluctuate, and the leak current is minimized.

When the reset pulse changes over to the H level soon as seen in FIG. 36B, now the thin film transistors N34 and N35 are placed into an on state. Together with this, the potential at the node A falls to the low potential power supply VSS as seen in FIG. 36C and the potential at the node C rises as seen in FIG. 36D. However, the potential at the node C is given by a potential lower by the threshold voltage Vth(N35) of the thin film transistor N35 than the second high potential power supply VDD2. In other words, the potential at the node C rises to VDD2−Vth(N35). Naturally, VDD2−Vth(N35)−VSS>Vth(N32) is satisfied.

When the node C rises to the H level, the thin film transistor N32 is placed into an on state and the potential at the output terminal OUT falls to the low potential power supply VSS as seen in FIG. 36E.

Incidentally, when the reset pulse has the H level, since also the thin film transistor N34 exhibits an on state, the potential at the node A is controlled to the low potential power supply VSS as seen from FIG. 36C.

Soon, the reset pulse falls from the H level to the L level. Upon this potential variation, the potential variation of the reset pulse jumps into the node C by the capacitive coupling of the thin film transistor N35. The potential at the node C falls to the potential Vc2 while keeping the H level as seen in FIG. 36D.

However, the potential Vc2 at the node C satisfies Vc2−VSS>Vth(N32). As far as this condition is satisfied, the on state of the thin film transistor N32 continues and the application of the low potential power supply VSS to the output terminal OUT continues.

Further, the potential Vc2 at the node C need satisfy Vc2−VSS>Vth(N37). As far as this condition is satisfied, the thin film transistor N37 exhibits an on state and fixes the potential at the node A to the low potential power supply VSS.

Accordingly, a potential variation of the reset pulse does not jump into the node A through the thin film transistor N34, and the off operating point of the thin film transistor N31 is not displaced.

This potential state is maintained while the potential at the node C remains the potential Vc2. In other words, the potential at the node A is kept at the low potential power supply VSS until the set pulse subsequently changes over to the H level. As a result, the leak current of the thin film transistor N31 can be minimized.

c. Effect

As described above, with the buffer circuit 45 of the circuit configuration according to the present mode example, the wiring lines for the second high potential power supply can be reduced from the circuit layout of the mode example 6 described hereinabove. As a result, operation and effects similar to those of the mode example 6 can be implemented with a reduced layout area.

B-8. Example 8 of the Mode

Also here, the buffer circuit 45 according to an additional modification to the second mode example is described. In the mode examples described above, a set of a set pulse and a reset pulse are inputted to a buffer circuit. However, it is possible to form also a buffer circuit to which a plurality of sets of a set pulse and a reset pulse are inputted.

Here, a buffer circuit to which two sets of a set pulse and a reset pulse are inputted is disclosed.

Figure 37:
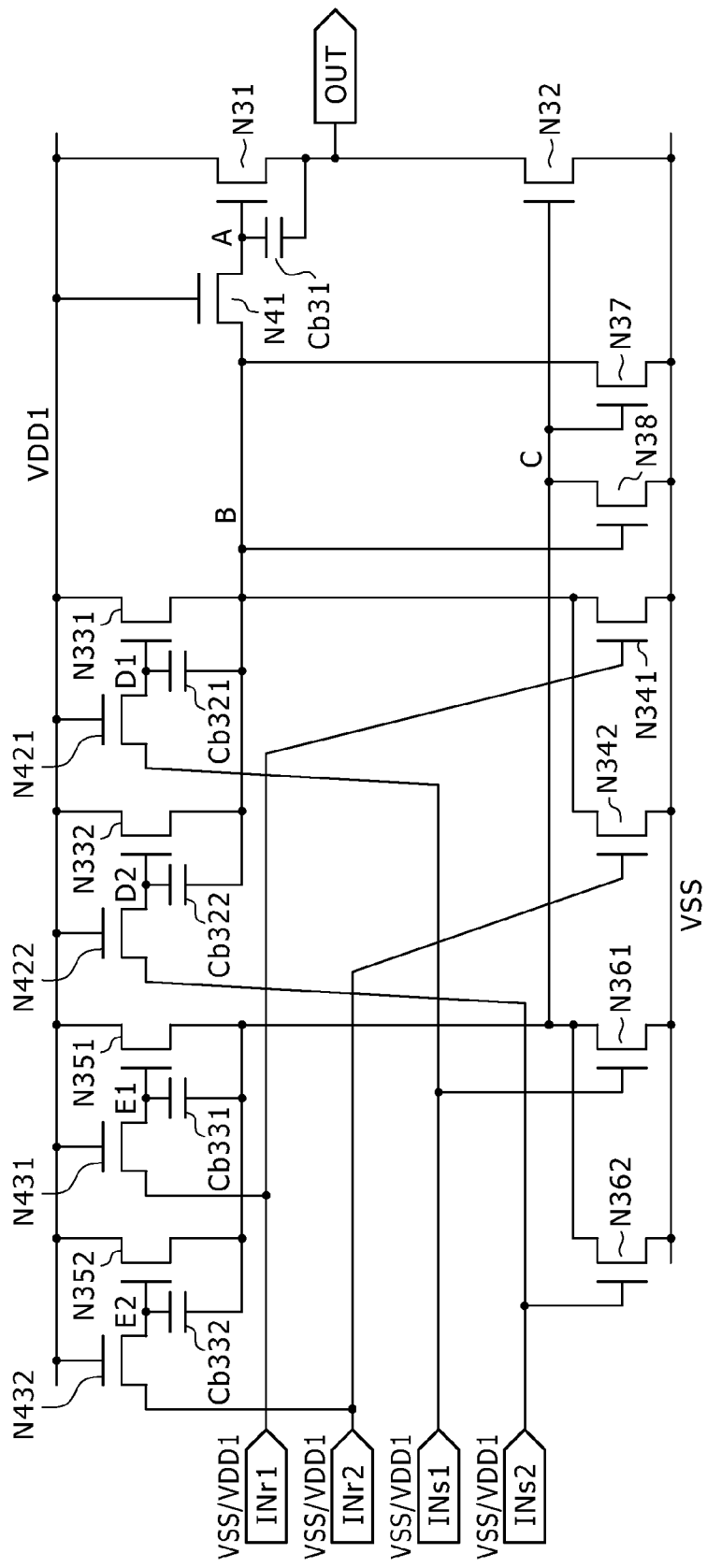
FIG. 37 is a circuit diagram showing a yet further example of a mode of the buffer circuit shown in FIG. 18.

FIG. 37 shows an example of a circuit wherein the first and second inputting stages of the buffer circuit 45 according to the mode example 2 described hereinabove with reference to FIG. 25 are connected in parallel.

In FIG. 37, the thin film transistors N33, N34, N35, N36, N42 and N43 corresponding to a set pulse and a reset pulse of the first set are denoted by N331, N341, N351, N361, N421 and N431, respectively.

Further, in FIG. 37, the thin film transistors N33, N34, N35, N36, N42 and N43 corresponding to a set pulse and a reset pulse of the second set are denoted by N332, N342, N352, N362, N422 and N432, respectively.

If the two sets of a set pulse and a reset pulse are inputted in this manner, then a buffer circuit which can compositely vary the pulse width of the output pulse and the outputting timing of a pulse can be implemented.

It is to be noted that the number of set pulses and reset pulses to be inputted may be determined as occasion demands, and the number of set pulses and the number of reset pulses need not necessarily be equal to each other. A multi-input buffer circuit which has a plurality of control signals (set pulses and reset pulses) can be implemented.

Naturally, the structure of the present mode example can be applied also to the other mode examples proposed in the present application.

Further, although, in the buffer circuit 45 shown in FIG. 37, the thin film transistors N331 and N332, N341 and N342, N351 and N352, and N361 and N362 which form the first and second inputting stages are connected in parallel at the individual outputting terminals, some or all of them may otherwise be connected in series between two operating power supplies, for example, between the first high potential power supply VDD1 and the low potential power supply VSS.

B-9. Example 9 of the Mode

Also here, the buffer circuit 45 according to another additional modification to that of the mode example 2 is described.

a. Circuit Configuration

In the mode examples described hereinabove, the first high potential power supply VDD1 is connected to one of the main electrodes of the thin film transistor N31 which composes the outputting stage is described.

However, a pulse signal line which can apply an arbitrary control pulse may be connected in place of the first high potential power supply VDD1.

Figure 38:
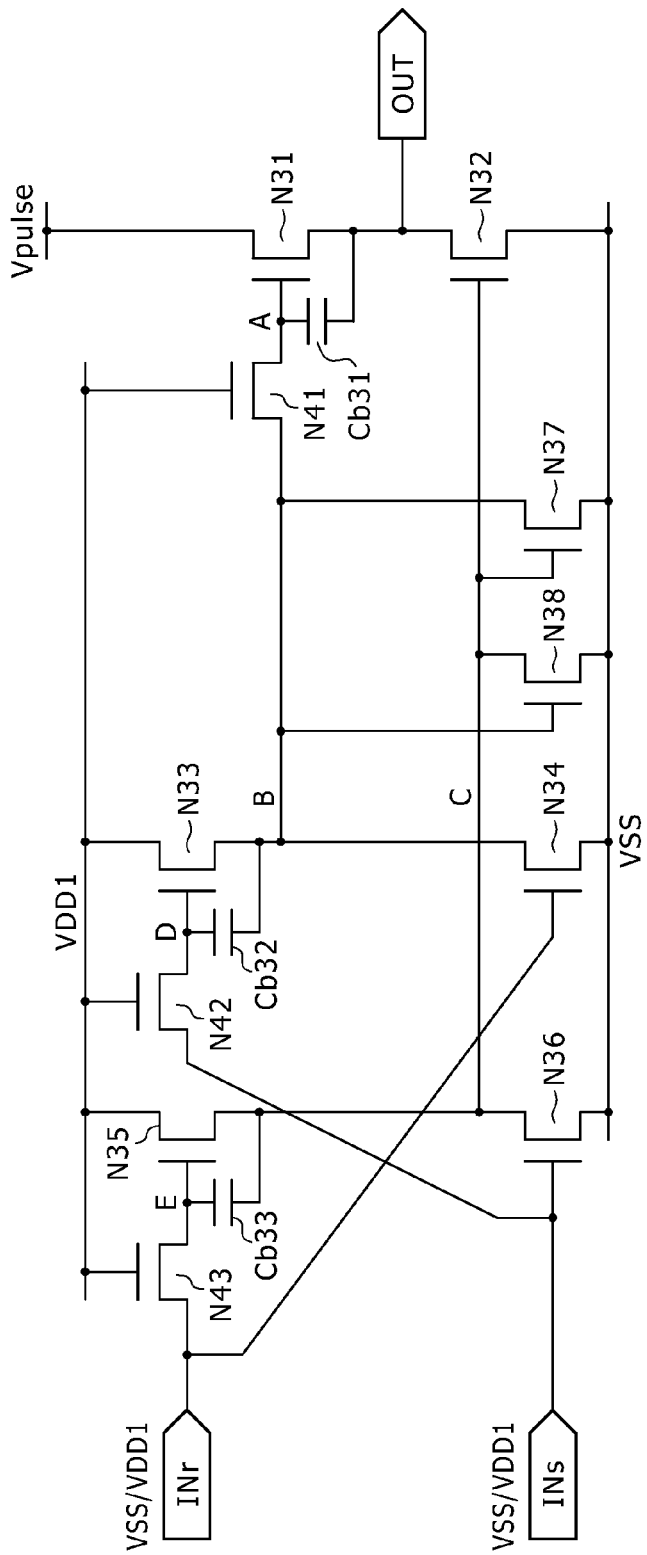
FIG. 38 is a circuit diagram showing a yet further example of a mode of the buffer circuit shown in FIG. 18.

FIG. 38 shows a circuit configuration where a control pulse Vpulse is applied to the thin film transistor N31 which composes the outputting stage of the buffer circuit 45 of the mode example 2. It is to be noted that the circuit configuration according to the present mode example can be applied similarly also to the other mode examples.

b. Driving Operation

Now, a relationship between the potential state of the set pulse and the reset pulse and the potential state of the nodes is described with reference to FIGS. 39A to 39I.

Figure 39:
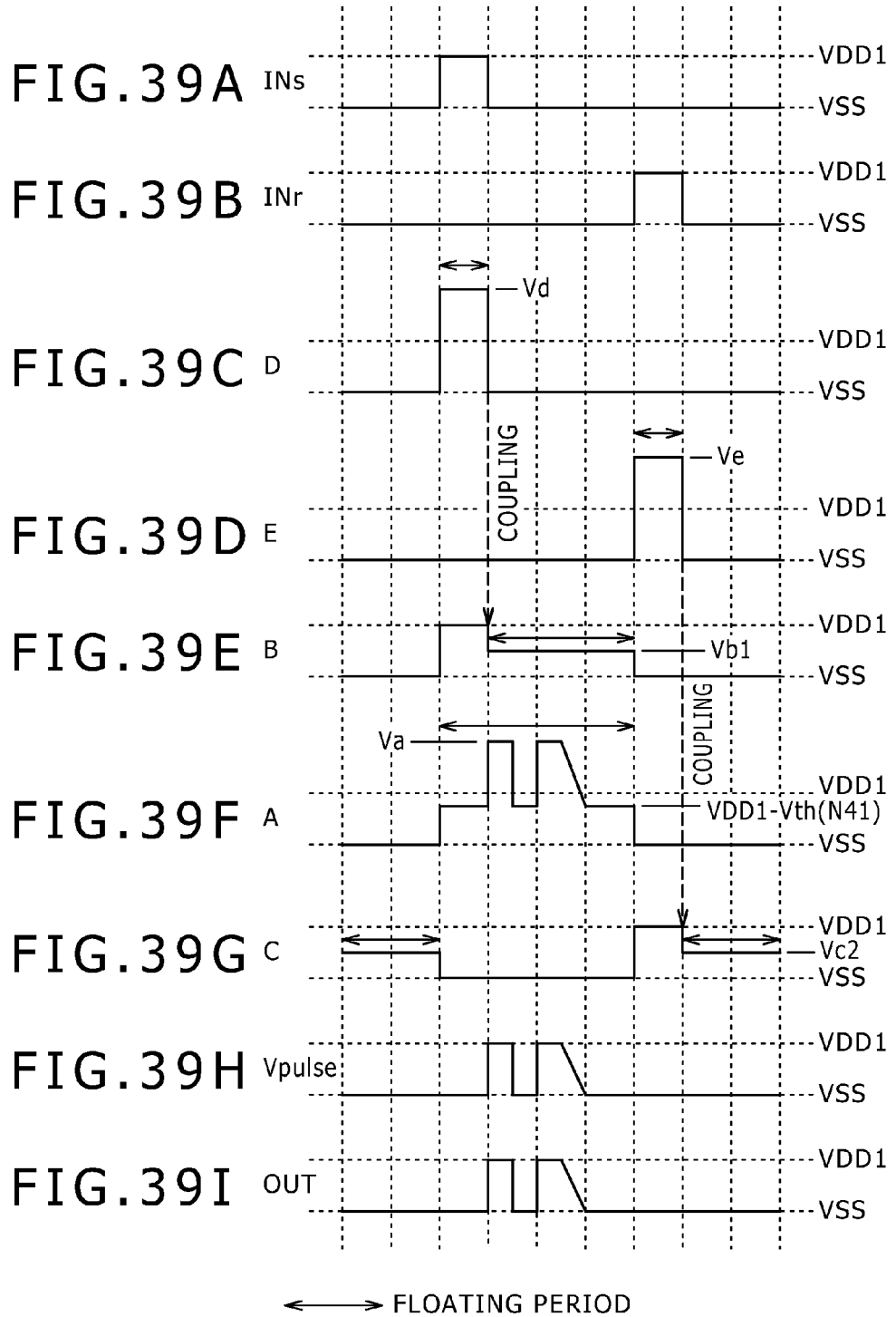
FIGS. 39A to 39I are waveform diagrams illustrating driving waveforms of the buffer circuit shown in FIG. 38.

FIG. 39A illustrates a potential state of the set pulse at the input terminal INs. FIG. 39B illustrates a potential state of the reset pulse at the input terminal INr.

FIG. 39C illustrates a potential state of the gate electrode wiring line of the thin film transistor N33 at the node D.

FIG. 39D illustrates a potential state of the gate electrode wiring line of the thin film transistor N35 at the node E. FIG. 39E illustrates a potential state of the control wiring line at the node B to which the output terminal of the first inputting stage is connected. FIG. 39F illustrates a potential state of the gate control wiring line of the thin film transistor N31 at the node A. FIG. 39G illustrates a potential state of the control wiring line at the node C to which the output terminal of the second inputting stage is connected. FIG. 39H illustrates a state of the potential of the control pulse Vpulse applied to another wiring line. FIG. 39I illustrates a state of the potential appearing at the output terminal OUT of the outputting stage.

First, the timing at which the set pulse rises to the H level is described.

When the set pulse rises to the H level, the node D at the first inputting stage rises to the H level. Consequently, the thin film transistor N33 is placed into an on state and the potential at the node B rises as seen in FIG. 39E.

It is to be noted that, together with the rise of the potential at the node B, the gate potential of the thin film transistor N33, that is, the potential at the node D, rises by an amount corresponding to a charge amount accumulated in the bootstrap complementary capacitor Cb32 as seen from FIG. 39C. The potential after the rise is Vd. When this potential Vd satisfies Vd−VDD1>Vth(N33), upon turning on operation of the thin film transistor N33, the potential at the node B becomes the high potential power supply VDD1 as seen from FIG. 39E.

As the node B rises to the first high potential power supply VDD1 as described above, the potential at the node A varies to a potential given by VDD1−Vth(N41) as seen in FIG. 39F.

However, since the potential of the control pulse Vpulse applied to the pulse signal line is the low potential power supply VSS as seen from FIG. 39H, the potential at the output terminal OUT remains the low potential power supply VSS as seen in FIG. 39I.

It is to be noted that, within a period within which the set pulse has the H level, also the thin film transistor N36 is in an on state. Consequently, the gate potential of the thin film transistor N32, that is, the potential at the node C, is controlled to the low potential power supply VSS as seen in FIG. 39G.

Soon, the set pulse falls from the H level to the L level. Upon this variation of the potential, the potential variation of the set pulse jumps into the node B through the capacitive coupling. As seen from FIG. 39E, the potential at the node B falls from the high potential power supply VDD1 to Vb1 while keeping the H level.

At this time, when the potential Vb1 at the node B satisfies Vb1−VSS>Vth(N38), the thin film transistor N38 exhibits an on state and the low potential power supply VSS can be applied to the node C. This signifies that the node C is not influenced by jumping in of the set pulse, that is, the off operating point of the thin film transistor N32 is not displaced.

This potential state is kept while the potential at the node B remains the potential Vb1. In other words, the node C is kept at the low potential power supply VSS until the reset pulse changes over to the H level. As a result, leak current of the thin film transistor N32 can be minimized.

It is to be noted that the potential Vb1 of the node B satisfies VDD1−Vb1<Vth(N41). This is a condition necessary to cause the thin film transistor N41 to operate into an off state to maintain the floating state of the node A.

In the present mode example, two pulses whose H level is the first high potential power supply VDD1 are inputted to the pulse signal line after the timing at which the set pulse falls to the low potential power supply VSS as seen in FIG. 39H. The first pulse is a rectangular pulse having vertical rising and falling edges. The second pulse has a vertical rising edge but has a moderate falling edge.

When the control pulse Vpulse is inputted while the thin film transistor N31 is in an on state, the potential at the output terminal OUT rises. Together with the rise of the potential at the output terminal OUT, the gate potential of the thin film transistor N31, that is, the potential at the node A, rises by an amount corresponding to a charge amount accumulated in the bootstrap complementary capacitor Cb31 as seen from FIG. 39F. When the potential Va after the rise satisfies Va−VDD1>Vth(N31), upon turning on operation of the thin film transistor N31, the potential at the output terminal OUT becomes the high potential power supply VDD1 as seen from FIG. 39I.

After the reset pulse changes over from the L level to the H level soon as seen in FIG. 39B, now the thin film transistor N35 is placed into an on state and the potential at the node C rises as seen in FIG. 39G. It is to be noted that, together with the rise of the potential at the node C, the gate potential of the thin film transistor N35, that is, the potential at the node E, rises by an amount corresponding to a charge amount accumulated in the bootstrap complementary capacitor Cb33 as seen in FIG. 39D. The potential after the rise is Ve. When the potential Ve satisfies Ve−VDD1>Vth(N35), the potential at the node C upon turning on operation of the thin film transistor N35 becomes the high potential power supply VDD1 as seen in FIG. 39G.

After the potential at the node C rises to the high potential power supply VDD1 as described above, the thin film transistor N32 is placed into an on state and the low potential power supply VSS is supplied to the output terminal OUT as seen in FIG. 39I.

Incidentally, within the period within which the reset pulse has the H level, also the thin film transistor N34 is in an on state. Accordingly, the potential at the node B is controlled to the low potential power supply VSS as seen in FIG. 39E. Together with this, also the gate potential of the thin film transistor N31 which composes the outputting stage 51, that is, the potential at the node A, falls to the low potential power supply VSS.

Soon, the reset pulse falls from the H level to the L level. Upon this variation of the potential, the potential variation of the reset pulse jumps into the node C through the capacitive coupling. As seen from FIG. 39G, the potential at the node C falls from the high potential power supply VDD1 to Vc2 while keeping the H level.

At this time, when the potential Vc2 at the node C satisfies Vc2−VSS>Vth(N32), the on state of the thin film transistor N32 continues and the potential at the output terminal OUT is kept at the low potential power supply VSS as seen in FIG. 39I.

Further, since the potential Vc2 at the node C satisfies Vc2−VSS>Vth(N37), the thin film transistor N37 is placed into an on state and the application of the low potential power supply VSS to the node B is continued.

This signifies that the node C is not influenced by jumping in of the set pulse, that is, the off operating point of the thin film transistor N31 is not displaced.

This potential state is kept while the potential at the node C remains the potential Vc2. In other words, the potential at the node B is kept at the low potential power supply VSS until the set pulse changes over to the H level subsequently. As a result, the source current of the thin film transistor N31 can be minimized.

C. Effect

Since the circuit configuration described above is adopted, the bootstrap operation at the node A is carried out in synchronism with a timing at which the control pulse Vpulse illustrated in FIG. 39H which is applied to the pulse signal line rises to the first high potential power supply VDD1. Accordingly, an output pulse having a same potential variation as that of the control pulse Vpulse inputted within a period defined by the rising timing of the set signal and the rising timing of the reset signal as seen from FIG. 39I appears at the output terminal OUT.

In this manner, thanks to the adoption of the circuit configuration according to the present mode example, it is possible to adjust the waveform of the output pulse. For example, it is possible to divide the output pulse into a plurality of pulses or to adjust the transient (rising or falling) characteristic.

C. Configuration of the Control Line Driving Section (PMOS Type)

Now, examples of the control line driving section suitable wherein the pixel array section or the control line driving section is formed only from PMOS elements.

First, different examples of an equivalent circuit to the sub pixel 11 where the pixel array section is formed only from PMOS type thin film transistor structures are described with reference to FIGS. 40 and 41.

Figure 1:
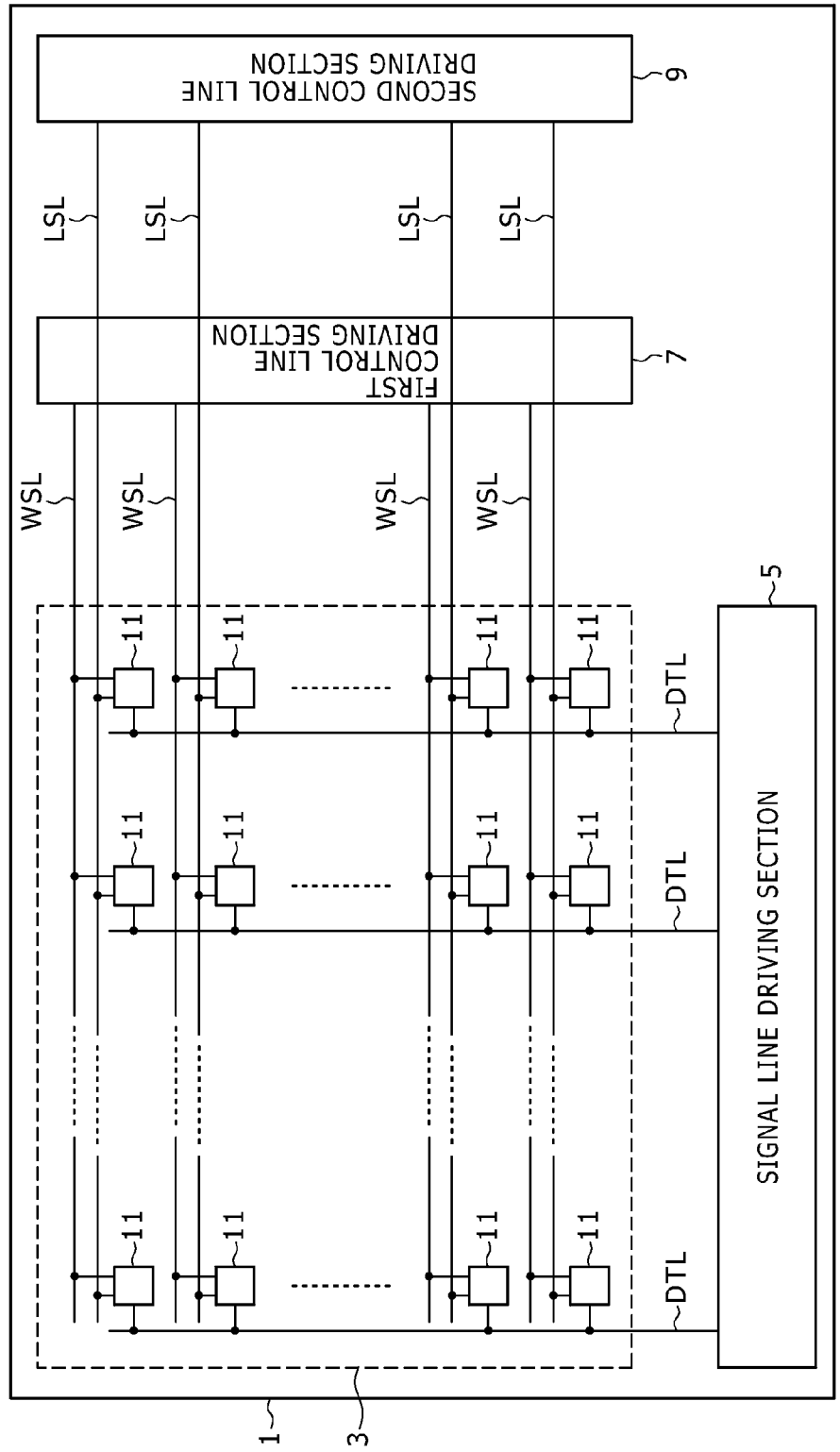
FIG. 1 is a block diagram showing an example of a system configuration of an organic EL panel.
Figure 2:
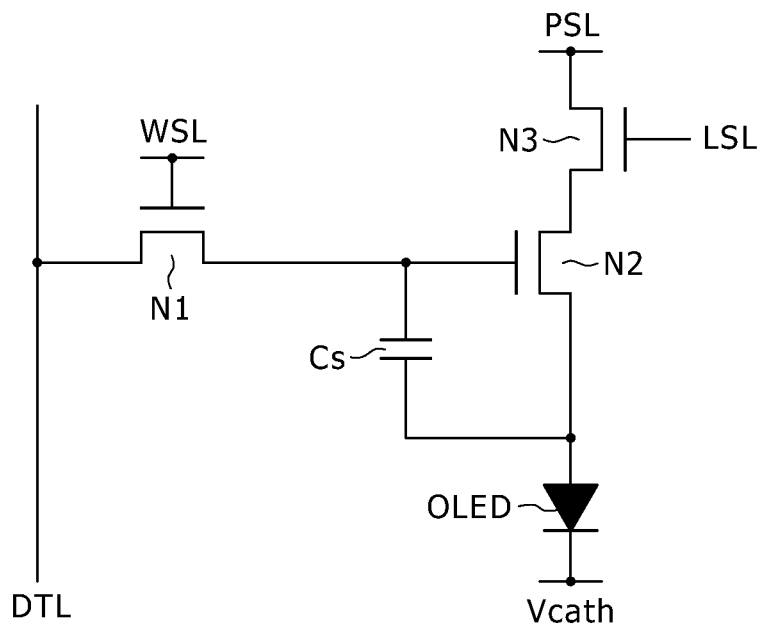
FIGS. 2 and 3 are circuit diagrams showing different equivalent circuits of a sub pixel where the sub pixel is formed from thin film transistors of the NMOS type.
Figure 4:
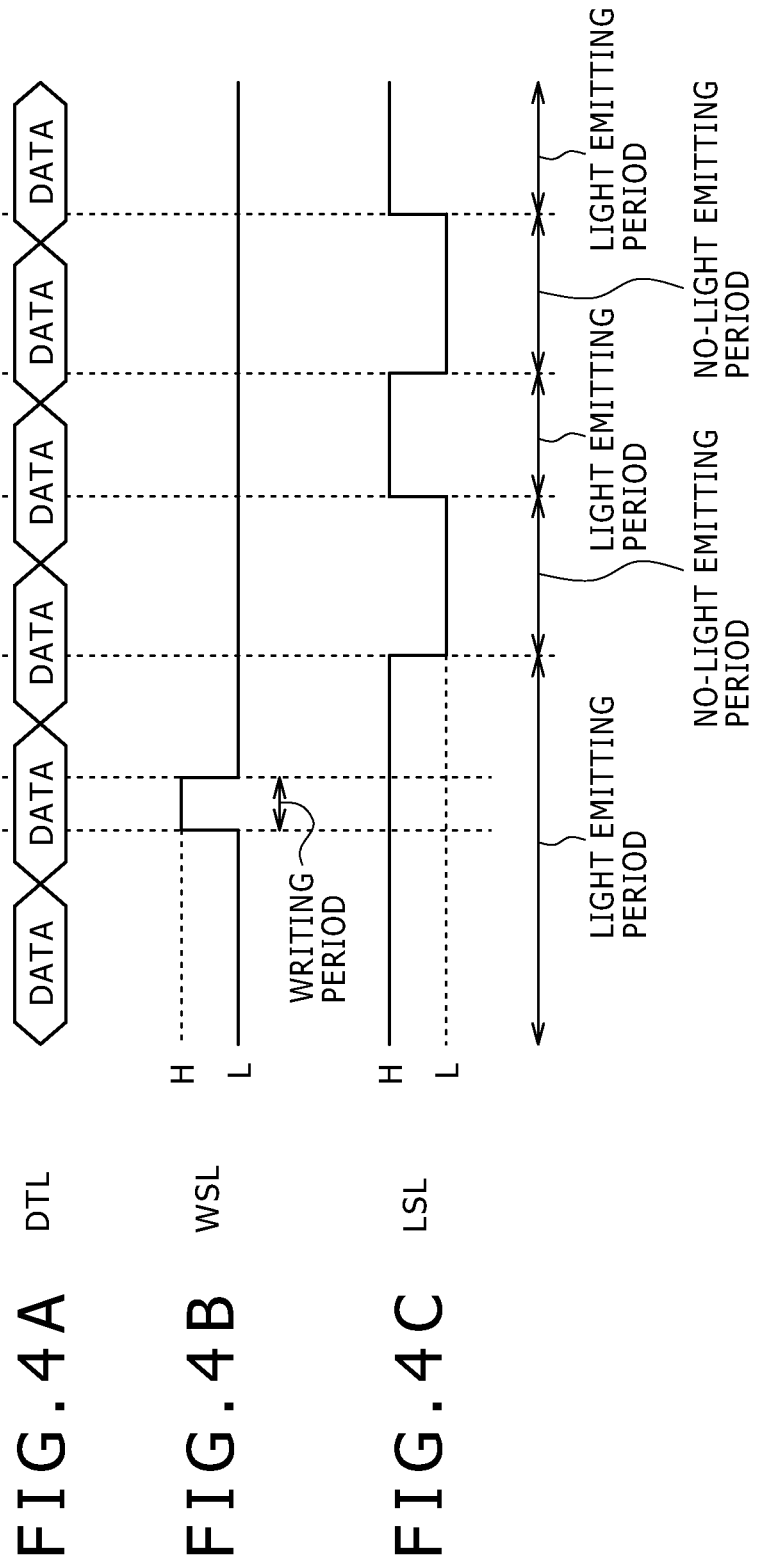
FIGS. 4A to 4C are timing charts illustrating driving timings of the sub pixels of FIGS. 2 and 3.
Figure 5:
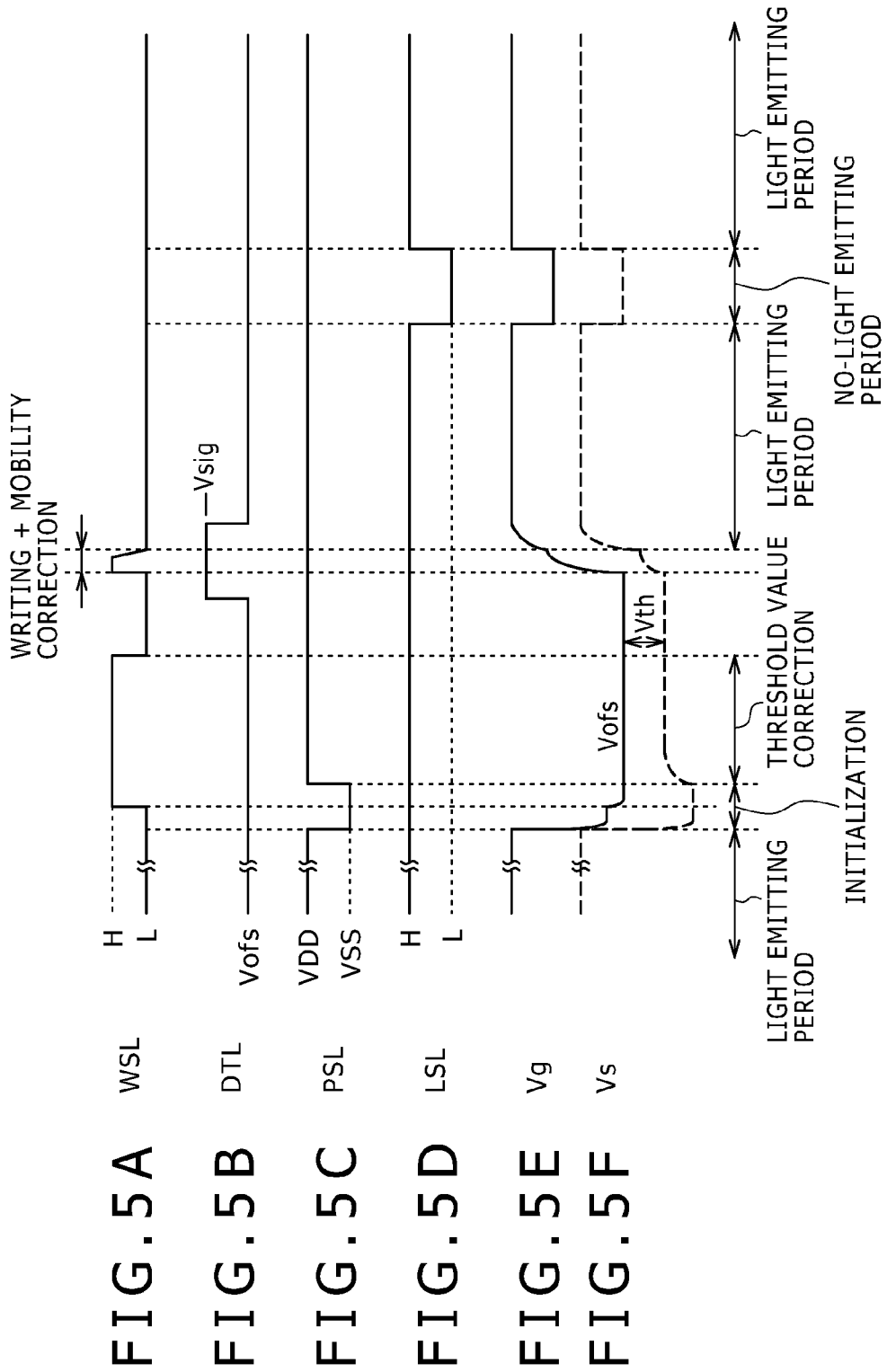
FIGS. 5A to 5F are waveform diagrams illustrating driving waveforms of the sub pixel of FIG. 2.
Figure 6:
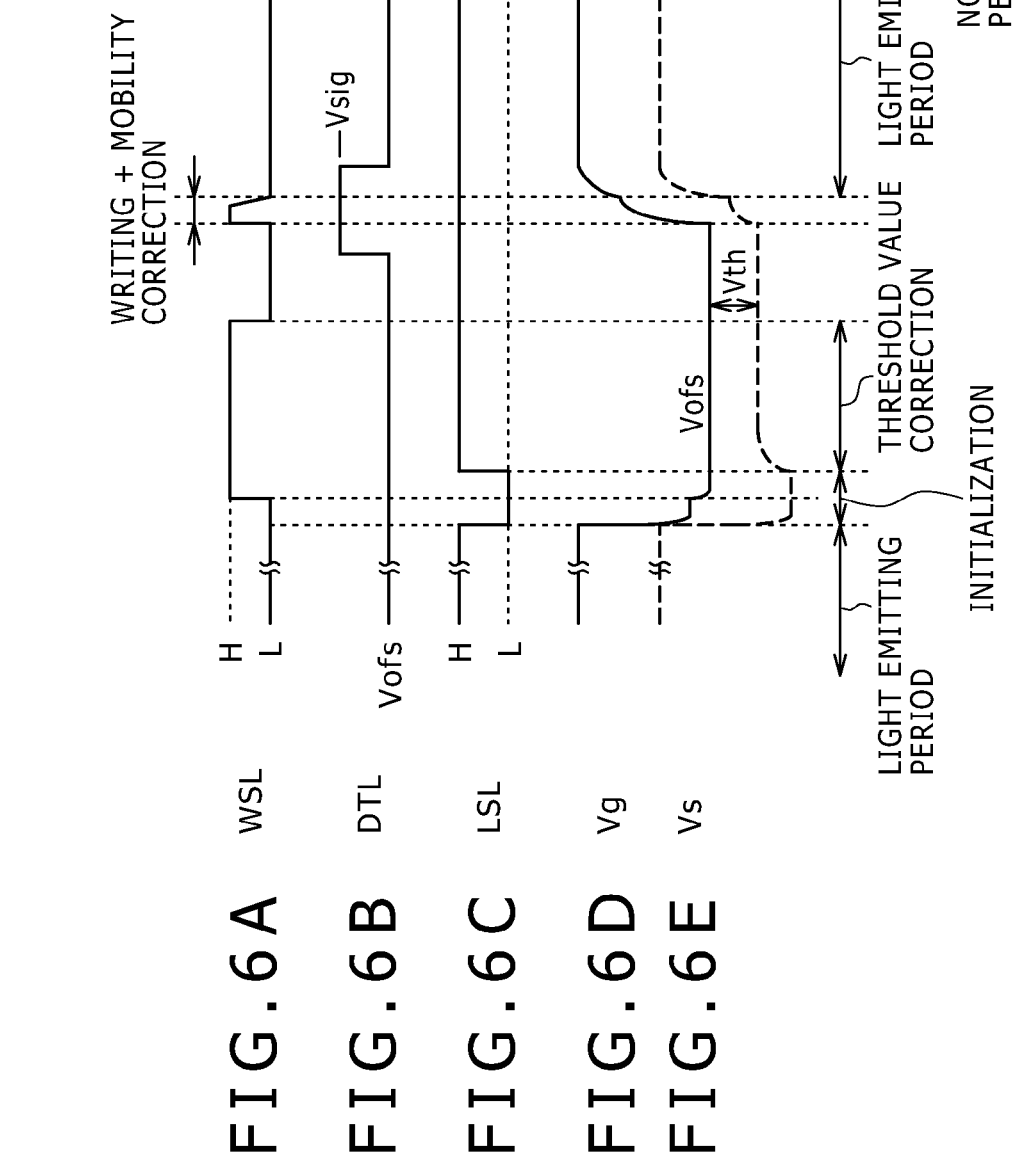
FIGS. 6A to 6E are waveform diagrams illustrating driving waveforms of the sub pixel of FIG. 3.
Figure 7:
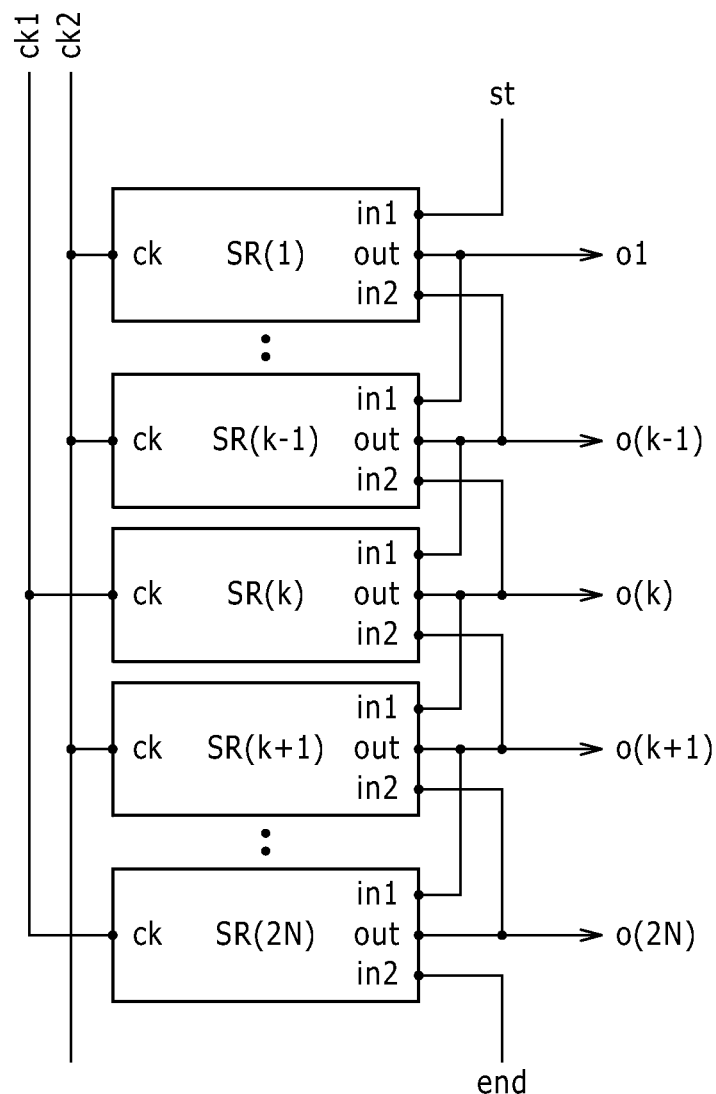
FIG. 7 is a block diagram showing an example of a circuit configuration of a shift register which functions as a scanner.
Figure 8:
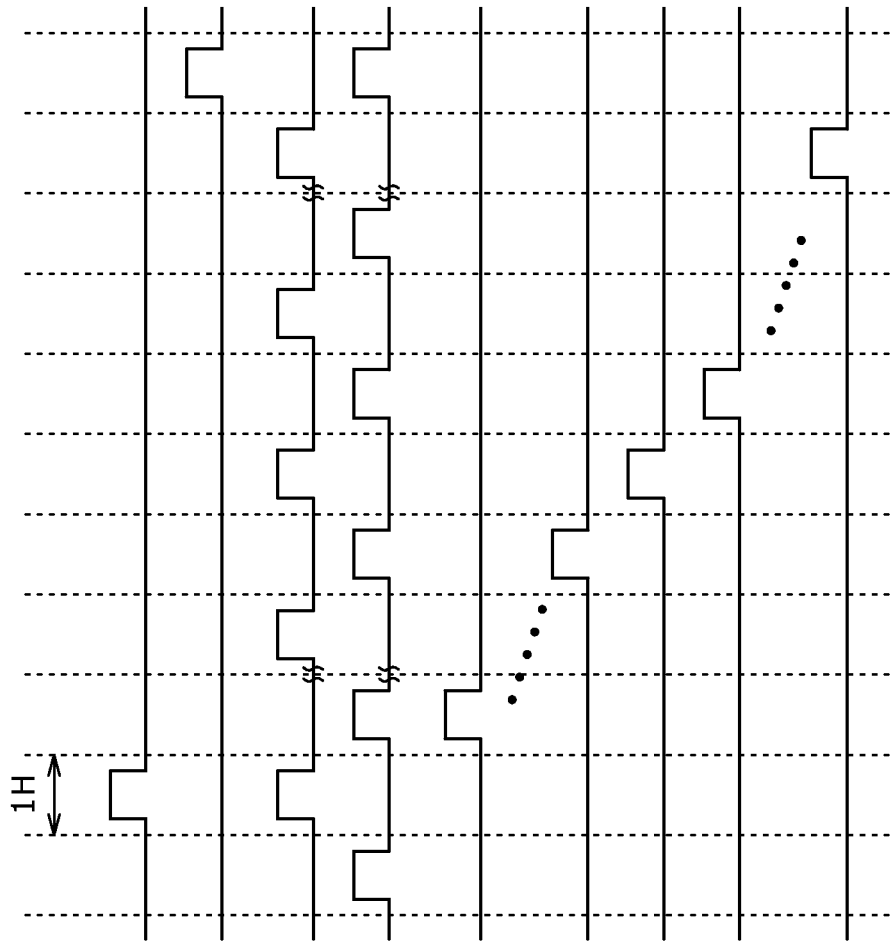
FIGS. 8A to 8I are waveform diagrams illustrating driving waveforms of the shift register of FIG. 7 where the shift register is formed from NMOS thin film transistors.
Figure 9:
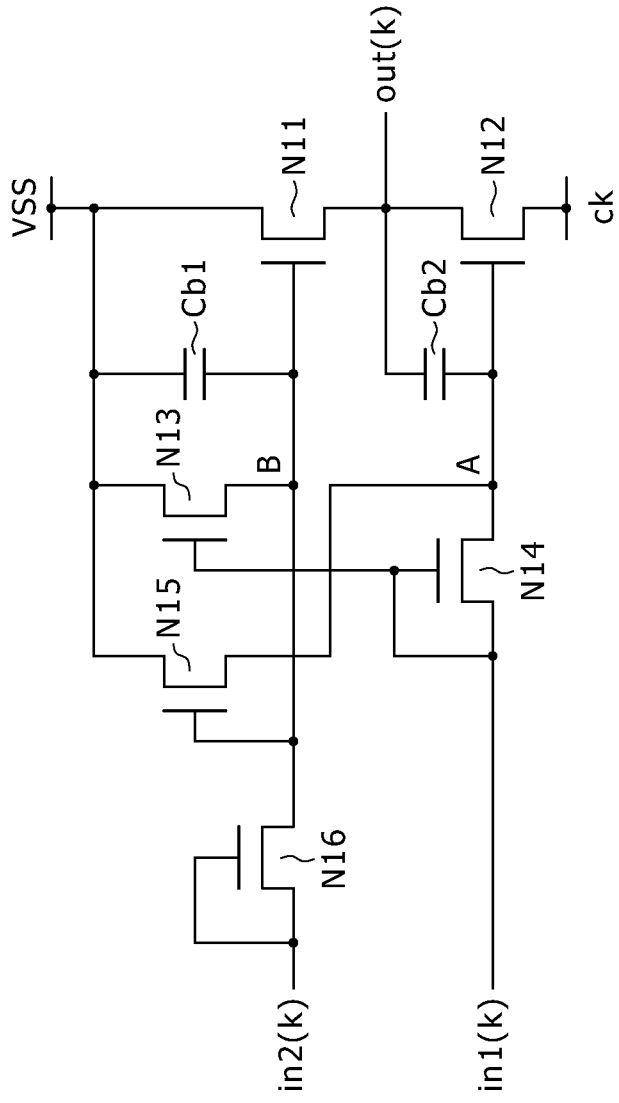
FIG. 9 is a circuit diagram showing an internal structure of a shift stage of the shift register of FIG. 7 which has a bootstrap function.
Figure 10:
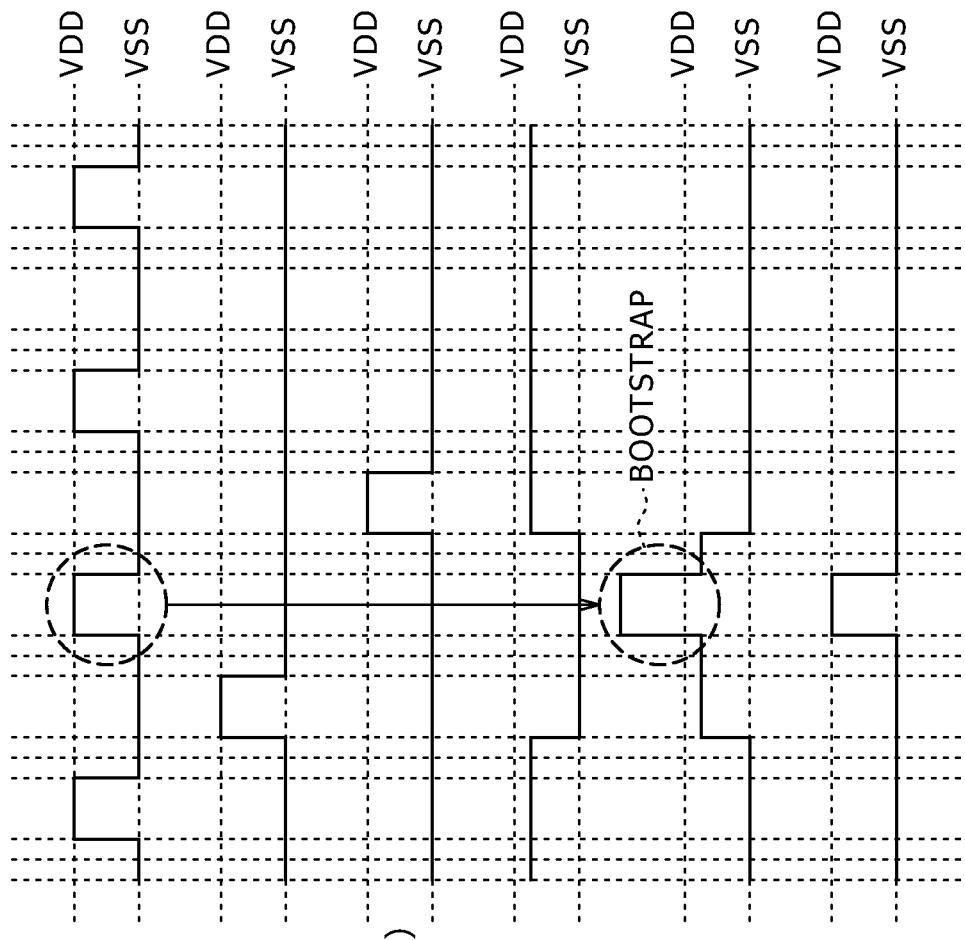
FIGS. 10A to 10F are waveform diagrams illustrating inputting and outputting operations of the shift register shown in FIG. 9.
Figure 11:
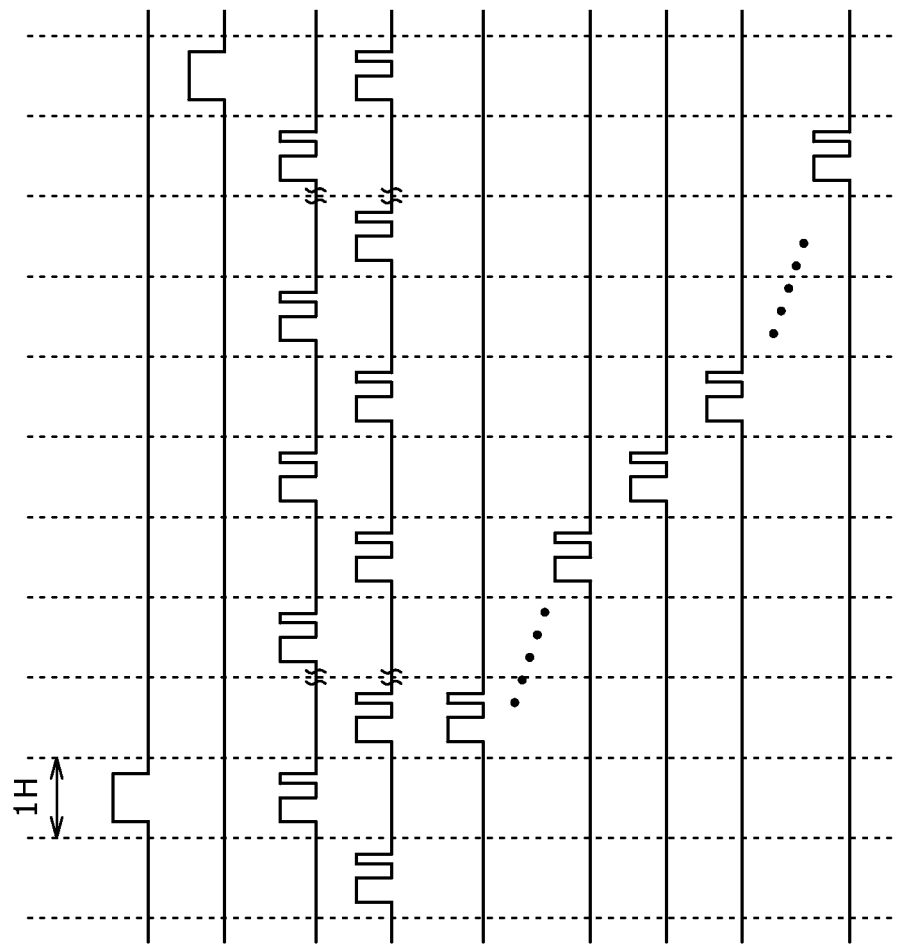
FIGS. 11A to 11I are waveform diagrams illustrating a relationship between a pulse shape of an input clock and a transfer operation of the shift register of FIG. 7.
Figure 12:
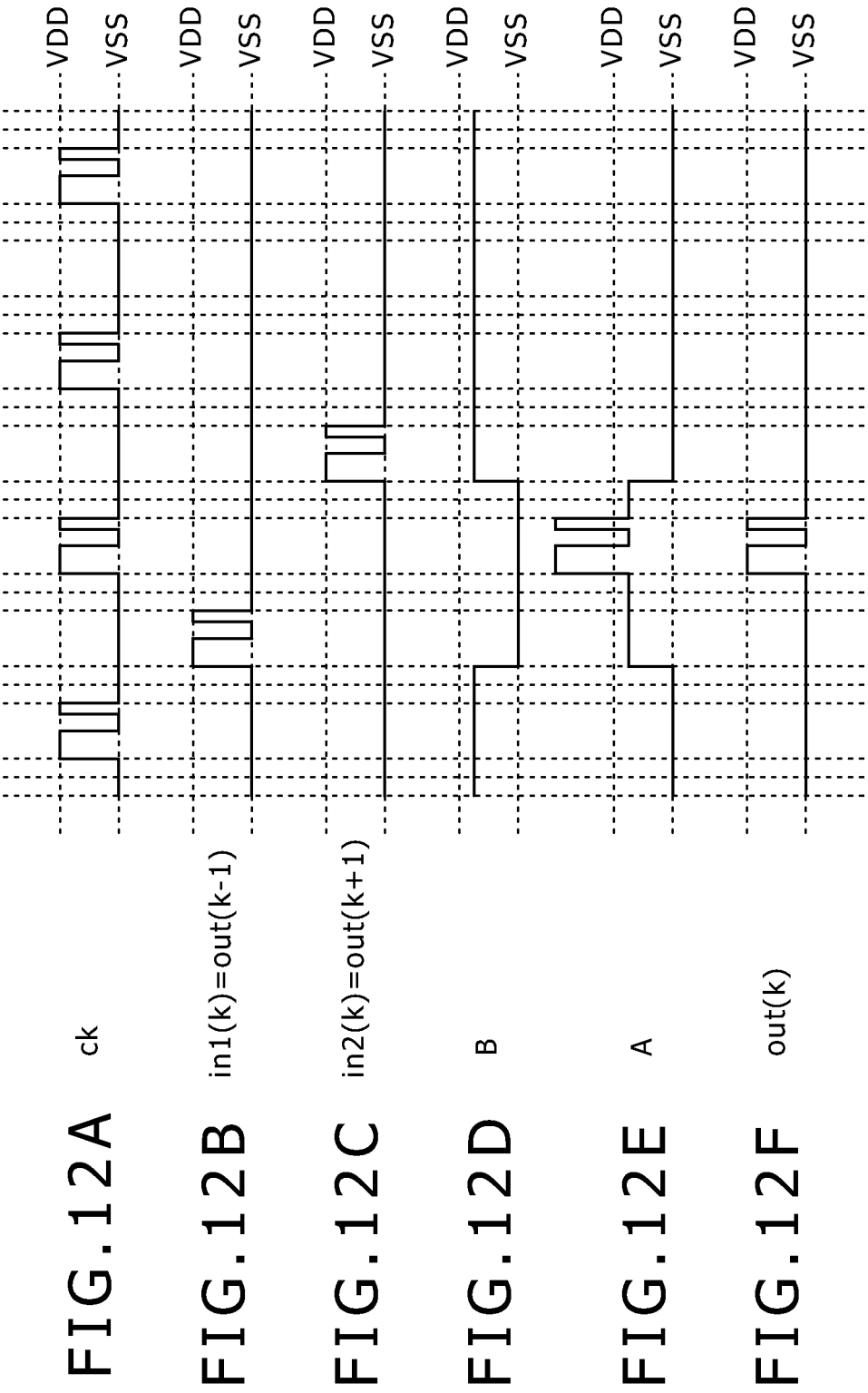
FIGS. 12A to 12F are waveform diagrams illustrating inputting and outputting operations of the shift stage of FIG. 9 which has the bootstrap function.
Figure 13:
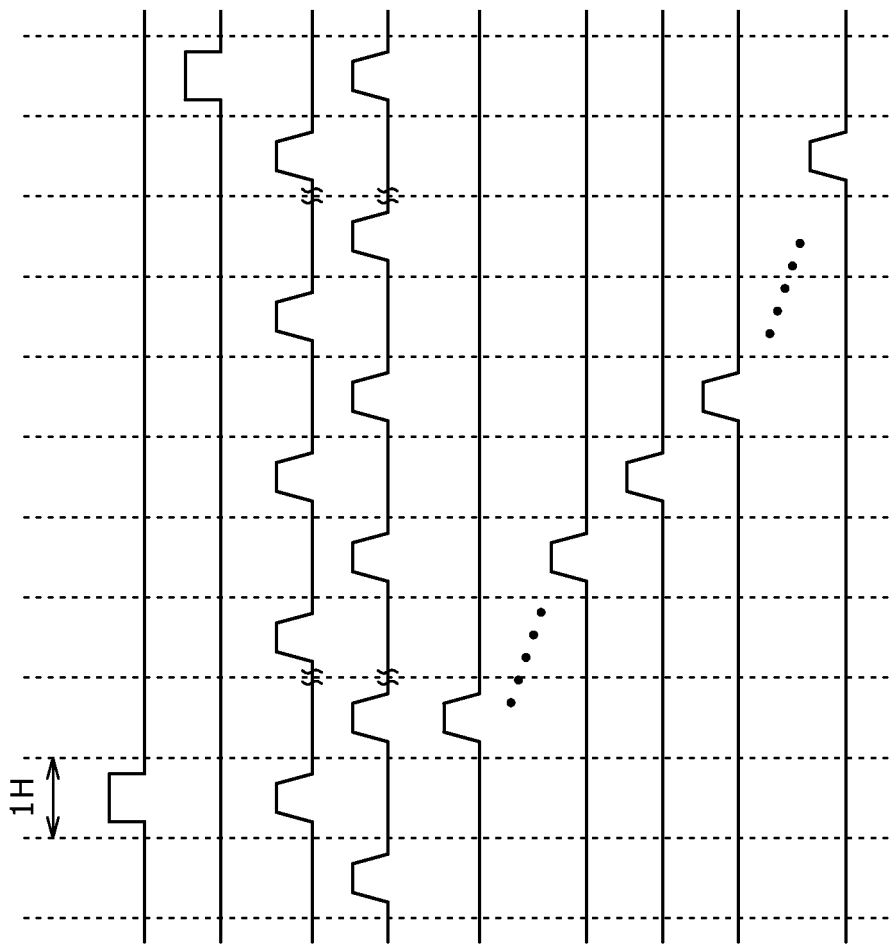
FIGS. 13A to 13I are waveform diagrams illustrating another relationship between a pulse shape of the input clock and a transfer operation of the shift register of FIG. 7.
Figure 14:
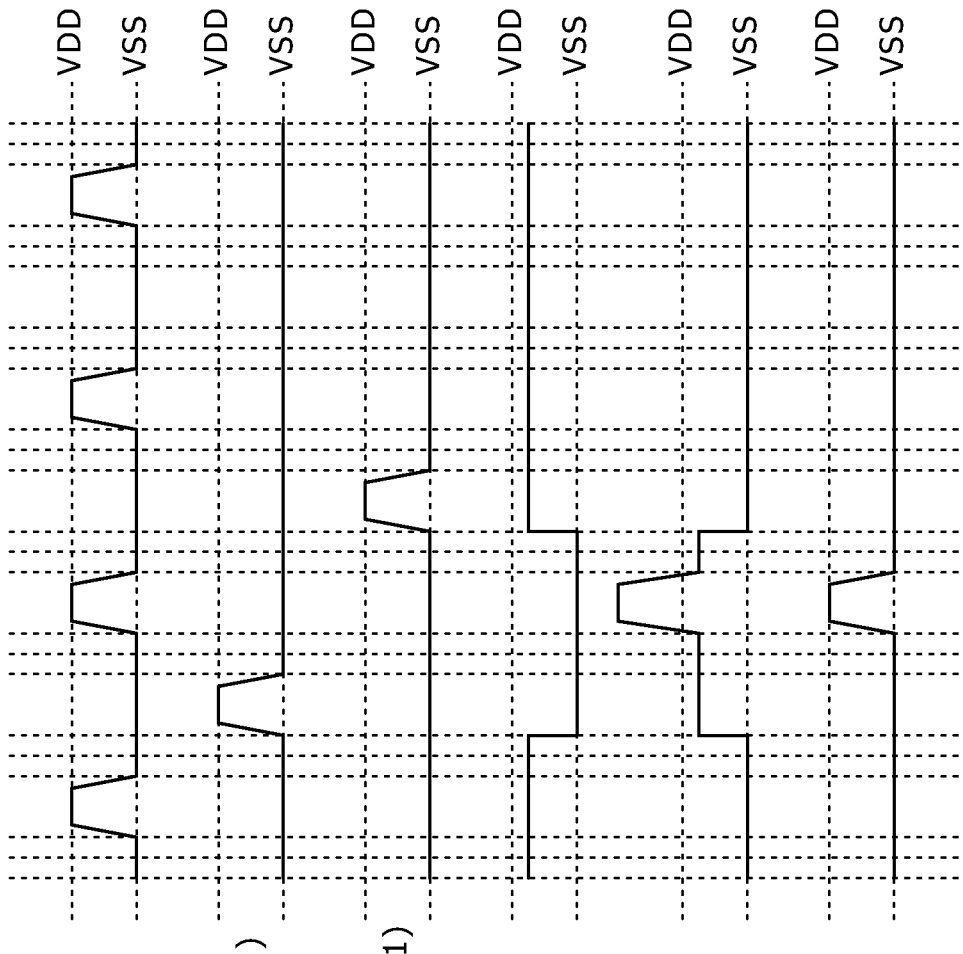
FIGS. 14A to 14F are waveform diagrams illustrating different inputting and outputting operations of the shift stage of FIG. 9 which has the bootstrap function.
Figure 15:
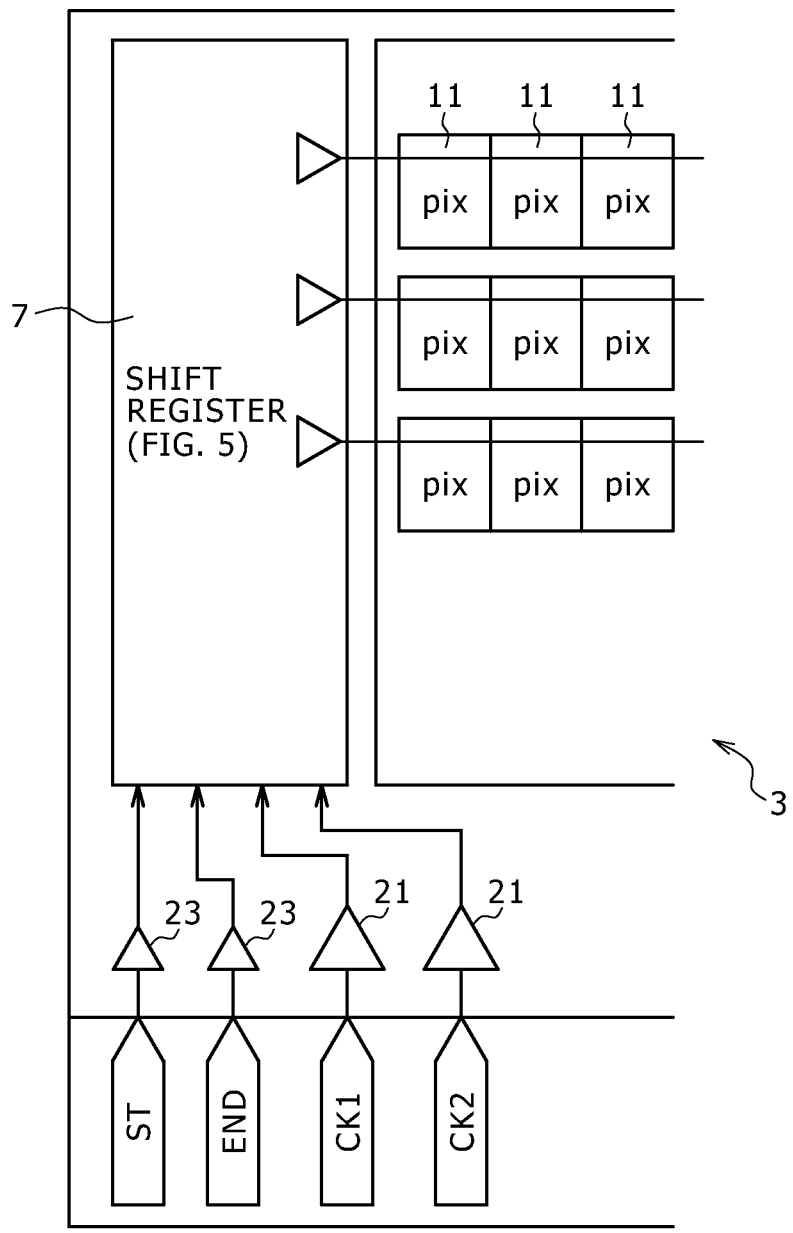
FIG. 15 is a block diagram showing a panel structure which includes an existing driving circuit.
Figure 40:
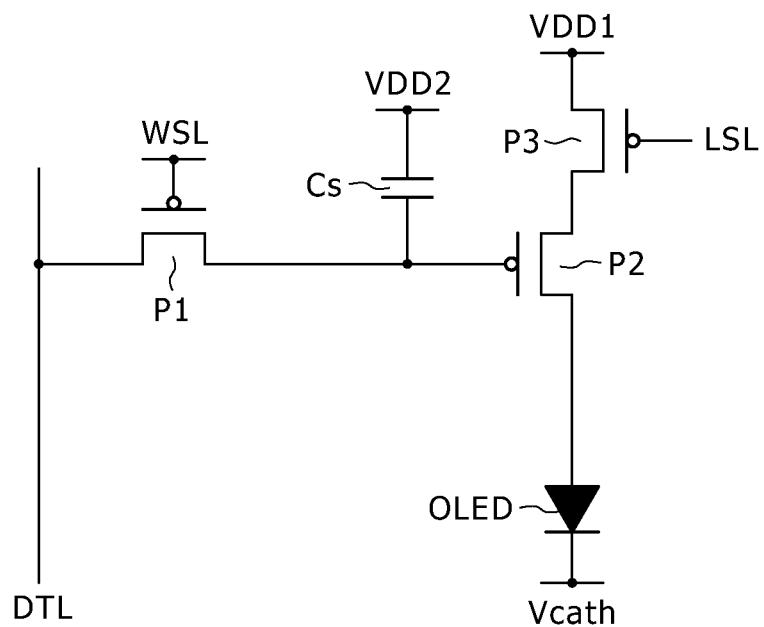
FIGS. 40 and 41 are circuit diagrams illustrating different equivalent circuits of a sub pixel where the sub pixel is formed from thin film transistors of the PMOS type.
Figure 41:
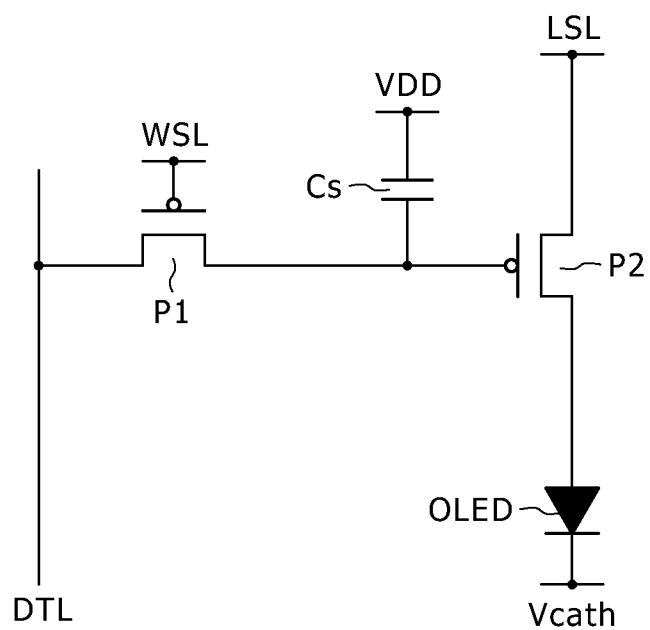
Figure 42:
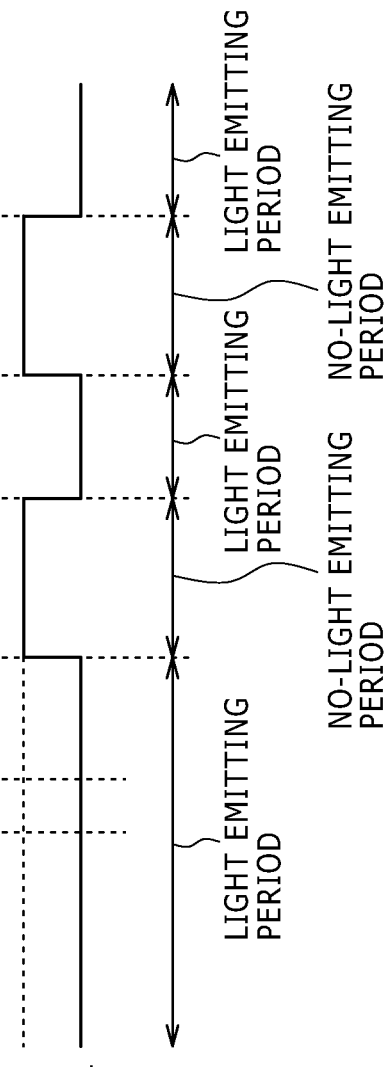
FIGS. 42A to 42C are timing charts illustrating driving timings of the sub pixels of FIGS. 40 and 41.

The configurations of the sub pixel 11 shown in FIGS. 40 and 41 are basically same as those of the sub pixels 11 shown in FIGS. 2 and 3 except that the thin film transistors used are changed from those of the NMOS type to those of the PMOS type. Accordingly, the driving waveforms for them are same as those of the writing control line WSL and the lighting control line LSL in FIGS. 4B and 4C where the H level and the L level are replaced with each other as shown in FIGS. 42B and 42C.

Incidentally, the sub pixel 11 shown in FIG. 40 has a circuit configuration where a driving method for implementing a turning on operation and an turning off operation of the organic EL element OLED are implemented by on/off control of a lighting control transistor P3. Meanwhile, the sub pixel 11 shown in FIG. 41 corresponds to a circuit configuration where another driving method which implements a turning on operation and a turning off operation of the organic EL element OLED are implemented by the potential variation of the lighting control line LSL. It is to be noted that, in the sub pixel 11 shown in FIG. 41, the lighting control line LSL functions also as a current supplying source.

Figure 43:
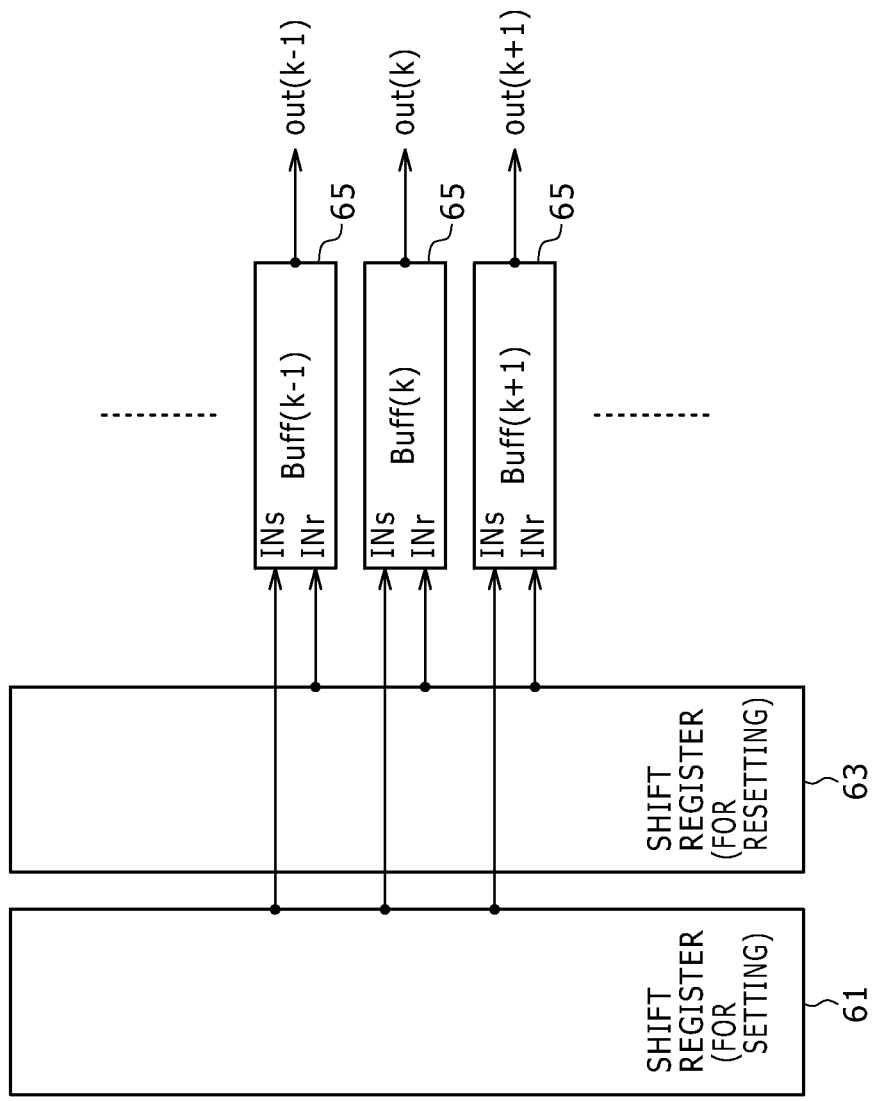
FIG. 43 is a block diagram showing a circuit configuration of the control line driving section shown in FIG. 17 where the control line driving section is formed from thin film transistors of the PMOS type.

FIG. 43 shows an example of a configuration of a control line driving section formed only from thin film transistors of the POMS type.

Figure 63:
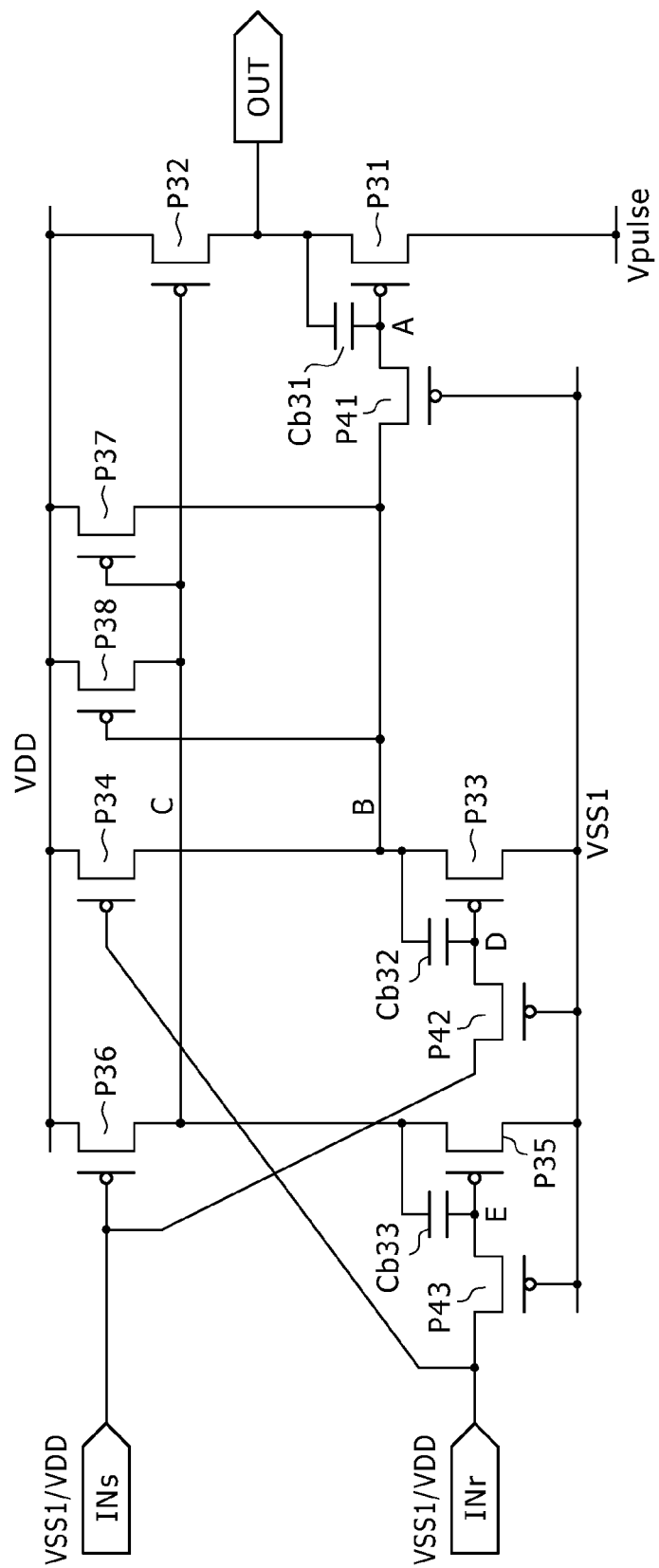
FIG. 63 is a circuit diagram showing a yet further example of a mode of the buffer circuit shown in FIG. 43.

The control line driving section shown in FIG. 63 includes a shift register 61 for transferring a set signal, a shift register 63 for transferring a reset signal, and a buffer circuit 65 which operates complementarily in response to the set signal and the reset signal outputted from each shift stage.

It is to be noted that the buffer circuit 65 outputs the L level in response to the set signal inputted thereto, but outputs the H level in response to the reset signal inputted thereto.

Figure 44:
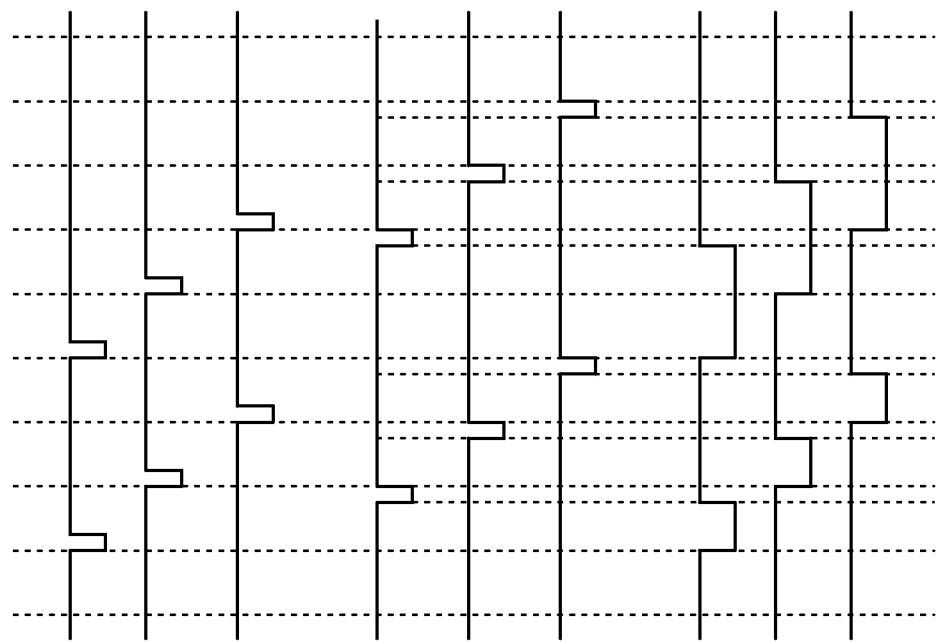
FIGS. 44A to 44I are waveform diagrams illustrating driving waveforms of the control line driving section of FIG. 43.

FIGS. 44A to 44I indicate driving pulse waveforms of the control line driving section. It is to be noted that FIGS. 44A to 44C illustrate output pulses scan1 (scan1(k−1) to scan1(k+1)) of the shift register 61 for set signal transfer. FIGS. 44D to 44F indicate output pulses scan2 (scan2(k−1) to scan2(k+1)) of the shift register 63 for reset signal transfer. FIGS. 44G to 44I indicate output pulses out (out(k−1) to out(k+1)) of the buffer circuit 65.

As seen from FIGS. 44G to 44I, the pulse width of the output pulses out of the buffer circuit 65 coincides with the time difference between inputting timings of the set signal and the reset signal inputted to the buffer circuit 65. Therefore, it is possible to set preferably the pulse width of the output pulse out of the buffer circuit 65 by controlling the transfer intervals of the set signal and the reset signal.

In the following, several examples of a mode of the buffer circuit 65 are described.

C-1. Example 1 of the Mode a. Circuit Configuration

Figure 45:
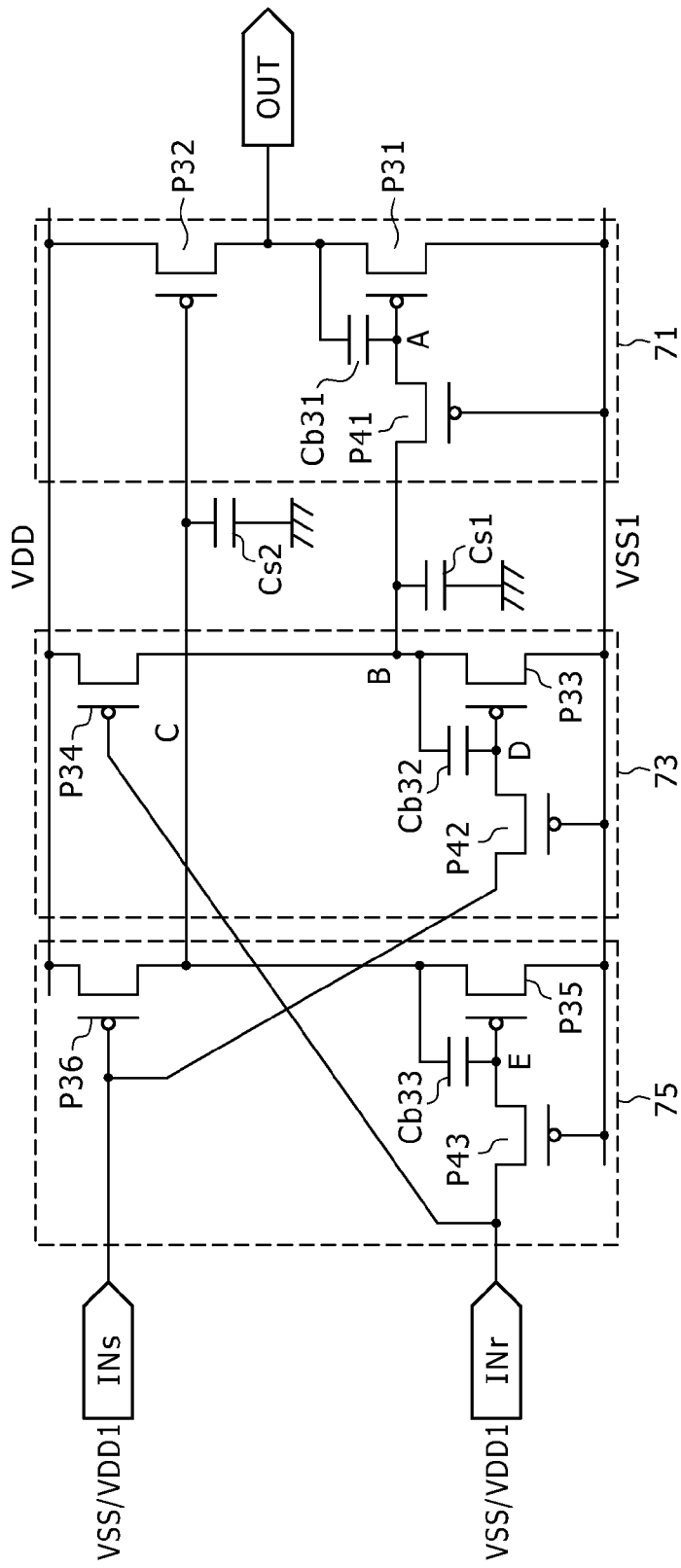
FIG. 45 is a circuit diagram showing an example of a mode of the buffer circuit shown in FIG. 43.

FIG. 45 shows a first mode example of the buffer circuit 65, and FIGS. 46A to 46H illustrate driving waveforms of the example of FIG. 45.

Referring first to FIG. 45, the buffer circuit 65 shown includes an outputting stage 71, a first inputting stage 73, and a second inputting stage 75.

The outputting stage 71 has a circuit configuration wherein thin film transistors P31 and P32 of the PMOS type are connected in series between a low potential power supply VSS1 and a high potential power supply VDD. In particular, the thin film transistor P31 is connected to the low potential power supply VSS1 side while the thin film transistor P32 is connected to the high potential power supply VDD side. A node between the thin film transistors P31 and P32 serves as an output terminal OUT of the buffer circuit 65.

In the present mode, a bootstrap complementary capacitor Cb31 is connected between the gate electrode of the thin film transistor P31 and the output terminal. However, where the gate capacitance of the thin film transistor P31 is sufficiently high, the bootstrap complementary capacitor Cb31 need not be disposed.

Further, in the outputting stage 71, a thin film transistor P41 for absorbing a potential difference between the gate potential Vg of the thin film transistor P31 and the output potential of the first inputting stage 73 is disposed upon bootstrap operation. The thin film transistor P41 of the PMOS type is connected at one of main electrodes thereof to a gate electrode wiring line of the thin film transistor P31, that is, to the node A of the control line, and at the other main electrode thereof to the node B of the control line. Further, the thin film transistor P41 is connected at the gate electrode thereof to the low potential power supply VSS1.

It is to be noted that a capacitor (hereinafter referred to as storage capacitor) Cs1 for storing a potential is connected to the node B. Similarly, another storage capacitor Cs2 is connected to a gate electrode wiring line of the thin film transistor P32, that is, a node C of another control line. The storage capacitors Cs1 and Cs2 are connected in order to complement the nodes B and C where the wiring line capacitance of the nodes B and C is low. By the disposition of the complementary capacitors, the variation of the node potential which makes a cause of a malfunction such as off leak of the thin film transistors or jumping in through a capacitor between wiring lines can be reduced.

The first inputting stage 73 and the second inputting stage 75 have a circuit configuration basically same as that of the outputting stage 71.

First, a circuit configuration of the first inputting stage 73 is described. The first inputting stage 73 has a circuit configuration that thin film transistors P33 and P34 of the PMOS type are connected in series between the low potential power supply VSS1 and the high potential power supply VDD. In particular, the thin film transistor P33 is connected to the low potential power supply VSS1 side while the thin film transistor P34 is connected to the high potential power supply VDD side. A node between the thin film transistors P33 and P34 serves as an output terminal and is connected to the node B.

Meanwhile, a bootstrap complementary capacitor Cb32 is connected between the gate electrode of the thin film transistor P33 and the output terminal. Further, where the gate capacitance of the thin film transistor P33 is sufficiently high, the bootstrap complementary capacitor Cb32 need not be disposed.

Further, a thin film transistor P42 for absorbing a potential difference between the gate potential Vg of the thin film transistor P33 and the potential appearing at the input terminal for the set pulse upon bootstrap is disposed.

The thin film transistor P42 of the PMOS type is connected at one of main electrodes thereof to a gate electrode wiring line of the thin film transistor P33, that is, to a node D of the control line, and at the other main electrode thereof to an input terminal INs for the set pulse. Further, the thin film transistor P42 is connected at the gate electrode thereof to the low potential power supply VSS1.

Meanwhile, the thin film transistor P34 is connected at the gate electrode thereof to an input terminal INr for the reset pulse. In this manner, operation of the first inputting stage 73 is controlled with the set pulse and the reset pulse.

Now, a circuit configuration of the second inputting stage 75 is described. The second inputting stage 75 has a circuit configuration that thin film transistors P35 and P36 of the PMOS type are connected in series between the low potential power supply VSS1 and the high potential power supply VDD. In particular, the thin film transistor P35 is connected to the low potential power supply VSS1 side while the thin film transistor P36 is connected to the high potential power supply VDD side. A node between the thin film transistors P35 and P36 serves as an output terminal and is connected to the node C.

Meanwhile, a bootstrap complementary capacitor Cb33 is connected between the gate electrode of the thin film transistor P35 and the output terminal. Further, where the gate capacitance of the thin film transistor P35 is sufficiently high, the bootstrap complementary capacitor Cb33 need not be disposed.

Further, a thin film transistor P43 for absorbing a potential difference between the gate potential Vg of the thin film transistor P35 and the potential appearing at the input terminal for the set pulse upon bootstrap is disposed.

The thin film transistor P43 of the PMOS type is connected at one of main electrodes thereof to a gate electrode wiring line of the thin film transistor P35, that is, to a node E of the control line, and at the other main electrode thereof to the input terminal INr for the reset pulse. Further, the thin film transistor P43 is connected at the gate electrode thereof to the low potential power supply VSS1.

Meanwhile, the thin film transistor P36 is connected at the gate electrode thereof to the input terminal INs for the set pulse. In this manner, the connection relationship of the set pulse and the reset pulse to the thin film transistors in the second inputting stage 75 is set to the opposite relationship to that in the first inputting stage 73.

It is to be noted that the boot gain gb of the thin film transistor P31 (P33 and P35) is given by the following expression:

$$gb = (Cg + Cb)/(Cg + Cb + Cp)$$

where Cg is the gate capacitance, Cb the bootstrap complementary capacitor connected to the gate electrode of the thin film transistor, and Cp the parasitic capacitance of the node A (node D and node E) (wiring line characteristic except the parasitic capacitance Cg and Cb).

The presence of the parasitic capacitance Cp makes a cause of drop of the bootstrap gain. Accordingly, it is preferable to dispose the bootstrap complementary capacitor to raise the bootstrap gain as described hereinabove in order to ensure the turning on operation of the thin film transistors.

a. Driving Operation

Now, a relationship between the potential state of the set pulse and the reset pulse and the potential state of the nodes are described with reference to FIGS. 46A to 46H.

FIG. 46A illustrates a potential state of the set pulse at the input terminal INs. FIG. 46B illustrates a potential state of the reset pulse at the input terminal INr.

FIG. 46C illustrates a potential state of the gate electrode wiring line of the thin film transistor P33 at the node D.

FIG. 46D illustrates a potential state of the gate electrode wiring line of the thin film transistor P35 at the node E. FIG. 46E illustrates a potential state of the control wiring line at the node B to which the output terminal of the first inputting stage 73 is connected. FIG. 46F illustrates a potential state of the gate control wiring line of the thin film transistor P31 at the node A. FIG. 46G illustrates a potential state of the control wiring line at the node C to which the output terminal of the second inputting stage 75 is connected. FIG. 46H illustrates a state of the potential appearing at the output terminal OUT of the outputting stage 71.

As seen from FIGS. 46A to 46H, the signal amplitude of the set pulse at the input terminal INs is given with two values according to the high potential power supply VDD and the low potential power supply VSS1. On the other hand, the signal amplitude of the reset pulse at the input terminal INr is given with two values according to the high potential power supply VDD and the low potential power supply VSS1. In this manner, the pulse signals provided from the shift registers 61 and 63 are same as the two power supply potentials supplied to the buffer circuit 65.

In the present mode example, the timing at which the set pulse falls to the L level is defined as a timing which provides a falling timing of the output pulse appearing at the output terminal of the outputting stage 71. On the other hand, the timing at which the reset pulse falls to the L level is defined as a timing which provides a rising timing of the output terminal appearing at the output terminal of the outputting stage 71. As seen in FIGS. 46A and 46B, the set pulse falls to the L level first, and then the reset pulse falls to the L level.

First, at the timing at which the set pulse falls to the L level, the potential at the node D of the first inputting stage 73 falls to the L level. Consequently, the thin film transistor P33 is placed into an on state and the potential at the node B falls as seen from FIG. 46E.

It is to be noted that, together with the fall of the potential at the node B, the gate potential of the thin film transistor P33, that is, the potential at the node D, falls by an amount corresponding to a charge amount accumulated in the bootstrap complementary capacitor Cb32 as seen from FIG. 46C. The potential after the fall is Vd. When this potential Vd satisfies Vd−VSS1<Vth(P33), upon turning on operation of the thin film transistor P33, the potential at the node B becomes the low potential power supply VSS1 as seen from FIG. 46E.

After the potential at the node B falls to the low potential power supply VSS1 as described above, also the potential at the node A falls to the L level and the thin film transistor P31 is placed into an on state. Consequently, the potential at the output terminal OUT falls as seen in FIG. 46H.

It is to be noted that, together with the fall of the potential at the output terminal OUT, the gate potential of the thin film transistor P31, that is, the potential at the node A, falls by an amount corresponding to a charge amount accumulated in the bootstrap complementary capacitor Cb31 as seen from FIG. 46F. The potential after the fall is Va. When this potential Va satisfies Va−VSS1<Vth(P31), upon turning on operation of the thin film transistor P31, the potential at the output terminal OUT becomes the low potential power supply VSS1 as seen from FIG. 46H.

Incidentally, within the period within which the set pulse has the L level, also the thin film transistor P36 is in an on state. Therefore, the gate potential of the thin film transistor P32 which composes the outputting stage 71, that is, the potential at the node C, is controlled to the high potential power supply VDD as seen in FIG. 46G.

Soon, the set pulse falls from the L level to the H level. However, the storage capacitors Cs1 and Cs2 are connected to the nodes B and C, respectively, and the potential states established when the set pulse has the L level are maintained. Accordingly, the potential states are maintained until the reset pulse changes over from the H level to the L level.

After the reset pulse changes over to the L level as seen in FIG. 46B, now the thin film transistor P35 is placed into an on state and the potential at the node C falls as seen in FIG. 46G. It is to be noted that, together with the fall of the potential at the node C, the gate potential of the thin film transistor P35, that is, the potential at the node E, falls by an amount corresponding to a charge amount accumulated in the bootstrap complementary capacitor Cb33 as seen in FIG. 46D. The potential after the fall is Ve. When the potential Ve satisfies Ve−VSS1<Vth(P35), the potential at the node C upon turning on operation of the thin film transistor P35 becomes the low potential power supply VSS1 as seen in FIG. 46G.

After the potential at the node C falls to the low potential power supply VSS1 as described above, the thin film transistor P32 is placed into an on state and the potential at the output terminal OUT rises to the high potential power supply VDD as seen in FIG. 46H.

Incidentally, within the period within which the reset pulse has the L level, also the thin film transistor P34 is in an on state. Therefore, the potential at the node B is controlled to the high potential power supply VDD as seen in FIG. 46E. Together with this, also the gate potential of the thin film transistor P31 which composes the outputting stage 71, that is, the potential at the node A, rises to the high potential power supply VDD.

Soon, the reset pulse rises from the L level to the H level. However, the storage capacitors Cs1 and Cs2 are connected to the nodes B and C, respectively, and the potential states established when the reset pulse has the L level are maintained. Accordingly, the potential states are maintained until the set pulse changes over from the H level to the L level.

By the operations described above, the buffer circuit 65 is implemented wherein the output pulse falls to the L level at the timing at which the set pulse falls to the L level and the output pulse rises to the H level at the timing at which the reset pulse falls to the L level.

b. Effect

As described above, since the buffer circuit 65 having the circuit configuration of the mode example described above is adopted, the load to be driven by the set pulse and the reset pulse can be restricted to the gate capacitance of the thin film transistors P33 and P36 and the thin film transistors P34 and P35, respectively. Accordingly, the driving capacity demanded for the supply sources of the set pulse and the reset pulse can be reduced. Consequently, the power consumption in the supply sources of the driving pulses can be reduced.

Further, since the first and second input stages are provided, also within a period within which the set pulse and the reset pulse have the H level, supply of a potential to the control wiring lines of the thin film transistors P31 and P32 which compose the outputting stage 71, that is, to the nodes A and C, can be continued. Therefore, also where a current load is connected to the outputting stage 71, the potential of the output pulse can be maintained.

In particular, the buffer circuit according to the mode example can be incorporated into the second control line driving section 35 which drives the lighting control line LSL of the sub pixel 11 shown in FIG. 41. Naturally, the buffer circuit can be applied also to a control line driving section for driving the other control lines. For example, the buffer circuit according to the mode example can be applied also to the first control line driving section 33 for controlling the gate electrode voltage of the thin film transistor in the sub pixel 11.

Further, as seen from FIGS. 46F and 46G, the two thin film transistors P31 and P32 are not controlled to an on state at the same time. In other words, the thin film transistors P31 and P32 operate complementarily. Accordingly, no through-current flows to the outputting stage 71, and a buffer circuit of the one-sided channel type which can carry out operation of the low power consumption type same as that of an output buffer of the CMOS type can be implemented.

C-2. Example 2 of the Mode a. Noticeable Point of the Example 1 of the Mode

As described hereinabove, the buffer circuit 65 of the circuit configuration according to the mode example 1 is a circuit device of the low power consumption type through which no through-current basically flows. Incidentally, in the case of the buffer circuit 65 according to the mode example 1, in order to raise the bootstrap gain, the gate capacitance of the thin film transistors P33 and P35 and the capacitance value of the bootstrap complementary capacitors Cb32 and Cb33 are set to high values.

However, that the capacitance is high signifies that a potential variation of the set pulse or the reset pulse is likely to jump into the output terminals of the input stages, that is, to the nodes B and C. In particular, a phenomenon occurs that the potential at the output terminals, that is, at the nodes B and C, is raised from a supposed potential by a potential variation when the set pulse or the reset pulse varies from the L level to the H level. Thereupon, the gate diffusion capacitance and the bootstrap complementary capacitors Cb32 and Cb33 function as a coupling capacitor. The gate diffusion capacitance is parasitic capacitance between the gate and the source or the gate and the drain of a thin film transistor. The gate capacitance is capacitance between the channel, which is produced when the thin film is operative, and the gate.

FIGS. 47A to 47H illustrate timing charts wherein the gate diffusion capacitance and jumping in of a pulse which occurs through the bootstrap complementary capacitors Cb32 and Cb33 are taken into consideration.

From FIG. 47E, it can be seen that, at the node B, the potential which should be low potential power supply VSS1 rises to Vb1 and the potential which should be the high potential power supply VDD rises to Vb2. Further, from FIG. 47G, it can be seen that, at the node C, the potential which should be the low potential power supply VSS1 rises to Vc2 and the potential which should be the high potential power supply VDD rises to Vc1.

As seen also FIGS. 47A to 47H, within a period within which both of the set pulse and the reset pulse have the H level, the node B and the node C operate in a floating state. Therefore, as far as the circuit configuration shown in FIG. 45 is adopted, the potential rise by jumping in of a pulse cannot be avoided. However, if the jumping in amount of a pulse is small, then this does not matter with operation of the buffer circuit 65. No problem occurs with the driving operation where both of VSS1−Vb1>Vth(P41) and Vc2−VDD<Vth (P32) are satisfied.

If VSS1−Vb1>Vth(P41) is satisfied, then also within a period within which the node A is in a floating state, the thin film transistor P41 is not placed into an on state and the node A can keep the potential Va. Accordingly, the low potential power supply VSS1 is outputted as the L level of the output pulse.

On the other hand, if Vc2−VDD<Vth(P32) is satisfied, then the thin film transistor P32 can be placed into an on state, and the output pulse can be raised to the high potential power supply VDD with certainty.

However, if reduction of the power consumption is taken into consideration, then it becomes a problem that the potential at the nodes B and C rises to a potential higher than the high potential power supply VDD due to jumping in of a pulse.

Figure 48:
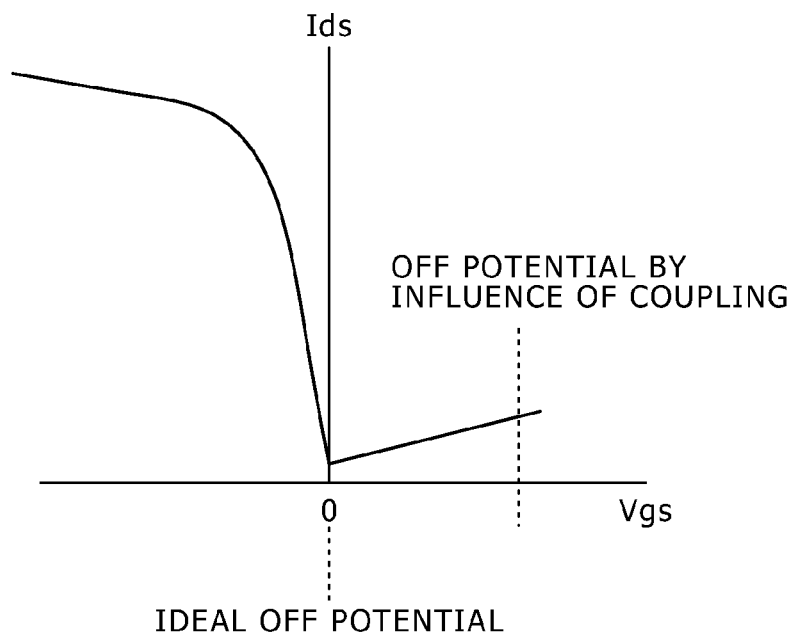
FIG. 48 is a diagram illustrating an Ids-Vgs characteristic of a PMOS transistor.
Figure 49:
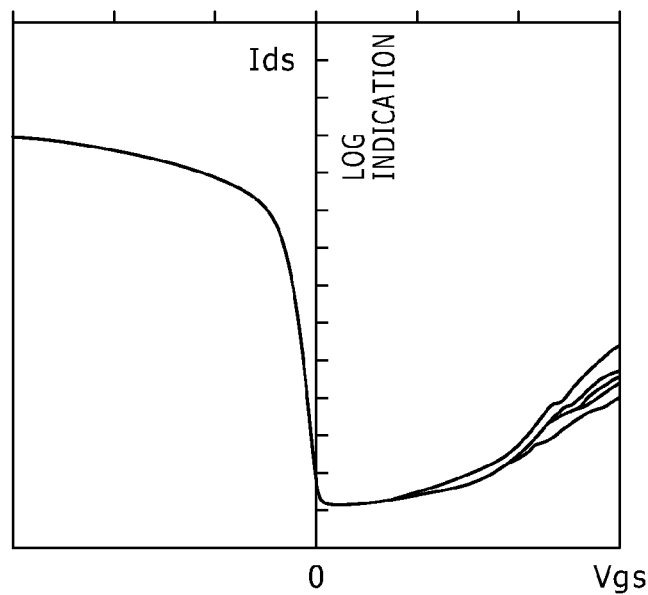
FIG. 49 is a diagram illustrating results of measurement of the Ids-Vgs characteristic of a PMOS transistor.

FIG. 48 illustrates an Ids-Vgs characteristic of a PMOS transistor. As seen in FIG. 48, a PMOS transistor of a popular structure has a tendency that, in a region in which the gate-source voltage Vgs is in the positive (>0), the current Ids increases. This phenomenon is represented that Iback jerks. FIG. 49 illustrates a result of measurement of the Ids-Vgs characteristic of the thin film transistor P41.

From FIG. 49, it can be recognized that the Iback jerks and that there is a dispersion in a jerking manner of the Iback.

From the point of view of the power consumption, that is, from the point of view of minimization of the through-current, it is desired that the gate-source voltage Vgs of the thin film transistors P31 and P32 upon turning off operation is in the proximity of Vgs=0 at which the current Ids is lowest.

However, as described hereinabove, if the potential at the nodes B (or A) and C becomes higher than the high potential power supply VDD (=0 V) as a result of jumping in of a pulse, then the operating point of the thin film transistors P31 and P32 changes to a region in which the Iback jerks. Besides, as seen in FIG. 49, the current Ids in this region is influenced by a characteristic dispersion of the thin film transistor.

Usually, in a complementary circuit, if off current is sufficiently lower than on current, then there is no problem in driving. However, if rising and falling (transient) characteristics of an output pulse are taken into consideration, then the difference in leak current Ids has an influence on the waveform of the output pulse.

b. Circuit Configuration

Therefore, in the present mode example, a circuit configuration is proposed with which the thin film transistors P31 and P32 can operate at an off operating point at which leak current is little and also the dispersion in leak current is little. In particular, a countermeasure for preventing the node B and the node C from entering a floating state within a H-level period, that is, a circuit configuration which can fix the H level of the node B and the node C to the high potential power supply VDD, is proposed.

Figure 50:
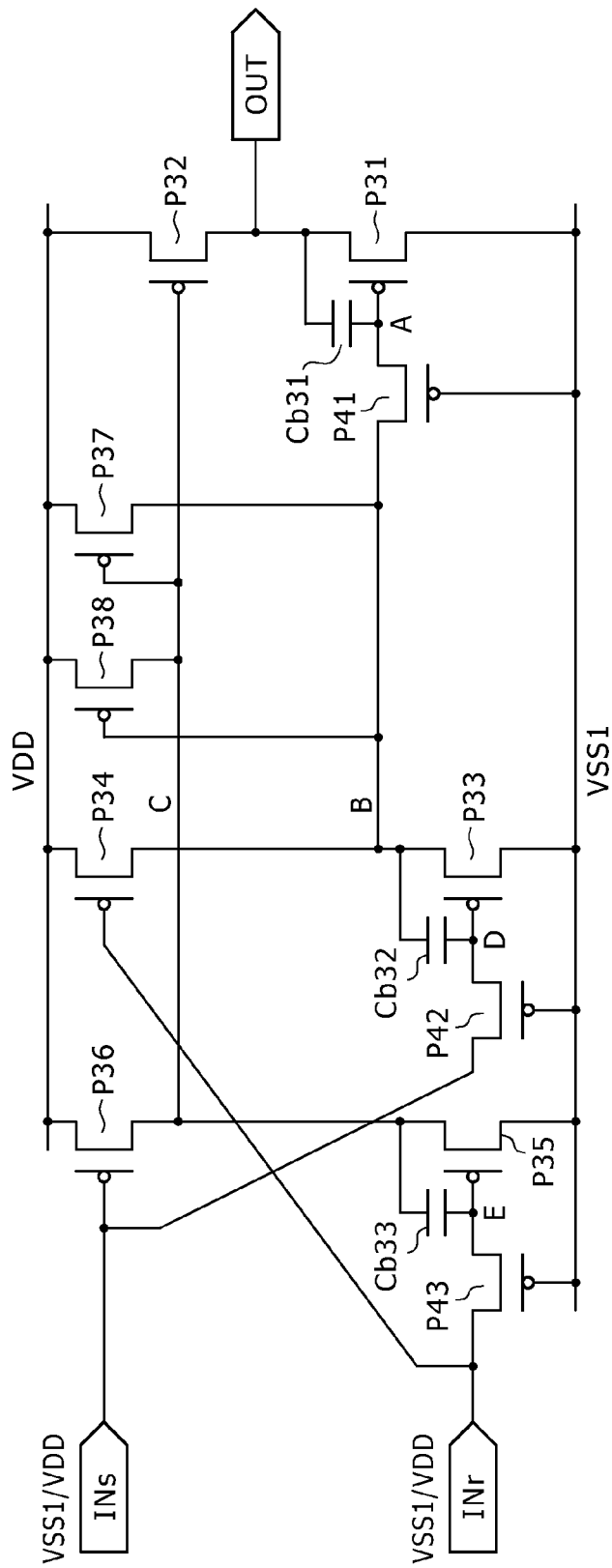
FIG. 50 is a circuit diagram showing another example of a mode of the buffer circuit shown in FIG. 43.

FIG. 50 shows a second mode example of the buffer circuit 65. Those parts shown in FIG. 50 which are identical to those shown in FIG. 45 are denoted by identical reference numerals The buffer circuit 65 according to the present mode example has a basic circuit configuration same as that of the buffer circuit 65 according to the mode example 1 except that the storage capacitors Cs1 and Cs2 are omitted.

The buffer circuit 65 according to the present mode example is different in two points that it includes a thin film transistor P37 for continuing supply of the high potential power supply VDD to the node B within a period within which the node C has the L level and that another thin film transistor P38 for continuing supply of the high potential power supply VDD to the node C within a period within which the node B has the L level.

In particular, the thin film transistor P37 is connected at one of main electrodes thereof to the node B, at the other main electrode thereof to the high potential power supply VDD, and at the gate electrode thereof to the node C.

Meanwhile, the thin film transistor P38 is connected at one of main electrodes thereof to the node C, at the other main electrode thereof to the high potential power supply VDD, and at the gate electrode thereof to the node B.

c. Driving Operation

Now, a relationship of the potential state of the set pulse and the reset pulse and the potential state of the nodes are described with reference to FIGS. 51A to 51H.

It is to be noted that the waveforms shown in FIGS. 51A to 51H correspond to the waveforms of FIGS. 46A to 46H, respectively.

Also in the case of the present mode example, the signal amplitude of the set pulse at the input terminal INs and the signal amplitude of the reset pulse at the input terminal INr are given with two values of the high potential power supply VDD and the low potential power supply VSS1.

First, at the timing at which the set pulse falls to the L level, the potential at the node D of the first inputting stage falls to the L level. Consequently, the thin film transistor P33 is placed into an on state and the potential at the node B falls as seen from FIG. 51E.

Figure 51:
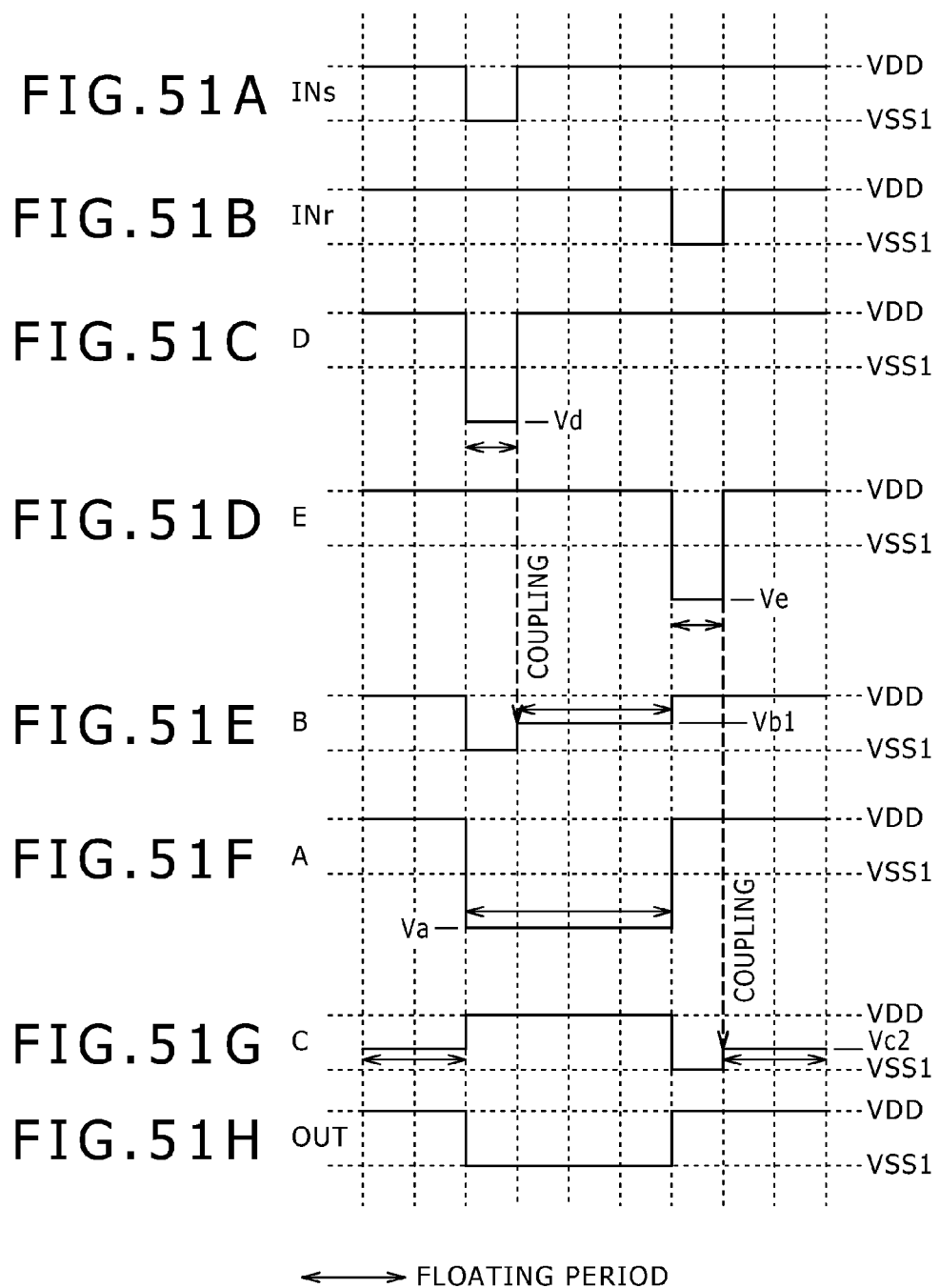
FIGS. 51A to 51H are waveform diagrams illustrating driving waveforms of the buffer circuit shown in FIG. 50.

It is to be noted that, together with the fall of the potential at the node B, the gate potential of the thin film transistor P33, that is, the potential at the node D, falls by an amount corresponding to a charge amount accumulated in the bootstrap complementary capacitor Cb32 as seen from FIG. 51C. When the potential Vd after the fall satisfies Vd−VSS1<Vth(P33), upon turning on operation of the thin film transistor P33, the potential at the node B becomes the low potential power supply VSS1 as seen from FIG. 51E.

After the potential at the node B falls to the low potential power supply VSS1 as described above, also the potential at the node A falls to the L level and the thin film transistor P31 is placed into an on state. Consequently, the potential at the output terminal OUT falls as seen in FIG. 51H.

It is to be noted that, together with the fall of the potential at the output terminal OUT, the gate potential of the thin film transistor P31, that is, the potential at the node A, falls by an amount corresponding to a charge amount accumulated in the bootstrap complementary capacitor Cb31 as seen from FIG. 51F. When the potential Va after the fall satisfies Va−VSS1<Vth(P31), upon turning on operation of the thin film transistor P31, the potential at the output terminal OUT becomes the low potential power supply VSS1 as seen from FIG. 51H.

Incidentally, within a period within which the set pulse has the L level, also the thin film transistor P36 is in an on state. Consequently, the gate potential of the thin film transistor P32 which composes the output stage, that is, the potential at the node C, is controlled to the high potential power supply VDD as seen in FIG. 51G.

Soon, the set pulse rises from the L level to the H level. Upon this variation of the potential, the potential variation of the set pulse jumps into the node B through the capacitive coupling. As seen from FIG. 51E, the potential at the node B rises from the low potential power supply VSS1 to Vb1 while keeping the L level.

At this time, when the potential Vb1 at the node B satisfies Vb1−VDD<Vth(P38), the thin film transistor P38 exhibits an on state and the high potential power supply VDD can be applied to the node C. This signifies that the node C is not influenced by jumping in of the set pulse, that is, the off operating point of the thin film transistor P32 is not displaced.

This potential state is kept while the potential at the node B remains the potential Vb1. In other words, the node C is kept at the high potential power supply VDD until the reset pulse changes over to the L level. As a result, leak current of the thin film transistor P32 can be minimized.

It is to be noted that the potential Vb1 of the node B satisfies VSS1−Vb1>Vth(P41). This is a condition necessary to cause the thin film transistor P41 to operate into an off state to place the node A into a floating state to keep the potential at the node A to the potential Va.

After the reset pulse changes over from the H level to the L level soon as seen in FIG. 51B, now the thin film transistor P35 is placed into an on state and the potential at the node C falls as seen in FIG. 51G. It is to be noted that, together with the fall of the potential at the node C, the gate potential of the thin film transistor P35, that is, the potential at the node E, falls by an amount corresponding to a charge amount accumulated in the bootstrap complementary capacitor Cb33 as seen in FIG. 51D. The potential after the fall is Ve. When the potential Ve satisfies Ve−VSS1<Vth(P35), the potential at the node C upon turning on operation of the thin film transistor P35 becomes the low potential power supply VSS1 as seen in FIG. 51D.

After the potential at the node C falls to the low potential power supply VSS1 as described above, the thin film transistor P32 is placed into an on state and the potential at the output terminal OUT rises to the high potential power supply VDD as seen in FIG. 51H.

Incidentally, within the period within which the reset pulse has the L level, also the thin film transistor P34 is in an on state. Therefore, the potential at the node B is controlled to the high potential power supply VDD as seen in FIG. 51E. Together with this, also the gate potential of the thin film transistor P31 which composes the outputting stage, that is, the potential at the node A, rises to the high potential power supply VDD.

Soon, the reset pulse rises from the L level to the H level. Upon this variation of the potential, the potential variation of the reset pulse jumps into the node C through the capacitive coupling. As seen from FIG. 51G, the potential at the node C rises from the low potential power supply VSS1 to Vc2 while keeping the L level.

At this time, when the potential Vc2 at the node C satisfies Vc2−VDD<Vth(P32), the on state of the thin film transistor P32 continues and the potential at the output terminal OUT is kept at the high potential power supply VDD as seen in FIG. 51H.

Further, when the potential Vc2 at the node C satisfies Vc2−VDD<Vth(P37), the thin film transistor P37 is placed into an on state and the application of the high potential power supply VDD to the node B is continued.

This signifies that the node C is not influenced by jumping in of the set pulse, that is, the off operating point of the thin film transistor P31 is not displaced.

This potential state is kept while the potential at the node C remains the potential Vc2. In other words, the potential at the node B is kept at the high potential power supply VDD until the set pulse changes over to the L level. As a result, the amount of leak current of the thin film transistor P31 can be minimized.

d. Effect

As described above, the buffer circuit 65 having the circuit configuration according to the present mode example can achieve an effect that it is tough against jumping in of a pulse from neighboring wiring lines and also the amount of leak current is little in addition to effects similar to those of the mode example 1.

C-3. Example 3 of the Mode

Here, the buffer circuit 65 according to a modification to the example 2 of the mode is described.

a. Circuit Configuration

Figure 52:
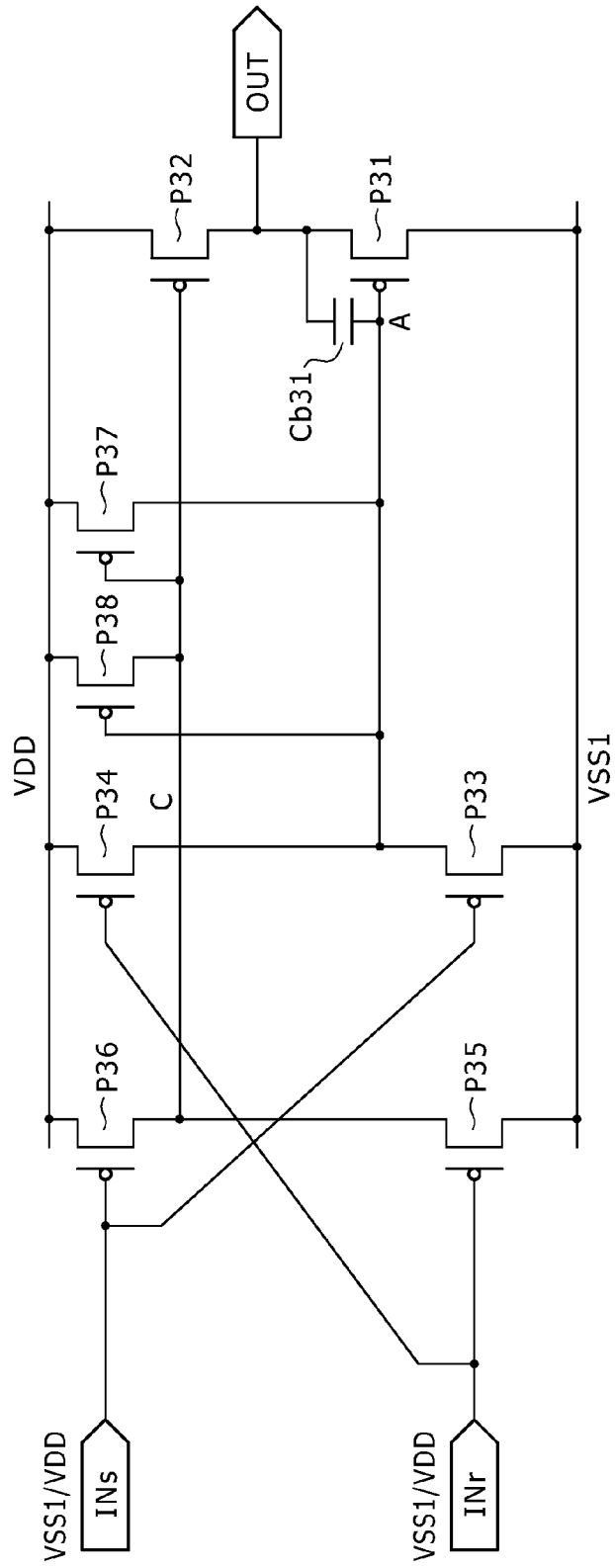
FIG. 52 is a circuit diagram showing a further example of a mode of the buffer circuit shown in FIG. 43.

FIG. 52 shows a third mode example of the buffer circuit 65. Those parts shown in FIG. 52 which are identical to those shown in FIG. 50 are denoted by identical reference numerals.

The buffer circuit 65 according to the present mode example has a circuit configuration same as the circuit configuration of the mode example 2 except that it omits the thin film transistors P41, P42 and P43. This signifies that the buffer circuit 65 does not adopt the bootstrap operation of the first and second input stages.

b. Driving Operation

Now, a relationship between the potential state of the set pulse and the reset pulse and the potential state of the nodes are described with reference to FIGS. 53A to 53E.

FIG. 53A illustrates a potential state of the set pulse at the input terminal INs. FIG. 53B illustrates a potential state of the reset pulse at the input terminal INr.

FIG. 53C illustrates a potential state of the gate electrode wiring line of the thin film transistor P33 at the node A.

FIG. 53D illustrates a potential state of the gate electrode wiring line of the thin film transistor P32 at the node C. FIG. 53E illustrates a state of the potential appearing at the output terminal OUT of the outputting stage.

Also in the case of the present mode example, the signal amplitudes of the set pulse at the input terminal INs and the reset pulse at the input terminal INr are given with two values of the high potential power supply VDD and the low potential power supply VSS1.

In the case of the buffer circuit 65 according to the present mode example, the thin film transistors P33 and P36 are placed into an on state at a timing at which the set pulse falls to the L level. As a result, the potential at the node A falls as seen in FIG. 53C and the potential at the node C rises to the high potential power supply VDD as seen in FIG. 53D.

As the potential at the node A falls, the bootstrap complementary capacitor Cb31 is charged, and at a point of time at which the charged voltage of the bootstrap complementary capacitor Cb31 exceeds its threshold voltage Vth(P31), the thin film transistor P31 is placed into an on state.

As a result, the potential at the output terminal OUT begins to fall. Further, by a bootstrap operation by the potential fall at the output terminal OUT, the potential at the node A falls to the potential Va as seen in FIG. 53C. When the potential Va after the fall satisfies Va−VSS1<Vth(P31), the potential at the output terminal OUT becomes the low potential power supply VSS1 as seen in FIG. 53E.

Soon, the set pulse rises from the L level to the H level. Upon this potential variation, the potential variation of the set pulse tends to jump into the node A by the capacitive coupling. However, the potential at the node A is kept at the potential Va which is equal to a result of subtraction of the voltage across the bootstrap complementary capacitor Cb31 from the potential at the output terminal OUT, that is, from the low potential power supply VSS1 and is little influenced by such jumping in. Accordingly, the potential at the node A remains the potential at the immediately preceding point of time as seen in FIG. 53C.

On the other hand, the node C is controlled to the high potential power supply VDD through a turning on operation of the thin film transistor P38. As a result, the node C is not influenced by jumping in of the set pulse.

This potential state is kept until the reset pulse changes over from the L level to the H level. As a result, the off operating point of the thin film transistor P32 does not fluctuate, and the leak current is minimized.

When the reset pulse changes over to the L level soon as seen in FIG. 53B, now the thin film transistors P34 and P35 are placed into an on state. Together with this, the potential at the node A rises to the high potential power supply VDD as seen in FIG. 53C and the potential at the node C falls as seen in FIG. 53D. However, the potential at the node C is given by a potential higher by the threshold voltage Vth(P35) of the thin film transistor P35 than the low potential power supply VSS1. In other words, the potential at the node C rises to VSS1−Vth(P35). Naturally, VSS1−Vth(P35)−VDD<Vth(P32) is satisfied.

When the node C falls to the L level, the thin film transistor P32 is placed into an on state and the potential at the output terminal OUT rises to the high potential power supply VDD as seen in FIG. 53E.

Incidentally, when the reset pulse has the L level, since also the thin film transistor P34 exhibits an on state, the potential at the node A is controlled to the high potential power supply VDD as seen from FIG. 53C.

Soon, the reset pulse rises from the L level to the H level. Upon this potential variation, the potential variation of the reset pulse jumps into the node C by the capacitive coupling of the thin film transistor P35. The potential at the node C rises to the potential Vc2 while keeping the L level as seen from FIG. 53D.

However, the potential Vc2 at the node C satisfies Vc2−VDD<Vth(P32). As far as this condition is satisfied, the on state of the thin film transistor P32 continues and the application of the high potential power supply VDD to the output terminal OUT continues.

Further, the potential Vc2 at the node C simultaneously satisfies Vc2−VDD<Vth(P37). As far as this condition is satisfied, the thin film transistor P37 exhibits an on state and fixes the potential at the node A to the high potential power supply VDD.

Accordingly, a potential variation of the reset pulse does not jump into the node A through the thin film transistor P34, and the off operating point of the thin film transistor P31 is not displaced.

This potential state is maintained while the potential at the node C remains the potential Vc2. In other words, the potential at the node A is kept at the high potential power supply VDD until the set pulse subsequently changes over to the L level. As a result, the leak current of the thin film transistor P31 can be minimized.

c. Effect

As described above, with the buffer circuit 65 having the circuit configuration according to the present mode example, similar effects to those of the mode example 2 described hereinabove can be achieved with a reduced number of elements.

C-4. Example 4 of the Mode

Here, the buffer circuit 65 according to another modification to the mode example 2 is described.

a. Circuit Configuration

Figure 54:
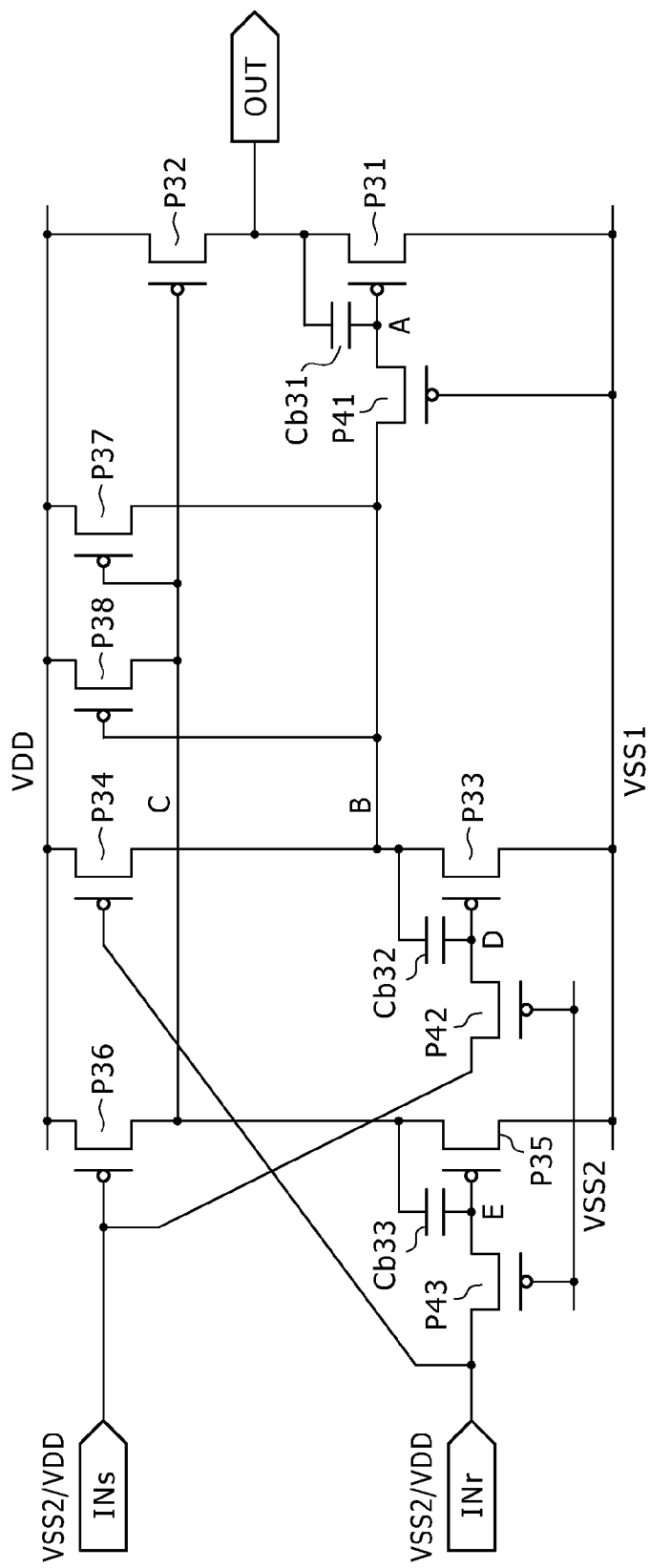
FIG. 54 is a circuit diagram showing a still further example of a mode of the buffer circuit shown in FIG. 43.

FIG. 54 shows a fourth mode example of the buffer circuit 65. Those parts shown in FIG. 54 which are identical to those shown in FIG. 50 are denoted by identical reference numerals.

The buffer circuit 65 according to the present mode example corresponds to a circuit configuration which implements level shifting at the first and second input stages of the circuit configuration according to the mode example 2.

Therefore, the buffer circuit 65 adopts a structure that the thin film transistors P42 and P43 which compose the first and second input stages are connected at the gate electrode thereof to a second high potential power supply VSS2 (>VSS1). Consequently, the amplitude of the set pulse and the reset pulse can be reduced and further reduction of the power consumption of a preceding stage circuit can be implements.

b. Driving Operation

Now, a relationship of the potential state of the set pulse and the reset pulse and the potential state of the nodes are described with reference to FIGS. 55A to 55H. It is to be noted that the waveforms shown in FIGS. 55A to 55H correspond to the waveforms of FIGS. 51A to 51H, respectively.

Also in the case of the present mode example, the signal amplitudes of the set pulse at the input terminal INs and the reset pulse at the input terminal INr are given with two values of the high potential power supply VDD and the second low potential power supply VSS2 (>VSS1) as seen in FIGS. 55A and 55B.

First, the thin film transistors P33 and P36 are placed into an on state at a timing at which the set pulse falls to the L level. It is to be noted that the thin film transistor P42 is placed into a diode connection by an input of the set pulse of the L level and lowers the potential at the node D. Consequently, the thin film transistor P33 is placed into an on state, and the potential at the node B falls as seen in FIG. 55E.

Together with the fall of the potential at the node B, the gate potential of the thin film transistor P33, that is, the potential at the node D, falls by an amount corresponding to a charge amount accumulated in the bootstrap complementary capacitor Cb32 as seen from FIG. 55C. When the potential Vd after the fall satisfies Vd−VSS1<Vth(P33), upon turning on operation of the thin film transistor P33, the potential at the node B becomes the low potential power supply VSS1 as seen from FIG. 55E. In other words, level shifting of the set pulse is carried out.

After the potential at the node B falls to the low potential power supply VSS1 as described above, the thin film transistor P31 is placed into an on state and the potential at the output terminal OUT falls as seen in FIG. 55H.

It is to be noted that, together with the fall of the potential at the output terminal OUT, the gate potential of the thin film transistor P31, that is, the potential at the node A, falls by an amount corresponding to a charge amount accumulated in the bootstrap complementary capacitor Cb31 as seen from FIG. 55F. When the potential Va after the fall satisfies Va−VSS1<Vth(P31), upon turning on operation of the thin film transistor P31, the potential at the output terminal OUT becomes the low potential power supply VSS1 as seen from FIG. 55H.

At this time, the node C is controlled to the high potential power supply VDD by the thin film transistor P36 which is placed into an on state as seen in FIG. 55G.

Soon, the set pulse rises from the L level to the H level. Upon this variation of the potential, the potential variation of the set pulse jumps into the node B through the capacitive coupling. As seen from FIG. 55E, the potential at the node B rises from the low potential power supply VSS1 to Vb1 while keeping the L level.

At this time, when the potential Vb1 at the node B satisfies Vb1−VDD<Vth(P38), the thin film transistor P38 exhibits an on state and the high potential power supply VDD is applied to the node C. This signifies that the node C is not influenced by jumping in of the set pulse, that is, the off operating point of the thin film transistor P32 is not displaced.

This potential state is kept while the potential at the node B remains the potential Vb1. In other words, the node C is kept at the high potential power supply VDD until the reset pulse changes over to the L level. As a result, leak current of the thin film transistor P32 can be minimized.

It is to be noted that the potential Vb1 of the node B satisfies VSS1−Vb1>Vth(P41). This is a condition necessary to cause the thin film transistor P41 to operate into an off state to keep the potential at the node A to the potential Va.

When the reset pulse changes over from the H level to the L level soon as seen in FIG. 55B, now the thin film transistors P34 and P35 are placed into an on state. It is to be noted that the thin film transistor P43 is placed into a diode connection by an input of the reset pulse of the L level and the potential of the node E rises. By the operation, the thin film transistor P35 is placed into an on state and the potential at the node C falls as seen in FIG. 55G.

Together with the fall of the potential at the node C, the gate potential of the thin film transistor P35, that is, the potential at the node E, falls by an amount corresponding to a charge amount accumulated in the bootstrap complementary capacitor Cb33 as seen from FIG. 55D. When the potential Ve after the fall satisfies Ve−VSS1<Vth(P35), upon turning on operation of the thin film transistor P35, the potential at the node C becomes the low potential power supply VSS1 as seen from FIG. 55G. In other words, level shifting of the reset pulse is executed.

After the potential at the node C falls to the low potential power supply VSS1 as described above, the thin film transistor P32 is placed into an on state and the potential at the output terminal OUT rises to the high potential power supply VDD as seen in FIG. 55H.

Incidentally, within the period which the reset pulse has the L level, also the thin film transistor P34 is in an on state. Therefore, the potential at the node B is controlled to the high potential power supply VDD as seen in FIG. 55E. Together with this, also the gate potential of the thin film transistor P31 which composes the outputting stage 71, that is, the potential at the node A, rises to the high potential power supply VDD as seen in FIG. 55F.

Soon, the reset pulse rises from the L level to the H level. Upon this variation of the potential, the potential variation of the reset pulse jumps into the node C through the capacitive coupling. As seen from FIG. 55G, the potential at the node C rises from the low potential power supply VSS1 to Vc2 while keeping the L level.

At this time, when the potential Vc2 at the node C satisfies Vc2−VDD<Vth(P32), the on state of the thin film transistor P32 continues and the potential at the output terminal OUT is kept at the high potential power supply VDD as seen in FIG. 55H.

Further, when the potential Vc2 at the node C satisfies Vc2−VDD<Vth(P32), the thin film transistor P37 is placed into an on state and the application of the high potential power supply VDD to the node B is continued.

This signifies that the node C is not influenced by jumping in of the set pulse, that is, the off operating point of the thin film transistor P31 is not displaced.

This potential state is kept while the potential at the node C remains the potential Vc2. In other words, the potential at the node B is kept at the high potential power supply VDD until the set pulse changes over to the L level. As a result, the source current of the thin film transistor P31 can be minimized.

c. Effect

As described above, also the buffer circuit 65 having the circuit configuration according to the present mode example is tough against jumping in of a pulse from neighboring wiring lines and exhibits low leak current.

Further, with the buffer circuit 65 of the circuit configuration according to the present mode example, the signal amplitude of the set pulse and the reset pulse can be reduced with respect to the signal amplitude of the output pulse. Consequently, the power consumption at a circuit such as, for example, a shift register at the preceding stage can be reduced from that of the other examples of the form.

C-5. Example 5 of the Mode

Here, the buffer circuit 65 according to a further modification to the mode example 2 is described.

a. Circuit Configuration

Figure 56:
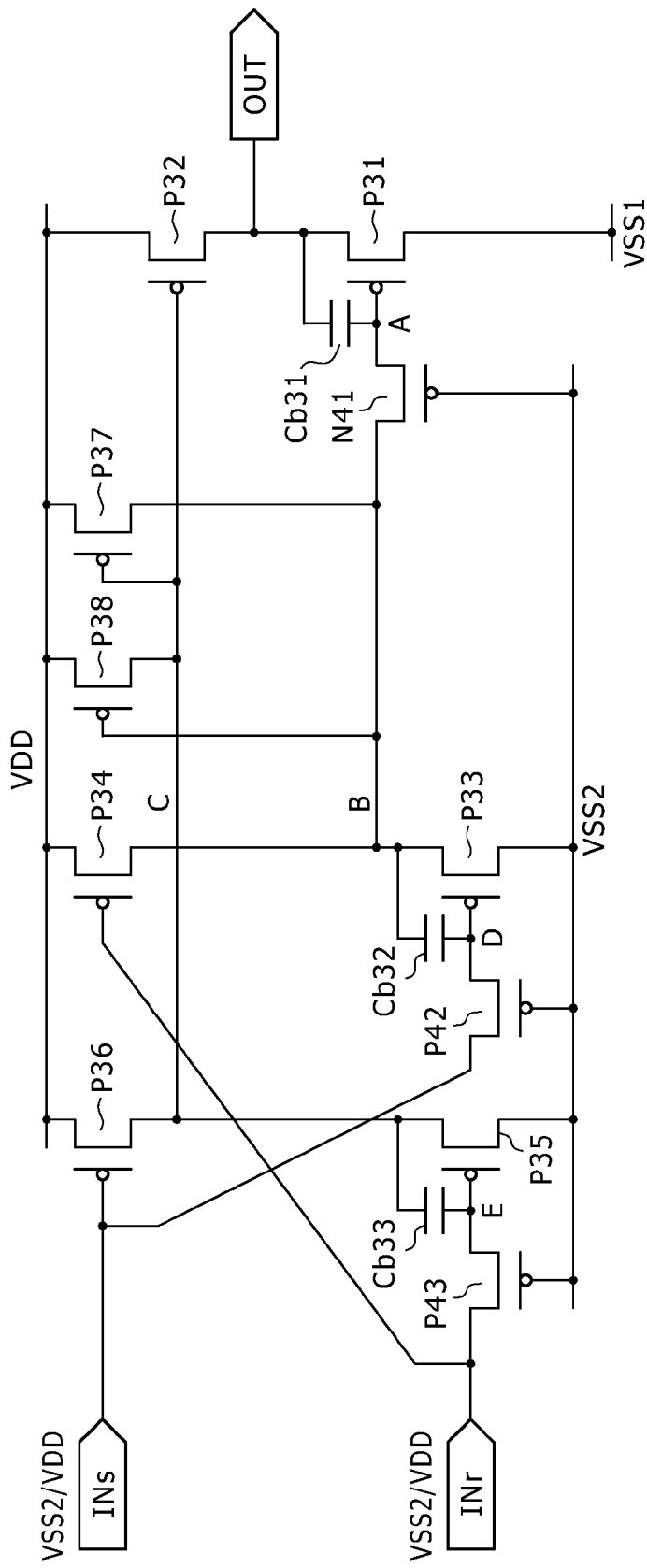
FIG. 56 is a circuit diagram showing a yet further example of a mode of the buffer circuit shown in FIG. 43.

FIG. 56 shows a fifth mode example of the buffer circuit 65. Those parts shown in FIG. 56 which are identical to those shown in FIG. 54 are denoted by identical reference numerals.

The buffer circuit 65 according to the present mode example corresponds to a circuit configuration which implements level shifting at the outputting stage of the circuit configuration according to the mode example 2.

Therefore, the buffer circuit 65 adopts a structure wherein the first low potential power supply VSS1 is applied only to the thin film transistors P31 and P32 positioned at the last position of the outputting stage while the second low potential power supply VSS2 (<VSS1) is applied to the thin film transistors at the preceding positions to the thin film transistors P31 and P32. By the structure, further reduction in power consumption in the buffer circuit 65 can be implemented in addition to reduction in amplitude of the set pulse and the reset pulse.

b. Driving Operation

Now, a relationship of the potential state of the set pulse and the reset pulse and the potential state of the nodes are described with reference to FIGS. 57A to 57H. It is to be noted that the waveforms shown in FIGS. 57A to 57H correspond to the waveforms of FIGS. 55A to 55H, respectively.

Figure 57:
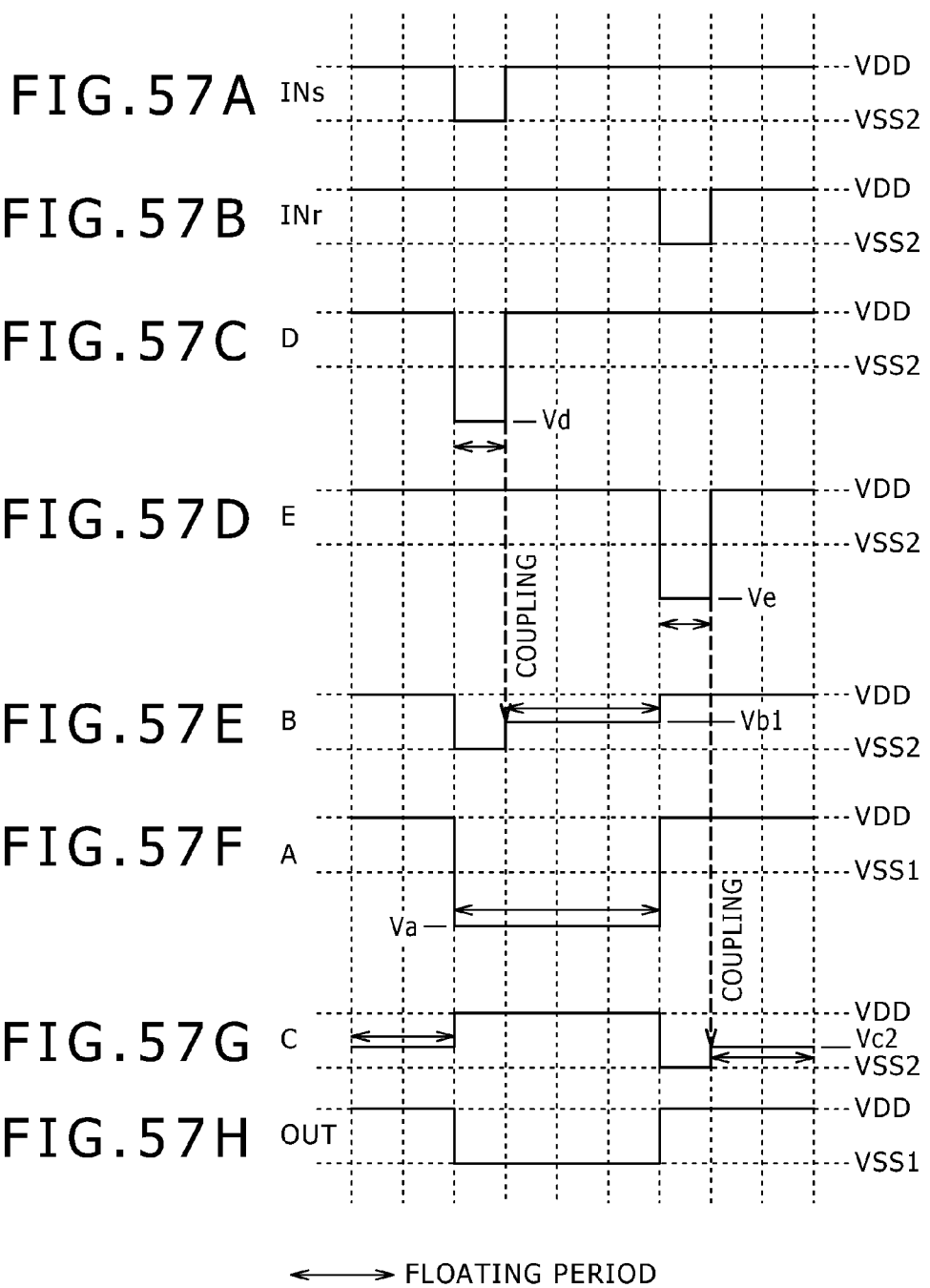
FIGS. 57A to 57H are waveform diagrams illustrating driving waveforms of the buffer circuit shown in FIG. 56.

It is to be noted that the signal amplitudes of the set pulse at the input terminal INs and the reset pulse at the input terminal INr are given with two values of the high potential power supply VDD and the second low potential power supply VSS2 as seen in FIGS. 57A and 57B.

First, the thin film transistors P33 and P36 are placed into an on state at a timing at which the set pulse falls to the L level. It is to be noted that the thin film transistor P42 is placed into a diode connection by an input of the set pulse of the L level and lowers the potential at the node D. Consequently, the thin film transistor P33 is placed into an on state, and the potential at the node B falls as seen in FIG. 57E.

Together with the fall of the potential at the node B, the gate potential of the thin film transistor P33, that is, the potential at the node D, falls by an amount corresponding to a charge amount accumulated in the bootstrap complementary capacitor Cb32 as seen from FIG. 57C. When the potential Vd after the fall satisfies Vd−VSS2<Vth(P33), upon turning on operation of the thin film transistor P33, the potential at the node B becomes the low potential power supply VSS2 as seen from FIG. 57E. In other words, level shifting of the set pulse is carried out.

After the potential at the node B falls to the second low potential power supply VSS2 as described above, also the potential at the node A falls to the L level to place the thin film transistor P31 into an on state and the potential at the output terminal OUT falls as seen in FIG. 57H.

It is to be noted that, together with the fall of the potential at the output terminal OUT, the gate potential of the thin film transistor P31, that is, the potential at the node A, falls by an amount corresponding to a charge amount accumulated in the bootstrap complementary capacitor Cb31 as seen from FIG. 57F. When the potential Va after the fall satisfies Va−VSS1<Vth(P31), upon turning on operation of the thin film transistor P31, the potential at the output terminal OUT becomes the low potential power supply VSS1 as seen from FIG. 57H. In other words, the pulse level is shifted.

Further, when the set pulse has the L level, the node C is controlled to the high potential power supply VDD by the thin film transistor P36 which is placed into an on state as seen in FIG. 57G.

Soon, the set pulse rises from the L level to the H level. Upon this variation of the potential, the potential variation of the set pulse jumps into the node B through the capacitive coupling. As seen from FIG. 57E, the potential at the node B rises from the low potential power supply VSS1 to Vb1 while keeping the L level.

At this time, when the potential Vb1 at the node B satisfies Vb1−VDD<Vth(P38), the thin film transistor P38 exhibits an on state and the application of the high potential power supply VDD to the node C is continued. This signifies that the node C is not influenced by jumping in of the set pulse, that is, the off operating point of the thin film transistor P32 is not displaced.

This potential state is kept while the potential at the node B remains the potential Vb1. In other words, the node C is kept at the high potential power supply VDD until the reset pulse changes over to the L level. As a result, leak current of the thin film transistor P32 can be minimized.

It is to be noted that the potential Vb1 of the node B satisfies VSS1−Vb1>Vth(P41). This is a condition necessary to cause the thin film transistor P41 to operate into an off state to keep the potential at the node A to the potential Va.

When the reset pulse changes over from the H level to the L level soon as seen in FIG. 57B, now the thin film transistors P34 and P35 are placed into an on state. It is to be noted that the thin film transistor P43 is placed into a diode connection by an input of the reset pulse of the L level and the potential of the node E falls. By the operation, the thin film transistor P35 is placed into an on state and the potential at the node C falls as seen in FIG. 57G.

Together with the fall of the potential at the node C, the gate potential of the thin film transistor P35, that is, the potential at the node E, falls by an amount corresponding to a charge amount accumulated in the bootstrap complementary capacitor Cb33 as seen from FIG. 57D. When the potential Ve after the fall satisfies Ve−VSS2<Vth(P35), upon turning on operation of the thin film transistor P35, the potential at the node C becomes the low potential power supply VSS2 as seen from FIG. 57G.

After the potential at the node C falls to the low potential power supply VSS2 as described above, the thin film transistor P32 is placed into an on state and the potential at the output terminal OUT rises to the high potential power supply VDD as seen in FIG. 57H.

Incidentally, within the period within which the reset pulse has the L level, also the thin film transistor P34 is in an on state. Therefore, the potential at the node B is controlled to the high potential power supply VDD as seen in FIG. 57E. Together with this, also the gate potential of the thin film transistor P31 which composes the outputting stage 71, that is, the potential at the node A, rises to the high potential power supply VDD as seen in FIG. 57F.

Soon, the reset pulse rises from the L level to the H level. Upon this variation of the potential, the potential variation of the reset pulse jumps into the node C through the capacitive coupling. As seen from FIG. 57G, the potential at the node C rises from the low potential power supply VSS2 to Vc2 while keeping the L level.

At this time, when the potential Vc2 at the node C satisfies Vc2−VDD<Vth(P32), the on state of the thin film transistor P32 continues and the potential at the output terminal OUT is kept at the high potential power supply VDD as seen in FIG. 57H.

Further, when the potential Vc2 at the node C satisfies Vc2−VDD<Vth(P37), the thin film transistor P37 is placed into an on state and the application of the high potential power supply VDD to the node B is continued.

This signifies that the node C is not influenced by jumping in of the set pulse, that is, the off operating point of the thin film transistor P31 is not displaced.

This potential state is kept while the potential at the node C remains the potential Vc2. In other words, the potential at the node B is kept at the high potential power supply VDD until the set pulse changes over to the L level. As a result, the source current of the thin film transistor P31 can be minimized.

c. Effect

As described above, in the buffer circuit 65 of the circuit configuration according to the present mode example, not only the signal amplitude of the set pulse and the reset pulse can be reduced with respect to the signal amplitude of the output pulse, but also reduction in amplitude in the inside of the buffer circuit other than at the last outputting stage can be implemented. Therefore, the power to be consumed not only by the preceding stage circuit such as, for example, a shift register but also by the buffer circuit 65 can be reduced in comparison with the other mode examples described above.

C-6. Example 6 of the Mode

Here, the buffer circuit 65 according to a still further modification to the example 2 of the mode is described.

a. Circuit Configuration

Figure 58:
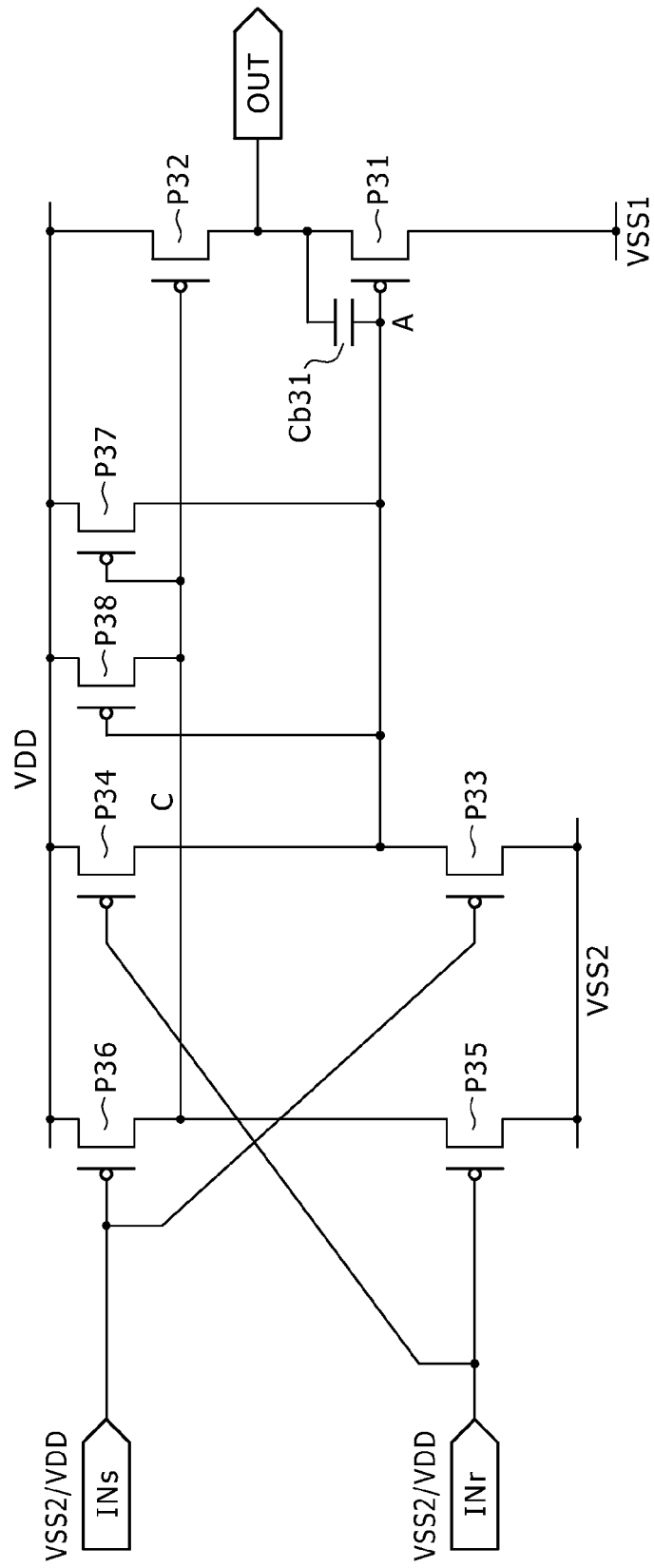
FIG. 58 is a circuit diagram showing a yet further example of a mode of the buffer circuit shown in FIG. 43.

FIG. 58 shows a sixth mode example of the buffer circuit 65.

The buffer circuit 65 according to the present mode example has a circuit configuration same as the circuit configuration of the mode example 5 except that it omits the thin film transistors P41, P42 and P43. This signifies that the buffer circuit 65 does not adopt the bootstrap operation of the first and second input stages.

b. Driving Operation

Now, a relationship between the potential state of the set pulse and the reset pulse and the potential state of the nodes are described with reference to FIGS. 59A to 59E.

Figure 59:
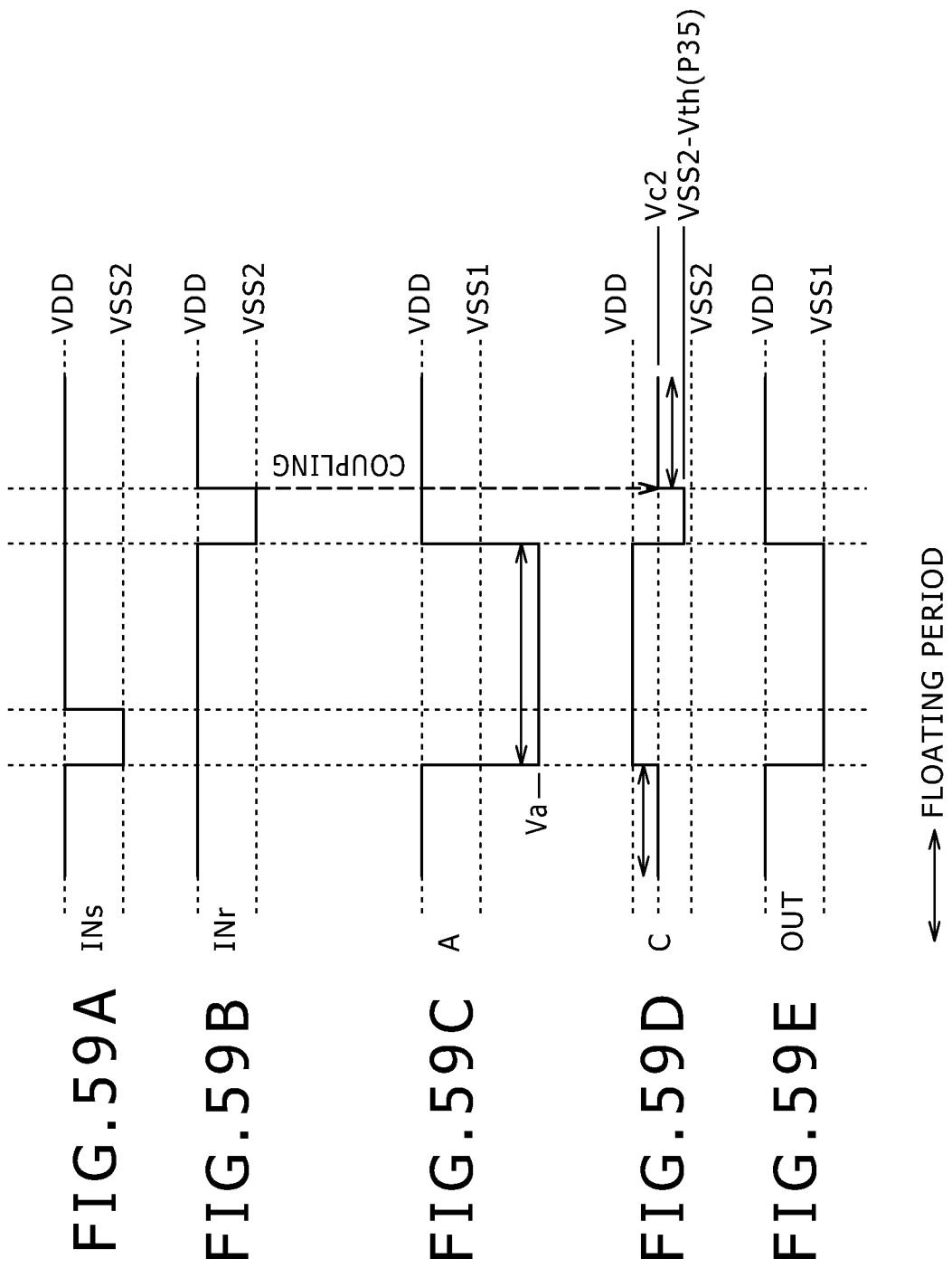
FIGS. 59A to 59E are waveform diagrams illustrating driving waveforms of the buffer circuit shown in FIG. 58.

FIG. 59A illustrates a potential state of the set pulse at the input terminal INs. FIG. 59B illustrates a potential state of the reset pulse at the input terminal INr.

FIG. 59C illustrates a potential state of the gate electrode wiring line of the thin film transistor P31 at the node A.

FIG. 59D illustrates a potential state of the gate electrode wiring line of the thin film transistor P32 at the node C. FIG. 59E illustrates a state of the potential appearing at the output terminal OUT of the outputting stage.

Also in the case of the present mode example, the signal amplitudes of the set pulse at the input terminal INs and the reset pulse at the input terminal INr are given with two values of the high potential power supply VDD and the second low potential power supply VSS2 (>VSS1) as seen in FIGS. 59A and 59B.

In the case of the buffer circuit 65 according to the present mode example, the thin film transistors P33 and P36 are placed into an on state at a timing at which the set pulse falls to the L level. As a result, the potential at the node A falls as seen in FIG. 59C and the potential at the node C rises to the high potential power supply VDD as seen in FIG. 59D.

As the potential at the node A rises, the bootstrap complementary capacitor Cb31 is charged, and at a point of time at which the charged voltage of the bootstrap complementary capacitor Cb31 exceeds its threshold voltage Vth(P31), the thin film transistor P31 is placed into an on state.

As a result, the potential at the output terminal OUT begins to fall. Further, by a bootstrap operation by the potential fall at the output terminal OUT, the potential at the node A falls to the potential Va as seen in FIG. 59C. When the potential Va after the fall satisfies Va−VSS1<Vth(P31), the potential at the output terminal OUT becomes the low potential power supply VSS1 as seen in FIG. 59E. In other words, the set pulse is level shifted.

Soon, the set pulse rises from the L level to the H level. Upon this potential variation, the potential variation of the set pulse tends to jump into the node A by the capacitive coupling. However, the potential at the node A is kept at the potential Va which is equal to a result of subtraction of the voltage across the bootstrap complementary capacitor Cb31 from the potential at the output terminal OUT, that is, from the low potential power supply VSS1 and is little influenced by such jumping in. Accordingly, the potential at the node A remains the potential at the immediately preceding point of time as seen in FIG. 59C.

Incidentally, the node C is controlled to the high potential power supply VDD through the thin film transistor P38 which is in an on state. As a result, the node C is not influenced by jumping in of the set pulse.

This potential state is kept until the reset pulse changes over from the H level to the L level. As a result, the off operating point of the thin film transistor P32 does not fluctuate, and the leak current is minimized.

When the reset pulse changes over to the L level soon as seen in FIG. 59B, now the thin film transistors P34 and P35 are placed into an on state. Together with this, the potential at the node A rises to the high potential power supply VDD as seen in FIG. 59C and the potential at the node C falls as seen in FIG. 59D. However, the potential at the node C is given by a potential higher by the threshold voltage Vth(P35) of the thin film transistor P35 than the second low potential power supply VSS2. In other words, the potential at the node C rises to VSS2−Vth(P35). Naturally, VSS2−Vth(P35)−VDD<Vth(P32) is satisfied.

When the node C falls to the L level, the thin film transistor P32 is placed into an on state and the potential at the output terminal OUT rises to the high potential power supply VDD as seen in FIG. 59E.

when the reset pulse has the L level, since also the thin film transistor P34 exhibits an on state, the potential at the node A is controlled to the high potential power supply VDD as seen from FIG. 59C.

Soon, the reset pulse rises from the L level to the H level. Upon this potential variation, the potential variation of the reset pulse jumps into the node C by the capacitive coupling of the thin film transistor P35. The potential at the node C rises to the potential Vc2 while keeping the L level as seen from FIG. 59D.

However, the potential Vc2 at the node C satisfies Vc2−VDD<Vth(P32). As far as this condition is satisfied, the on state of the thin film transistor P32 continues and the application of the high potential power supply VDD to the output terminal OUT continues.

Further, the potential Vc2 at the node C simultaneously satisfies Vc2−VDD<Vth(P37). As far as this condition is satisfied, the thin film transistor P37 exhibits an on state and fixes the potential at the node A to the high potential power supply VDD.

Accordingly, a potential variation of the reset pulse does not jump into the node A through the thin film transistor P34, and the off operating point of the thin film transistor P31 is not displaced.

This potential state is maintained while the potential at the node C remains the potential Vc2. In other words, the potential at the node A is kept at the high potential power supply VDD until the set pulse subsequently changes over to the L level. As a result, the leak current of the thin film transistor P31 can be minimized.

c. Effect

As described above, with the buffer circuit 65 having the circuit configuration according to the present mode example, similar effects to those of the mode example 5 described hereinabove can be achieved with a reduced number of elements.

C-7. Example 7 of the Mode

Here, the buffer circuit 65 according to a yet further modification to the example 2 of the mode is described.

a. Circuit Configuration

Figure 60:
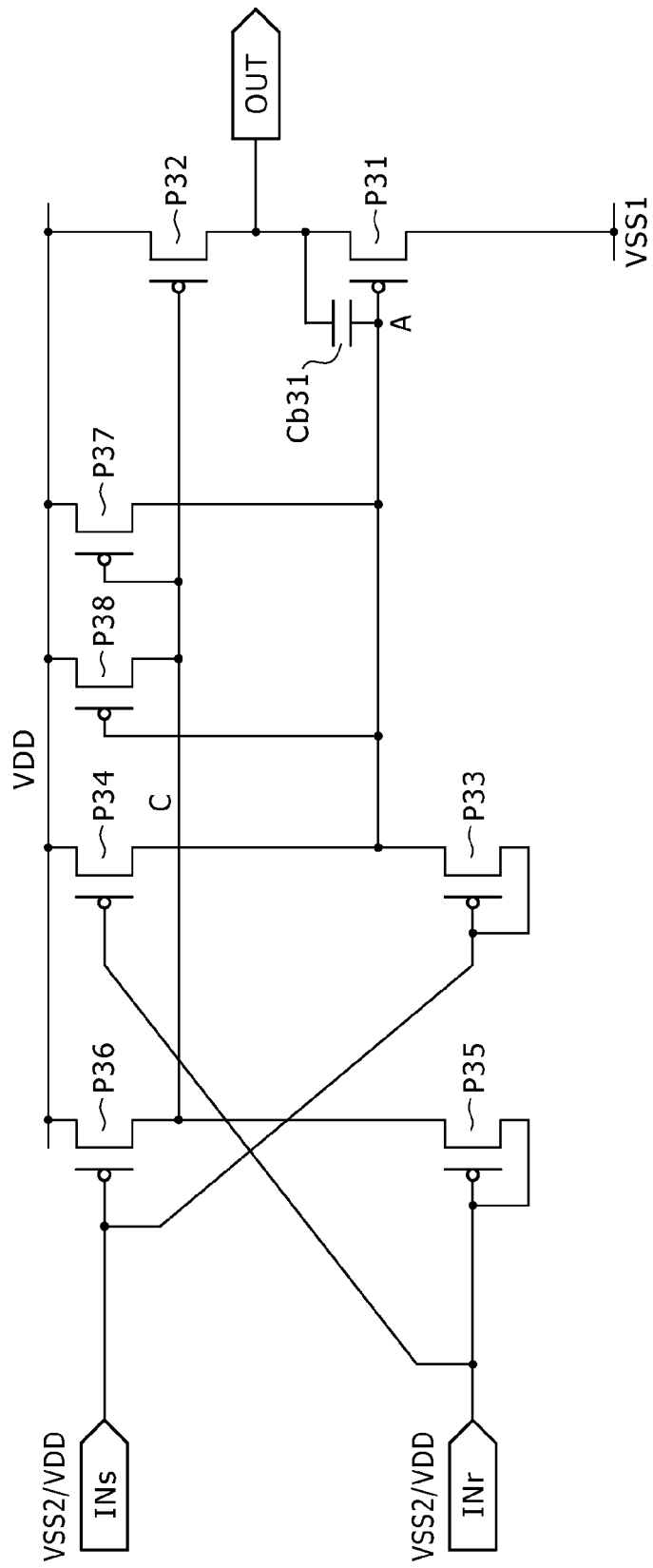
FIG. 60 is a circuit diagram showing a yet further example of a mode of the buffer circuit shown in FIG. 43.

FIG. 60 shows a seventh mode example of the buffer circuit 65. Those parts shown in FIG. 60 which are identical to those shown in FIG. 58 are denoted by identical reference numerals.

The buffer circuit 65 according to the present mode example has a circuit configuration same as the circuit configuration described hereinabove in connection with the mode example 6 from which the wiring lines for supplying the second low potential power supply VSS2 are omitted. Therefore, the buffer circuit 65 has a circuit configuration wherein the thin film transistors P33 and P35 are connected in diode connection.

It is to be noted that, although, in the buffer circuit 65 shown in FIG. 60, the signal amplitude of the set pulse and the reset pulse is defined by the high potential power supply VDD and the second low potential power supply VSS2 since the buffer circuit 65 adopts the driving method wherein level shifting is executed at the outputting stage, where level shifting is not executed, the signal amplitude of the set pulse and the reset pulse may be defined by the high potential power supply VDD and the first low potential power supply VSS1.

b. Driving Operation

Now, a relationship of the potential state of the set pulse and the reset pulse and the potential state of the nodes are described with reference to FIGS. 61A to 61E. It is to be noted that the waveforms shown in FIGS. 61A to 61E correspond to the waveforms of FIGS. 59A to 59E, respectively.

Also in the case of the present mode example, the signal amplitudes of the set pulse at the input terminal INs and the reset pulse at the input terminal INr are given with two values of the high potential power supply VDD and the second low potential power supply VSS2 (>VSS1) as seen in FIGS. 61A and 61B.

In the case of the buffer circuit 65 according to the present mode example, the thin film transistors P33 and P36 are placed into an on state at a timing at which the set pulse falls to the L level. As a result, the potential at the node A falls as seen in FIG. 61C and the potential at the node C rises to the high potential power supply VDD as seen in FIG. 61D.

As the potential at the node A falls, the bootstrap complementary capacitor Cb31 is charged, and at a point of time at which the charged voltage of the bootstrap complementary capacitor Cb31 exceeds its threshold voltage Vth(P31), the thin film transistor P31 is placed into an on state.

As a result, the potential at the output terminal OUT begins to fall. Further, by a bootstrap operation by the potential fall at the output terminal OUT, the potential at the node A falls to the potential Va as seen in FIG. 61C. When the potential Va after the fall satisfies Va−VSS1<Vth(P31), the potential at the output terminal OUT becomes the low potential power supply VSS1 as seen in FIG. 61E. In other words, the set pulse is level shifted.

Soon, the set pulse rises from the L level to the H level. Upon this potential variation, the potential variation of the set pulse tends to jump into the node A by the capacitive coupling. However, the potential at the node A is kept at the potential Va which is equal to a result of subtraction of the voltage across the bootstrap complementary capacitor Cb31 from the potential at the output terminal OUT, that is, from the low potential power supply VSS1 and is little influenced by such jumping in.

Accordingly, the potential at the node A remains the potential at the immediately preceding point of time as seen in FIG. 61C.

Meanwhile, the node C is controlled to the high potential power supply VDD through the thin film transistor P38 which is in an on state. As a result, the node C is not influenced by jumping in of the set pulse.

This potential state is kept until the reset pulse changes over from the H level to the L level. As a result, the off operating point of the thin film transistor P32 does not fluctuate, and the leak current is minimized.

When the reset pulse changes over to the L level soon as seen in FIG. 61B, now the thin film transistors P34 and P35 are placed into an on state. Together with this, the potential at the node A rises to the high potential power supply VDD as seen in FIG. 61C and the potential at the node C falls as seen in FIG. 61D. However, the potential at the node C is given by a potential higher by the threshold voltage Vth(P35) of the thin film transistor P35 than the low potential power supply VSS2. In other words, the potential at the node C falls to VSS2−Vth(P35). Naturally, VSS2−Vth(P35)−VDD<Vth(P32) is satisfied.

When the node C falls to the L level, the thin film transistor P32 is placed into an on state and the potential at the output terminal OUT rises to the high potential power supply VDD as seen in FIG. 61E.

Incidentally, when the reset pulse has the L level, since also the thin film transistor P34 exhibits an on state, the potential at the node A is controlled to the high potential power supply VDD as seen from FIG. 61C.

Soon, the reset pulse rises from the L level to the H level. Upon this potential variation, the potential variation of the reset pulse jumps into the node C by the capacitive coupling of the thin film transistor P35. The potential at the node C rises to the potential Vc2 while keeping the L level as seen from FIG. 61D.

However, the potential Vc2 at the node C satisfies Vc2−VDD<Vth(P32). As far as this condition is satisfied, the on state of the thin film transistor P32 continues and the application of the high potential power supply VDD to the output terminal OUT continues.

Further, the potential Vc2 at the node C need simultaneously satisfy Vc2−VDD<Vth(P37). As far as this condition is satisfied, the thin film transistor P37 exhibits an on state and fixes the potential at the node A to the high potential power supply VDD.

Accordingly, a potential variation of the reset pulse does not jump into the node A through the thin film transistor P34, and the off operating point of the thin film transistor P31 is not displaced.

This potential state is maintained while the potential at the node C remains the potential Vc2. In other words, the potential at the node A is kept at the high potential power supply VDD until the set pulse subsequently changes over to the L level. As a result, the leak current of the thin film transistor P31 can be minimized.

c. Effect

As described above, with the buffer circuit 65 of the circuit configuration according to the present mode example, the wiring lines for the second low potential power supply can be reduced from the circuit layout of the mode example 6 described hereinabove. As a result, operation and effects similar to those of the mode example 6 can be implemented with a reduced layout area.

C-8. Example 8 of the Mode

Also here, the buffer circuit 65 according to an additional modification to the second mode example is described. In the mode examples described above, a set of a set pulse and a reset pulse are inputted to a buffer circuit. However, it is possible to form also a buffer circuit to which a plurality of sets of a set pulse and a reset pulse are inputted.

Here, a buffer circuit to which two sets of a set pulse and a reset pulse are inputted is disclosed.

Figure 62:
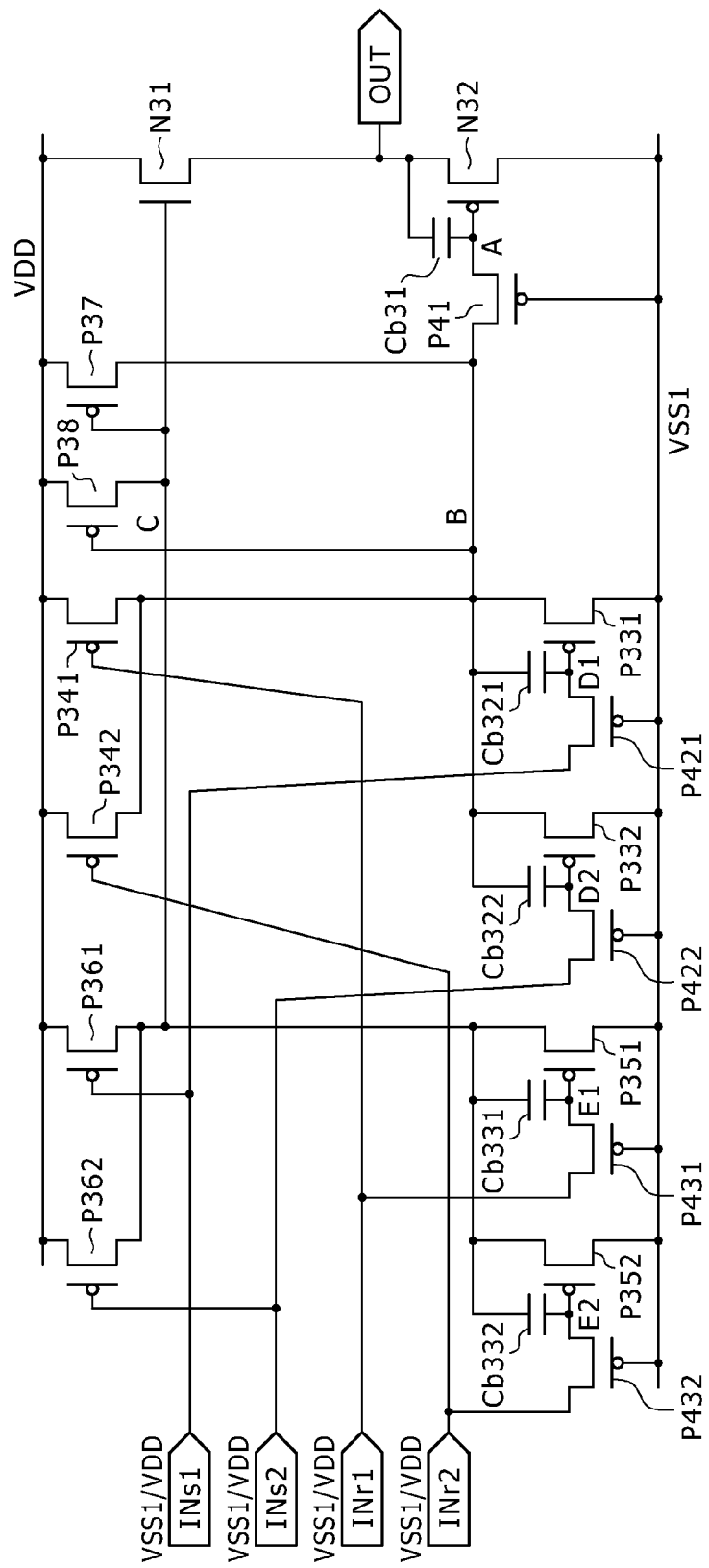
FIG. 62 is a circuit diagram showing a yet further example of a mode of the buffer circuit shown in FIG. 43.

FIG. 62 shows an example of a circuit wherein the first and second inputting stages of the buffer circuit 65 according to the mode example 2 described hereinabove with reference to FIG. 50 are connected in parallel.

In FIG. 62, the thin film transistors P33, P34, P35, P36, P42 and P43 corresponding to a set pulse and a reset pulse of the first set are denoted by P331, P341, P351, P361, P421 and P431, respectively.

Further, in FIG. 62, the thin film transistors P33, P34, P35, P36, P42 and P43 corresponding to a set pulse and a reset pulse of the second set are denoted by P332, P342, P352, P362, P422 and P432, respectively.

If the two sets of a set pulse and a reset pulse are inputted in this manner, then a buffer circuit which can compositely vary the pulse width of the output pulse and the outputting timing of a pulse can be implemented.

It is to be noted that the number of set pulses and reset pulses to be inputted may be determined as occasion demands, and the number of set pulses and the number of reset pulses need not necessarily be equal to each other. A multi-input buffer circuit which has a plurality of control signals (set pulses and reset pulses) can be implemented.

Naturally, the structure of the present mode example can be applied also to the other mode examples proposed in the present application.

Further, although, in the buffer circuit 65 shown in FIG. 62, the thin film transistors P331 and P332, P341 and P342, P351 and P352, and P361 and P362 which form the first and second inputting stages are connected in parallel at the individual outputting terminals, some or all of them may otherwise be connected in series between two operating power supplies, for example, between the first low potential power supply VSS1 and the high potential power supply VDD.

C-9. Example 9 of the Mode

Also here, the buffer circuit 65 according to another additional modification to that of the mode example 2 is described.

a. Circuit Configuration

In the mode examples described hereinabove, the low potential power supply VSS1 is connected to one of the main electrodes of the thin film transistor P31 which composes the outputting stage is described.

However, a pulse signal line which can apply an arbitrary control pulse may be connected in place of the low potential power supply VSS1.

FIG. 63 shows a circuit configuration where a control pulse Vpulse is applied to the thin film transistor P31 which composes the outputting stage of the buffer circuit 65 of the mode example 2. It is to be noted that the circuit configuration according to the present mode example can be applied similarly also to the other mode examples.

b. Driving Operation

Now, a relationship between the potential state of the set pulse and the reset pulse and the potential state of the nodes are described with reference to FIGS. 64A to 64I.

Figure 64:
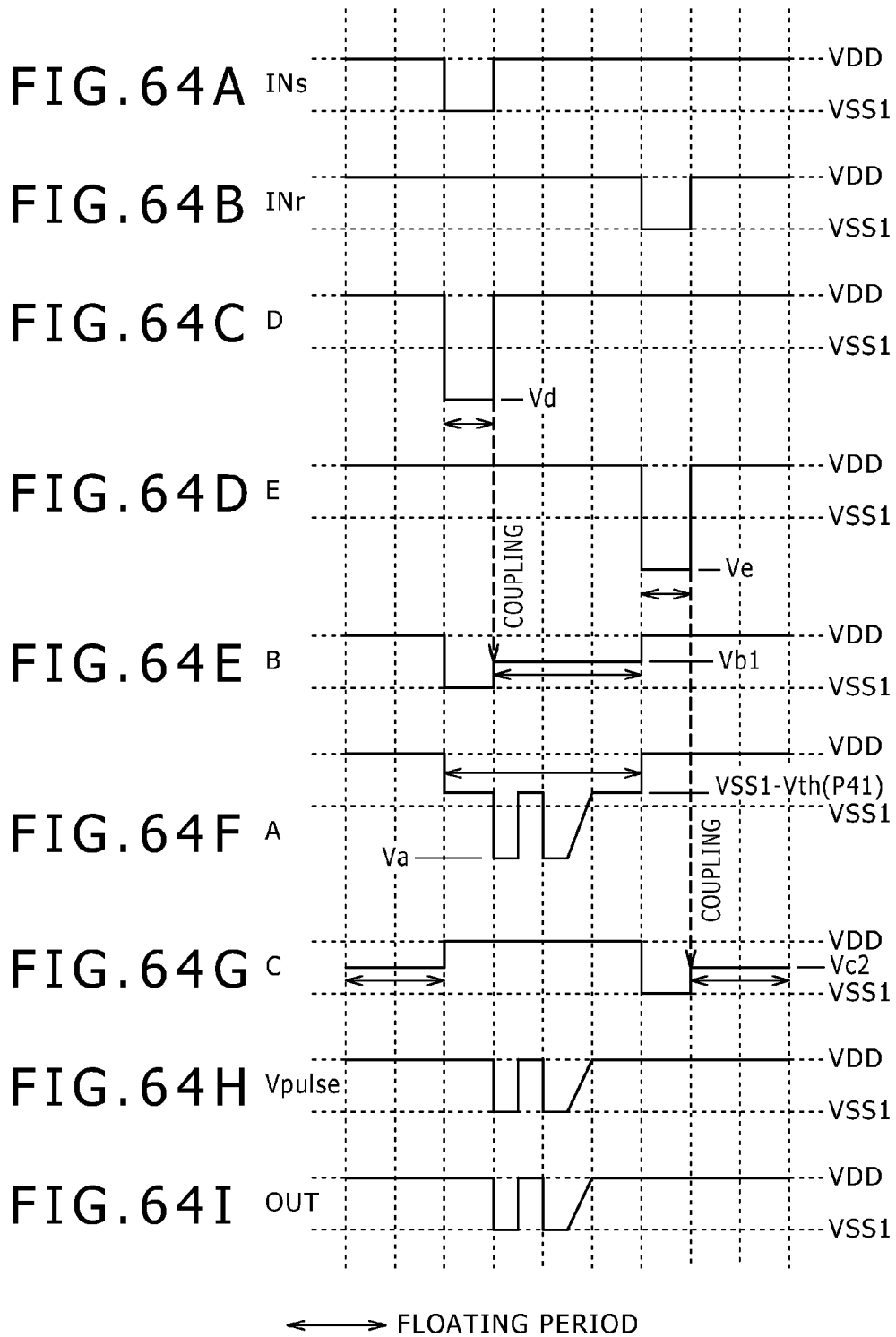
FIGS. 64A to 64I are waveform diagrams illustrating driving waveforms of the buffer circuit shown in FIG. 63.

FIG. 64A illustrates a potential state of the set pulse at the input terminal INs. FIG. 64B illustrates a potential state of the reset pulse at the input terminal INr.

FIG. 64C illustrates a potential state of the gate electrode wiring line of the thin film transistor P33 at the node D.

FIG. 64D illustrates a potential state of the gate electrode wiring line of the thin film transistor P35 at the node E. FIG. 64E illustrates a potential state of the control wiring line at the node B to which the output terminal of the first inputting stage is connected. FIG. 64F illustrates a potential state of the gate control wiring line of the thin film transistor P31 at the node A. FIG. 64G illustrates a potential state of the control wiring line at the node C to which the output terminal of the second inputting stage is connected. FIG. 64H illustrates a state of the potential of the control pulse Vpulse applied to another wiring line. FIG. 64I illustrates a state of the potential appearing at the output terminal OUT of the outputting stage.

First, the timing at which the set pulse falls to the L level is described.

When the set pulse falls to the L level, the node D at the first inputting stage falls to the L level. Consequently, the thin film transistor P33 is placed into an on state and the potential at the node B falls as seen in FIG. 64E.

It is to be noted that, together with the fall of the potential at the node B, the gate potential of the thin film transistor P33, that is, the potential at the node D, drops by an amount corresponding to a charge amount accumulated in the bootstrap complementary capacitor Cb32 as seen from FIG. 64C. The potential after the fall is Vd. When this potential Vd satisfies Vd−VSS1<Vth(P33), upon turning on operation of the thin film transistor P33, the potential at the node B becomes the low potential power supply VSS1 as seen from FIG. 64E.

As the node B falls to the low potential power supply VSS1 as described above, the potential at the node A varies to a potential given by VSS1−Vth(P41) as seen in FIG. 64F.

However, since the potential of the control pulse Vpulse applied to the pulse signal line is the high potential power supply VDD as seen from FIG. 64H, the potential at the output terminal OUT remains the high potential power supply VDD as seen in FIG. 64I.

It is to be noted that, within a period within which the set pulse has the L level, also the thin film transistor P36 is in an on state. Consequently, the gate potential of the thin film transistor P32, that is, the potential at the node C, is controlled to the high potential power supply VDD as seen in FIG. 64G.

Soon, the set pulse rises from the L level to the H level. Upon this variation of the potential, the potential variation of the set pulse jumps into the node B through the capacitive coupling. As seen from FIG. 64E, the potential at the node B rises from the low potential power supply VSS1 to Vb1 while keeping the L level.

At this time, when the potential Vb1 at the node B satisfies Vb1−VDD<Vth(P38), the thin film transistor P38 exhibits an on state and the high potential power supply VDD can be applied to the node C. This signifies that the node C is not influenced by jumping in of the set pulse, that is, the off operating point of the thin film transistor P32 is not displaced.

This potential state is kept while the potential at the node B remains the potential Vb1. In other words, the node C is kept at the high potential power supply VDD until the reset pulse changes over to the L level. As a result, leak current of the thin film transistor P32 can be minimized.

It is to be noted that the potential Vb1 of the node B satisfies VSS1−Vb1>Vth(P41). This is a condition necessary to cause the thin film transistor P41 to operate into an off state to maintain the floating state of the node A.

In the present mode example, two pulses whose L level is the low potential power supply VSS1 are inputted to the pulse signal line after the timing at which the set pulse falls to the low potential power supply VSS1 as seen in FIG. 64H. The first pulse is a rectangular pulse having vertical rising and falling edges. The second pulse has a vertical falling edge but has a moderate rising edge.

When the control pulse Vpulse is inputted while the thin film transistor P31 is in an on state, the potential at the output terminal OUT falls. Together with the fall of the potential at the output terminal OUT, the gate potential of the thin film transistor P31, that is, the potential at the node A, falls by an amount corresponding to a charge amount accumulated in the bootstrap complementary capacitor Cb31 as seen from FIG. 64F. When the potential Va after the fall satisfies Va−VSS1<Vth(P31), upon turning on operation of the thin film transistor P31, the potential at the output terminal OUT becomes the low potential power supply VSS1 as seen from FIG. 64I.

After the reset pulse changes over from the H level to the L level soon as seen in FIG. 64B, now the thin film transistor P35 is placed into an on state and the potential at the node C falls as seen in FIG. 64G. It is to be noted that, together with the fall of the potential at the node C, the gate potential of the thin film transistor P35, that is, the potential at the node E, falls by an amount corresponding to a charge amount accumulated in the bootstrap complementary capacitor Cb33 as seen in FIG. 64D. The potential after the fall is Ve. When the potential Ve satisfies Ve−VSS1<Vth(P35), the potential at the node C upon turning on operation of the thin film transistor P35 becomes the low potential power supply VSS1 as seen in FIG. 64G.

After the potential at the node C falls to the low potential power supply VSS1 as described above, the thin film transistor P32 is placed into an on state and the high potential power supply VDD is supplied to the output terminal OUT as seen in FIG. 64I.

Incidentally, within the period which the reset pulse has the L level, also the thin film transistor P34 is in an on state. Accordingly, the potential at the node B is controlled to the high potential power supply VDD as seen in FIG. 64E. Together with this, also the gate potential of the thin film transistor P31 which composes the outputting stage 51, that is, the potential at the node A, rises to the high potential power supply VDD.

Soon, the reset pulse rises from the L level to the H level. Upon this variation of the potential, the potential variation of the reset pulse jumps into the node C through the capacitive coupling. As seen from FIG. 64G, the potential at the node C rises from the low potential power supply VSS1 to Vc2 while keeping the L level.

At this time, when the potential Vc2 at the node C satisfies Vc2−VDD<Vth(P32), the on state of the thin film transistor P32 continues and the potential at the output terminal OUT is kept at the high potential power supply VDD as seen in FIG. 64I.

Further, since the potential Vc2 at the node C satisfies Vc2−VDD<Vth(P37), the thin film transistor P37 is placed into an on state and the application of the high potential power supply VDD to the node B is continued.

This signifies that the node C is not influenced by jumping in of the set pulse, that is, the off operating point of the thin film transistor P31 is not displaced.

This potential state is kept while the potential at the node C remains the potential Vc2. In other words, the potential at the node B is kept at the high potential power supply VDD until the set pulse changes over to the L level subsequently. As a result, the source current of the thin film transistor P31 can be minimized.

c. Effect

Since the circuit configuration described above is adopted, the bootstrap operation at the node A is carried out in synchronism with a timing at which the control pulse Vpulse illustrated in FIG. 64H which is applied to the pulse signal line falls to the low potential power supply VSS1. Accordingly, an output pulse having a same potential variation as that of the control pulse Vpulse inputted within a period defined by the falling timing of the set pulse and the falling timing of the reset pulse as seen from FIG. 64I appears at the output terminal OUT.

In this manner, thanks to the adoption of the circuit configuration according to the present mode example, it is possible to adjust the waveform of the output pulse. For example, it is possible to divide the output pulse into a plurality of pulses or to adjust the transient (rising or falling) characteristic.

D. Other Examples of the Mode

D-1. Other Display Panels

The foregoing description of the examples of the mode has been given from the assumption that they are applied to a driving circuit for an organic EL panel. Particularly, it has been assumed that they are applied to a control line driving section for transferring a control pulse in a vertical direction.

However, the buffer circuits described hereinabove can be applied also to a signal line driving section which provides an application timing of the signal potential Vsig to the signal line DTL.

Further, the driving circuit which incorporates any of the above-described buffer circuits can be applied also to display panels other than the organic EL panel.

For example, the driving circuit can be applied also to driving circuits, for example, for an inorganic EL panel, an LED panel and like panels. Further, the driving circuit can be applied to driving circuit for a plasma display panel and also to a driving circuit for a field emission display apparatus. Furthermore, the driving circuit can be applied also to a driving circuit for a liquid crystal display panel. Further, where the backlight light source of a liquid crystal display panel is LEDs, any of the buffer circuits described in connection with the mode examples can be used as a driving circuit for the backlight light source. For example, where the ratio of a light emitting period within a one-field period is variably controlled, the buffer circuit can be suitably applied if the light emitting period within a one-field period is divided into a plurality of light emitting periods and the length and the arrangement of each of the light emitting periods is variably controlled.

D-2. Examples of the Product of the Display Panel a. Appearance Configuration

The display panel here includes not only a panel module wherein the pixel array section and the driving circuit are formed on an insulating substrate using a semiconductor process but also an apparatus wherein the driving circuit is fabricated as a separate substrate such as, for example, an IC for a special application and the separate substrate is mounted on an insulating substrate on which the pixel array section is formed.

Figure 65:
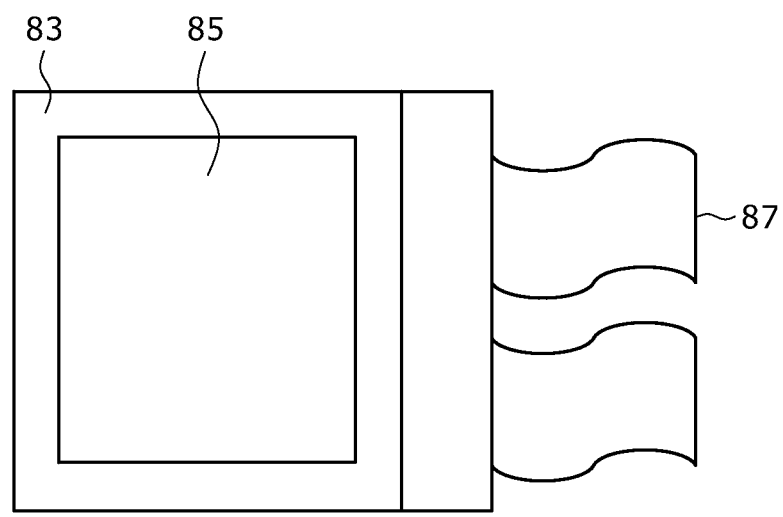
FIG. 65 is a schematic view showing an example of an appearance configuration of a display panel.

FIG. 65 shows an example of an appearance configuration of a display panel. The display panel 81 is structured such that an opposing substrate 85 is adhered to a region of a support substrate 83 in which a pixel array section is formed.

The support substrate 83 is formed from an insulating substrate made of a glass material, a plastic material or the like.

Also the opposing substrate 85 is formed from an insulating substrate made of a glass material, a plastic material or the like.

It is to be noted that the transmittance of the substrates depends upon the type of the display panel. For example, if the display panel is a liquid crystal display panel, then it is necessary for both of the substrates to have a high transmittance. On the other hand, where the display panel is of the self luminous type, it is necessary to assure the transmittance only at one of the substrates which is positioned on the light outgoing side.

Furthermore, a flexible printed circuit (FPC) 87 for inputting an external signal or a driving power supply therethrough is disposed on the display panel 81.

b. Modes of Incorporation in the Electronic Apparatus

Figure 66:
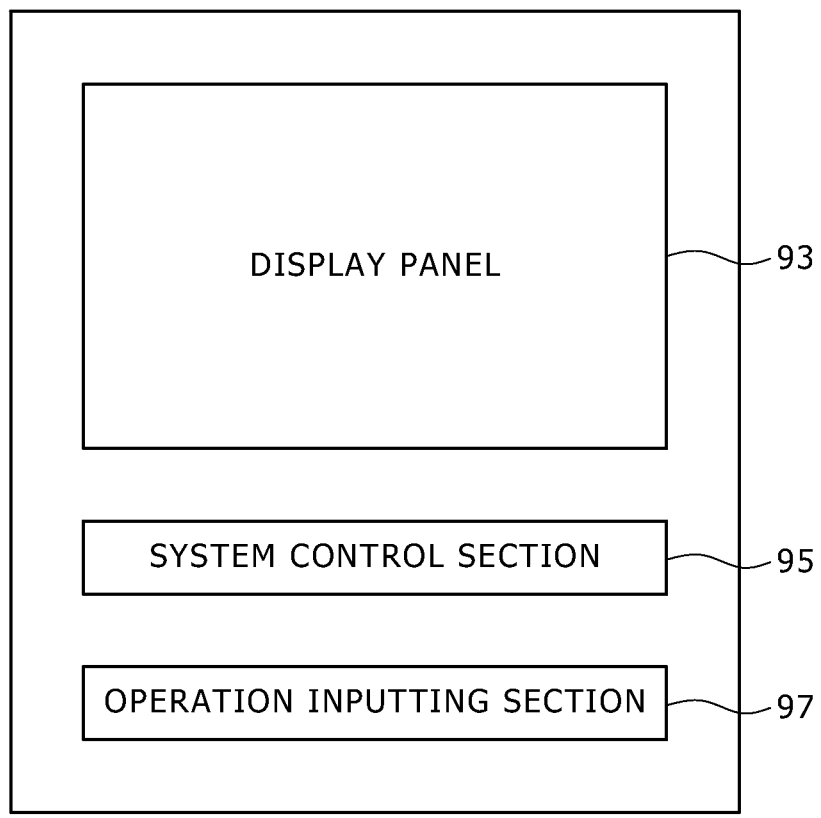
FIG. 66 is a block diagram showing an example of a functional configuration of an electronic apparatus.

The display panel described above is distributed also in a form wherein it is incorporated in various electronic apparatus. FIG. 66 shows an example of a configuration of an electronic apparatus 91. The electronic apparatus 91 includes a display panel 93 in which any of the driving circuits described hereinabove is incorporated, a system control section 95, and an operation inputting section 97. The contents of processing executed by the system control section 95 depend upon the form of the product of the electronic apparatus 91. Meanwhile, the operation inputting section 97 is a device for accepting an operation input to the system control section 95. The operation inputting section 97 may include, for example, switches, buttons, other mechanical interfaces, graphic interfaces and so forth.

Figure 67:
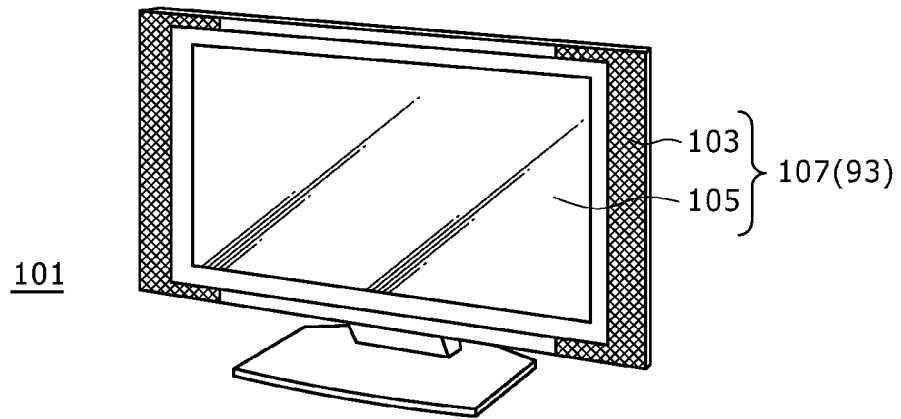
FIGS. 67, 68A and 68B, 69, 70A and 70B and 71 are schematic views showing different examples of the electronic apparatus as a commodity.

FIG. 67 shows an example of an appearance where the electronic apparatus is a television receiver. A display screen 107 composed of a front panel 103, a filter glass plate 105 and so forth is disposed on the front face of a housing of the television receiver 101. The display screen 107 corresponds to the display panel 93 of FIG. 66.

Figure 68A:
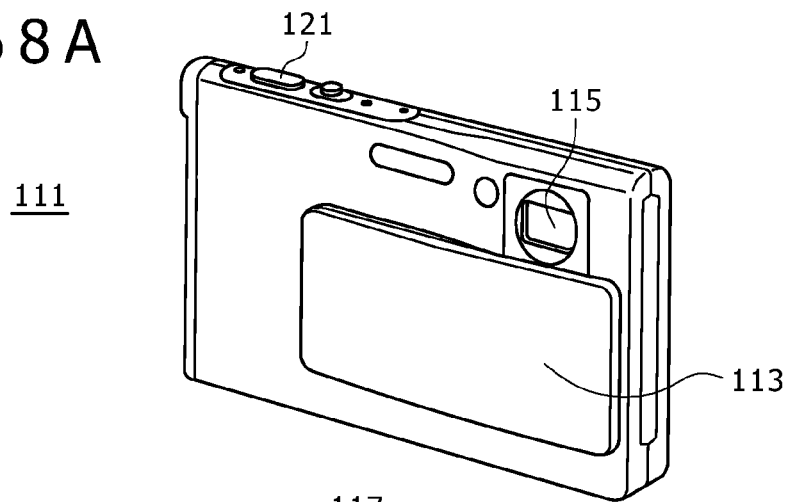
Figure 68B:
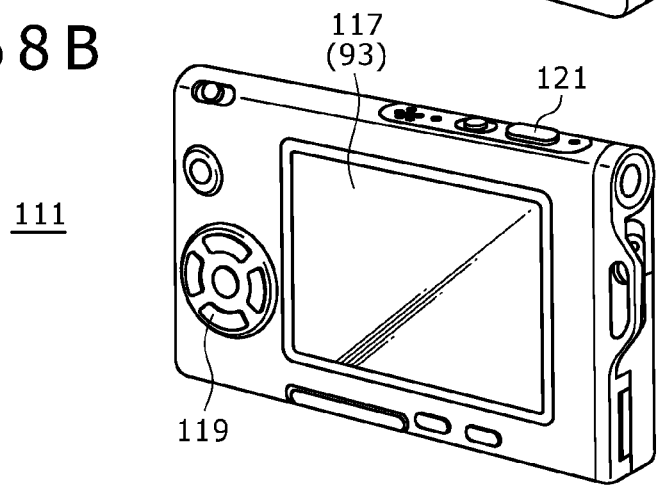

The electronic apparatus described above may be, for example, a digital camera. FIGS. 68A and 68B show an example of an apparatus of the digital camera 111. In particular, FIG. 68A shows an example of the appearance of the digital camera 111 on the front face side, that is, the image pickup object side, and FIG. 68B shows an example of the appearance on the rear face side, that is, the image pickup person side.

Referring to FIGS. 68A and 68B, the digital camera 111 includes a protective cover 113, an image pickup lens section 115, a display screen 117, a control switch 119 and a shutter button 121. The display screen 117 corresponds to the display panel 93 of FIG. 66.

Figure 69:
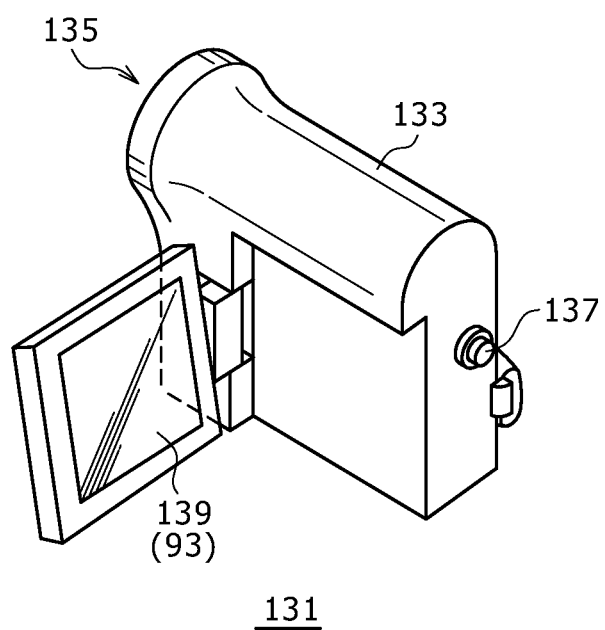

The electronic apparatus described above may be, for example, a video camera. FIG. 69 shows an example of the appearance of the video camera 131.

Referring to FIG. 69, the video camera 131 includes an image pickup lens 135 for picking up an image of an image pickup object, an image pickup start/stop switch 137 and a display screen 139, provided on the front side of a body 133. The display screen 139 corresponds to the display panel 93 of FIG. 66.

Figure 70A:
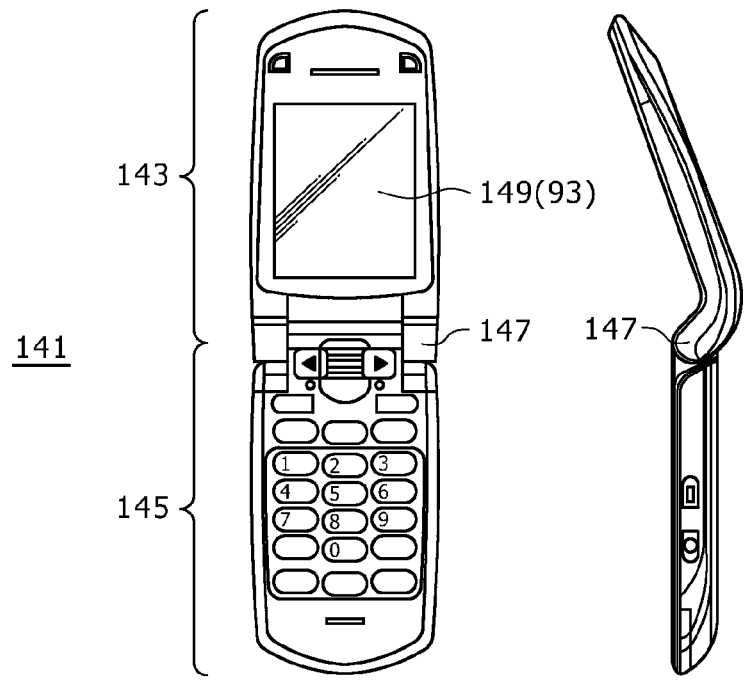
Figure 70B:
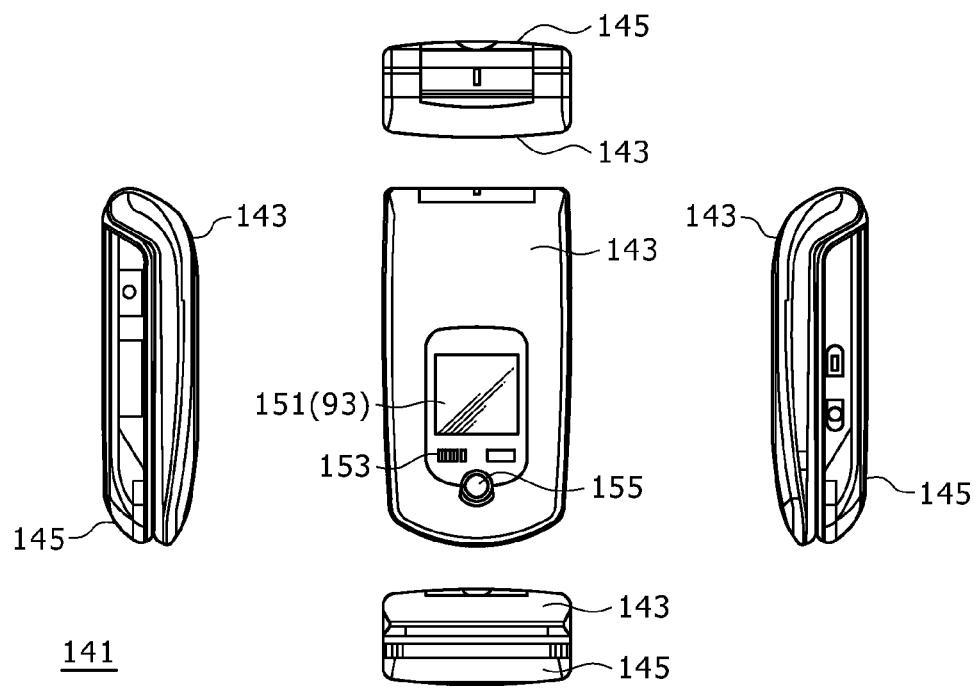

The electronic apparatus described above may be, for example, a portable terminal device. FIGS. 70A and 70B show an example of the appearance of a portable telephone set 141 as the portable terminal device. Referring to FIGS. 70A and 70B, the portable telephone set 141 shown is of the foldable type, and FIG. 70A shows an example of the appearance of the portable telephone set 141 in a state wherein the housing is unfolded while FIG. 70B shows an example of the appearance in another state wherein the housing is folded.

The portable telephone set 141 includes an upper side housing 143, a lower side housing 145, a connection section 147 in the form of a hinge section, a display screen 149, an auxiliary display screen 151, a picture light 153 and an image pickup lens 155. The display screen 149 and the auxiliary display screen 151 correspond to the display panel 93 of FIG. 66.

Figure 71:
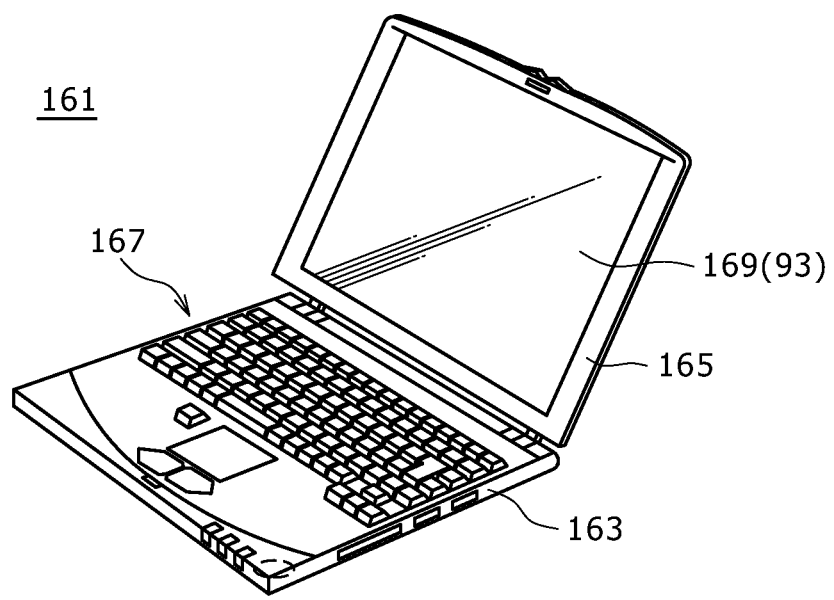

Further, the electronic apparatus described above may be, for example, a computer. FIG. 71 shows an example of the appearance of a notebook type computer 161.

Referring to FIG. 71, the notebook type computer 161 shown includes a lower side housing 163, an upper side housing 165, a keyboard 167, and a display screen 169. The display screen 169 corresponds to the display panel 93 of FIG. 66.

Further, the electronic apparatus may be an audio reproduction apparatus, a game machine, an electronic book, an electronic dictionary or the like.

D-3. Applications to any Other than the Driving Circuit of the Display Panel

In the foregoing description, the buffer circuit is applied to a driving circuit for transferring a control pulse in a vertical direction of a display panel.

However, the buffer circuit of the mode examples of the present invention can be applied also where a control pulse is transferred in a horizontal direction. Further, the buffer circuit can be applied to all buffer circuits which are used on display panels.

Further, the buffer circuit is a basic circuit having high flexibility and can be applied to all semiconductor devices which incorporate a buffer circuit.

D-4. Others

The mode examples described above may be modified in various manners without departing from the subject matter of the present invention. Also various modifications and applications may be possible which are created or combined based on the disclosure herein.

The present application contains subject matter related to that disclosed in Japanese priority Patent Application JP 2008-120792 filed in the Japan Patent Office on May 3, 2008, the entire content of which is hereby incorporated by reference.

While a preferred embodiment of the present invention has been described using specific terms, such description is for illustrative purpose only, and it is to be understood that changes and variations may be made without departing from the spirit or scope of the following claims.

What is claimed is:

1. A display panel comprising:
a pixel array section including a plurality of pixels; and
a control section configured to drive the pixel array section,
wherein at least one of the plurality of pixels including a first switching transistor, a second switching transistor, a driving transistor, and a light emitting element,
wherein the control section including a plurality of buffer circuits, at least one of the plurality of buffer circuits comprising:
a first input stage configured to receive a set pulse;
a second input stage configured to receive a reset pulse; and
an output stage configured to selectively output a first level signal and a second level signal to a second scan line,
wherein a source terminal of the second switching transistor is connected to a power supply line, a drain terminal of the second switching transistor is connected to a source terminal of the driving transistor, and a drain terminal of the driving transistor is connected to the light emitting element,
wherein a gate terminal of the first switching transistor is electrically connected to the first scan line,
wherein a gate terminal of the second switching transistor is electrically connected to the second scan line,
wherein the second switching transistor is configured to be adjusted a number of times of turning on of within a one-field period, and
wherein the output stage is configured to:
output the first level signal when the set pulse is applied to the first input stage,
continuously output the first level signal until the reset pulse is applied to the second input stage, and
output the second level signal after the reset pulse is applied to the second input stage.

2. The display panel according to claim 1, wherein the output stage further comprises a first transistor and a second transistor serially connected between a first potential line and a second potential line, and
wherein the first transistor and the second transistor are N-channel transistor.

3. The display panel according to claim 1, wherein the output stage further comprises a first transistor and a second transistor serially connected between a first potential line and a second potential line, and
wherein the first transistor and the second transistor are P-channel transistor.

4. The display panel according to claim 1, wherein the output stage further comprises a first transistor and a second transistor serially connected between a first potential line and a second potential line, and a first control wiring and a second control wiring are respectively connected to respective control terminals of the first transistor and the second transistor.

5. The display panel according to claim 4, wherein the buffer circuit further comprises: a third transistor connected between the second potential line and the first control wiring; and a fourth transistor connected between the second potential line and the second control wiring, wherein respective control terminals of the third transistor and the fourth transistor are respectively connected to the second control wiring and the first control wiring.

6. A display panel comprising:
a pixel array section including a plurality of pixels; and
a control section configured to drive the pixel array section,
wherein at least one of the plurality of pixels including a first switching transistor, a second switching transistor, a driving transistor, and a light emitting element,
wherein the control section including a plurality of buffer circuits, at least one of the plurality of buffer circuits comprising:
a first input stage configured to receive a set pulse;
a second input stage configured to receive a reset pulse; and
an output stage configured to selectively output a first level signal and a second level signal to a second scan line,
wherein a source terminal of the second switching transistor is connected to a power supply line, a drain terminal of the second switching transistor is connected to a source terminal of the driving transistor, a source or drain terminal of the first transistor is connected to a gate terminal of the driving transistor, and a drain terminal of the driving transistor is connected to the light emitting element,
wherein a gate terminal of the first switching transistor is electrically connected to the first scan line,
wherein a gate terminal of the second switching transistor is electrically connected to the second scan line,
wherein the second switching transistor is configured to be turned on multiple times for once tuning on of the first switching transistor, and
wherein the output stage is configured to:
output the first level signal when the set pulse is applied to the first input stage,
continuously output the first level signal until the reset pulse is applied to the second input stage, and
output the second level signal after the reset pulse is applied to the second input stage.

7. The display panel according to claim 6, wherein the output stage further comprises a first transistor and a second transistor serially connected between a first potential line and a second potential line, and
wherein the first transistor and the second transistor are N-channel transistor.

8. The display panel according to claim 6, wherein the output stage further comprises a first transistor and a second transistor serially connected between a first potential line and a second potential line, and
wherein the first transistor and the second transistor are P-channel transistor.

9. The display panel according to claim 6, wherein the output stage further comprises a first transistor and a second transistor serially connected between a first potential line and a second potential line, and a first control wiring and a second control wiring are respectively connected to respective control terminals of the first transistor and the second transistor.

10. The display panel according to claim 9, wherein the buffer circuit further comprises: a third transistor connected between the second potential line and the first control wiring; and a fourth transistor connected between the second potential line and the second control wiring, wherein respective control terminals of the third transistor and the fourth transistor are respectively connected to the second control wiring and the first control wiring.

11. A display panel comprising:
a pixel array section including a plurality of pixels; and
a control section configured to drive the pixel array section, wherein at least one of the plurality of pixels including a first switching transistor, a second switching transistor, a driving transistor, and a light emitting element,
wherein the control section including a plurality of control circuits, at least one of the plurality of control circuits comprising:
a first circuit configured to receive a set pulse;
a second circuit configured to receive a reset pulse; and
an output circuit configured to selectively output a first level signal and a second level signal to a second scan line,
wherein a source terminal of the second switching transistor is connected to a power supply line, a drain terminal of the second switching transistor is connected to a source terminal of the driving transistor, and a drain terminal of the driving transistor is connected to the light emitting element,
wherein a gate terminal of the first switching transistor is electrically connected to the first scan line,
wherein a gate terminal of the second switching transistor is electrically connected to the second scan line,
wherein the second switching transistor is configured to be adjusted a number of times of turning on of within a one-field period, and
wherein the output circuit is configured to:
output the first level signal through when the set pulse is applied to the first input circuit,
continuously output the first level signal until the reset pulse is applied to the second input circuit, and
output the second level signal after the reset pulse is applied to the second input circuit.

12. The display panel according to claim 11, wherein the output circuit further comprises a first transistor and a second transistor serially connected between a first potential line and a second potential line,
wherein the first transistor and the second transistor are P-channel transistor, and
wherein the first switching transistor, the second switching transistor, the driving transistor are P-channel transistor.

13. The display panel according to claim 12, wherein a first control wiring and a second control wiring are respectively connected to respective control terminals of the first transistor and the second transistor.

14. The display panel according to claim 13, wherein the control circuit further comprises: a third transistor connected between the second potential line and the first control wiring; and a fourth transistor connected between the second potential line and the second control wiring.

15. The display panel according to claim 14, wherein respective control terminals of the third transistor and the fourth transistor are respectively connected to the second control wiring and the first control wiring.

16. A display panel comprising:
a pixel array section including a plurality of pixels; and
a control section configured to drive the pixel array section,
wherein at least one of the plurality of pixels including a first switching transistor, a second switching transistor, a driving transistor, and a light emitting element,
wherein the control section including a plurality of control circuits, at least one of the plurality of control circuits comprising:
a first circuit configured to receive a set pulse;
a second circuit configured to receive a reset pulse; and
an output circuit configured to selectively output a first level signal and a second level signal to a second scan line,
wherein a source terminal of the second switching transistor is connected to a power supply line, a drain terminal of the second switching transistor is connected to a source terminal of the driving transistor, and a drain terminal of the driving transistor is connected to the light emitting element,
wherein a gate terminal of the first switching transistor is electrically connected to the first scan line,
wherein a gate terminal of the second switching transistor is electrically connected to the second scan line,
wherein the second switching transistor is configured to be turned on multiple times for once tuning on of the first switching transistor, and
wherein the output circuit is configured to:
output the first level signal through when the set pulse is applied to the first input circuit,
continuously output the first level signal until the reset pulse is applied to the second input circuit, and
output the second level signal after the reset pulse is applied to the second input circuit.

17. The display panel according to claim 16, wherein the output circuit further comprises a first transistor and a second transistor serially connected between a first potential line and a second potential line,
wherein the first transistor and the second transistor are P-channel transistor, and
wherein the first switching transistor, the second switching transistor, the driving transistor are P-channel transistor.

18. The display panel according to claim 17, wherein a first control wiring and a second control wiring are respectively connected to respective control terminals of the first transistor and the second transistor.

19. The display panel according to claim 18, wherein the control circuit further comprises: a third transistor connected between the second potential line and the first control wiring; and a fourth transistor connected between the second potential line and the second control wiring.

20. The display panel according to claim 19, wherein respective control terminals of the third transistor and the fourth transistor are respectively connected to the second control wiring and the first control wiring.

* * * * *